(12) United States Patent
Kimura et al.

(10) Patent No.: US 10,554,460 B2
(45) Date of Patent: Feb. 4, 2020

(54) DEVICE, METHOD, AND PROGRAM

(71) Applicant: SONY CORPORATION, Tokyo (JP)

(72) Inventors: Ryota Kimura, Tokyo (JP); Hiroki Matsuda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/745,759

(22) PCT Filed: Jul. 1, 2016

(86) PCT No.: PCT/JP2016/069672
§ 371 (c)(1),
(2) Date: Jan. 18, 2018

(87) PCT Pub. No.: WO2017/051583
PCT Pub. Date: Mar. 30, 2017

(65) Prior Publication Data
US 2018/0219708 A1    Aug. 2, 2018

(30) Foreign Application Priority Data

Sep. 24, 2015 (JP) ................................. 2015-186500
Oct. 21, 2015 (JP) ................................. 2015-207034

(51) Int. Cl.
*H04L 27/26* (2006.01)
*H04J 99/00* (2009.01)
(Continued)

(52) U.S. Cl.
CPC ......... *H04L 27/2602* (2013.01); *H04J 15/00* (2013.01); *H04L 5/0026* (2013.01);
(Continued)

(58) Field of Classification Search
CPC ... H03M 13/25; H04B 7/0413; H04B 7/0697; H04J 15/00; H04L 27/2602;
(Continued)

(56) References Cited

U.S. PATENT DOCUMENTS

| 7,274,653 B1 * | 9/2007 | Settle | H04L 25/062 |
| | | | 370/206 |
| 2005/0185575 A1 * | 8/2005 | Hansen | H04B 7/0413 |
| | | | 370/208 |

(Continued)

FOREIGN PATENT DOCUMENTS

| CN | 101120567 B | 9/2011 |
| JP | 2003-78419 A | 3/2003 |

(Continued)

OTHER PUBLICATIONS

International Search Report dated Sep. 20, 2016, in PCT/JP2016/069672, filed Jul. 1, 2016.
(Continued)

*Primary Examiner* — Rina C Pancholi
(74) *Attorney, Agent, or Firm* — Xsensus LLP

(57) ABSTRACT

To provide a device, a method; and a program which are capable of further improving decoding accuracy in a case in which multiplexing/multiple-access using non-orthogonal resources is performed.
A device includes: a processing unit configured to apply a second constellation corresponding to a symbol position of a first bit string in a first constellation applied to the first bit string, to a second bit string in regard to a plurality of bit strings to be multiplexed for each of transmission signal sequences to be multiplexed in resource blocks for which at least a part of frequency resources or time resources overlap.

20 Claims, 25 Drawing Sheets

(51) Int. Cl.
*H04L 5/00* (2006.01)
*H04L 27/34* (2006.01)
*H04B 7/0413* (2017.01)
*H04B 7/06* (2006.01)

(52) U.S. Cl.
CPC ........ *H04L 27/3444* (2013.01); *H04B 7/0413* (2013.01); *H04B 7/0697* (2013.01); *H04L 27/265* (2013.01); *H04L 27/2628* (2013.01)

(58) Field of Classification Search
CPC .............. H04L 27/2628; H04L 27/265; H04L 27/3444; H04L 27/36; H04L 5/0026
See application file for complete search history.

(56) References Cited

U.S. PATENT DOCUMENTS

| | | | |
|---|---|---|---|
| 2007/0195907 A1* | 8/2007 | Wang | H04L 1/0006 375/267 |
| 2012/0300692 A1* | 11/2012 | Sfar | H04B 7/15521 370/315 |
| 2013/0196700 A1* | 8/2013 | Tiirola | H04J 11/004 455/501 |
| 2015/0010104 A1 | 1/2015 | Park et al. | |
| 2016/0365905 A1* | 12/2016 | Hu | H04B 7/0456 |

FOREIGN PATENT DOCUMENTS

| | | |
|---|---|---|
| JP | 2003-515976 A | 5/2003 |
| JP | 2003-229835 A | 8/2003 |
| JP | 2008-527931 A | 7/2008 |
| JP | 2013-514676 A | 4/2013 |
| JP | 2013-247513 A | 12/2013 |

OTHER PUBLICATIONS

Chinese Office Action dated May 8, 2019 in Chinese Application No. 201680053839.9.

Extended European Search Report dated Apr. 23, 2019 in European Application No. 16848373.3.

Huawei et al: "TP for classification of MUST schemes", 3GPP, RI-154357, vol. RAN WGI, Meeting #82, Aug. 23, 2015 (Aug. 23, 2015), XP051001672.

LG Electronics: "Discussion on multiuser superposition schemes and signaling schemes", 3GPP, RI-154282, vol. RAN WGI, Meeting #82, Aug. 23, 2015 (Aug. 23, 2015), XP051001613.

LG Electronics: "Discussion on Multiuser Superposition Schemes and Initial Link Level Results", 3GPP, RI-152762, vol. RAN WGI, Meeting #81, May 24, 2015 (May 24, 2015), XP050972702.

* cited by examiner

DEVICE, METHOD, AND PROGRAM

TECHNICAL FIELD

The present disclosure relates to a device, a method, and a program.

BACKGROUND ART

Non-orthogonal multiple access (NOMA) has been attracting attention as a radio access technology (RAT) for a fifth generation (5G) mobile communication system following Long Term Evolution (LTE)/LTE-Advanced (LTE-A). In orthogonal frequency-division multiple access (OFDMA) and single-carrier frequency-division multiple access (SC-FDMA), which are adopted in LTE, radio resources (e.g., resource blocks) are allocated to users without overlap. These schemes are called orthogonal multiple access. In contrast, in non-orthogonal multiple access, radio resources are allocated to users with overlap. In non-orthogonal multiple access, signals of users interfere with each other, but a signal for each user is taken out by a high-accuracy decoding process at the reception side. Non-orthogonal multiple access, in theory, achieves higher cell communication capability than orthogonal multiple access.

One of radio access technologies classified into non-orthogonal multiple access is superposition coding (SPC) multiplexing/multiple access. SPC is a scheme in which signals to which different levels of power are allocated are multiplexed on at least partly overlapping radio resources in frequency and time. At the reception side, interference cancellation, iterative detection, and/or the like is performed for reception/decoding of signals multiplexed on the same radio resource.

For example, Patent Literature 1 and Patent Literature 2 disclose, as SPC or a technology equivalent to SPC, techniques for setting an amplitude (or power) that allows appropriate demodulation/decoding. Moreover, for example, Patent Literature 3 discloses a technique for enhancing successive interference cancellation (SIC) for reception of multiplexed signals.

CITATION LIST

Patent Literature

Patent Literature 1: JP 2003-78419A
Patent Literature 2: JP 2003-229835A
Patent Literature 3: JP 2013-247513A

DISCLOSURE OF INVENTION

Technical Problem

In signal processing technology using non-orthogonal resources such as SPC, improvements in decoding accuracy of a plurality of multiplexed signals on a reception device side are required. In this regard, the present disclosure proposes a device, a method, and a program which are novel and improved and capable of further improving decoding accuracy in a case in which multiplexing/multiple-access using non-orthogonal resources is performed.

Solution to Problem

According to the present disclosure, there is provided a device including: a processing unit configured to apply a second constellation corresponding to a symbol position of a first bit string in a first constellation applied to the first bit string, to a second bit string in regard to a plurality of bit strings to be multiplexed for each of transmission signal sequences to be multiplexed in resource blocks for which at least a part of frequency resources or time resources overlap.

In addition, according to the present disclosure, there is provided a method including: applying, by a processor, a second constellation corresponding to a symbol position of a first bit string in a first constellation applied to the first bit string, to a second bit string in regard to a plurality of bit strings to be multiplexed for each of transmission signal sequences to be multiplexed in resource blocks for which at least a part of frequency resources or time resources overlap.

In addition, according to the present disclosure, there is provided a program causing a computer to function as: a processing unit configured to apply a second constellation corresponding to a symbol position of a first bit string in a first constellation applied to the first bit string, to a second bit string in regard to a plurality of bit strings to be multiplexed for each of transmission signal sequences to be multiplexed in resource blocks for which at least a part of frequency resources or time resources overlap.

Advantageous Effects of Invention

As described above, according to the present disclosure, it is possible to further improve decoding accuracy in a case in which multiplexing/multiple-access using non-orthogonal resources is performed. Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
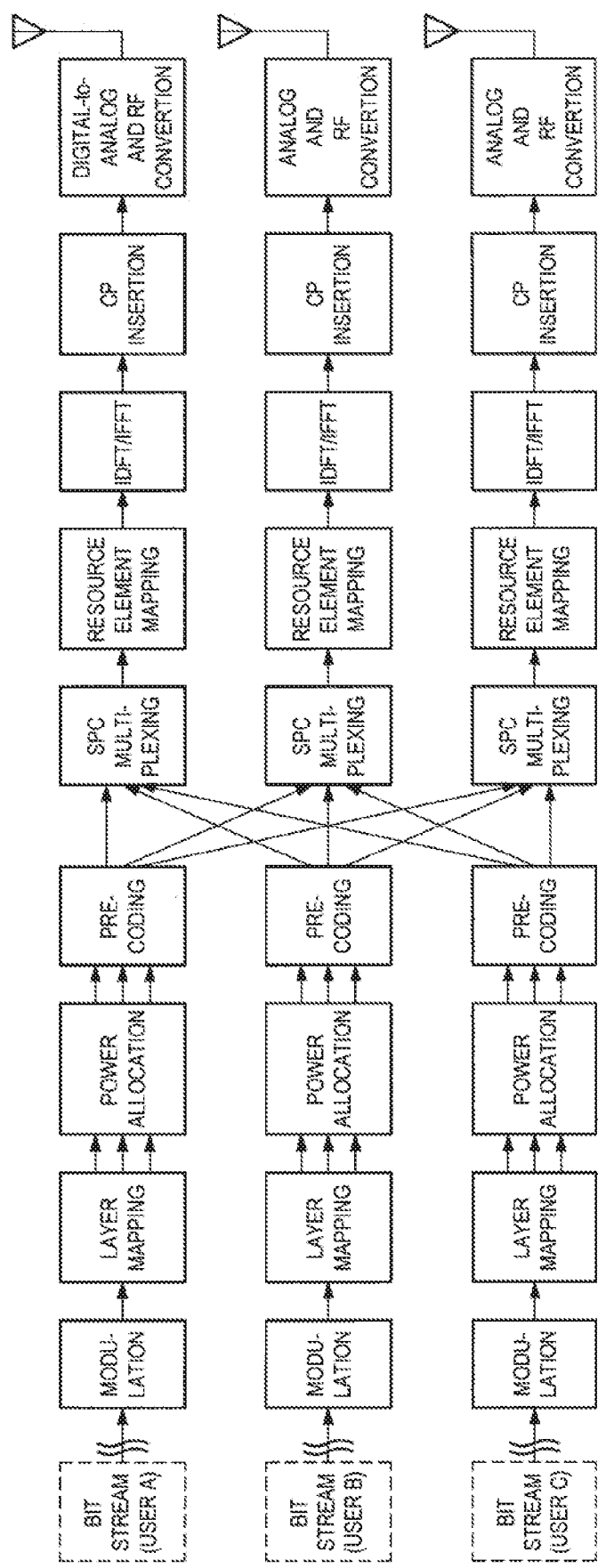
FIG. 1 is an explanatory diagram for explaining an example of a process in a transmission device that supports SPC.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Further, the description will proceed in the following order.
1. Introduction
1.1. SPC
1.2. Constellation
1.3. Technical problem
2. Configuration example
2.1. Schematic configuration example of system
2.2. Configuration example of base station
3. First Embodiment
3.1. Technical features
3.2. Flow of process
4. Second Embodiment
4.1. Technical features
4.2. Flow of process
5. Third Embodiment
5.1. Technical problem
5.2. Technical features
5.3. Flow of process
6. Application example
7. Conclusion

1. INTRODUCTION

1.1. SPC

In SPC, a plurality of signals are multiplexed by setting a difference in power level on non-orthogonal resources (for example, resource blocks in which at least some frequency resources or time resources overlap). Generally, it is preferable to set allocation of a power level on the basis of a relative relation of a path loss between a transmission device and a reception device while considering an upper limit of total transmission power of the transmission device. Further, a path gain or expected reception quality (that is, SINR) may be used instead of the path loss.

In a case in which the allocation of the power level is set on the basis of the relative relation of the path loss, the transmission device allocates high power to a signal destined for a device with a large path loss and allocates low power to a signal destined for a device with a low path loss. Further, the path loss increases as a distance between the transmission device and the reception device increases and is small in a case in which the reception device is included within a main lobe of antenna directivity and large in a case in which the reception device is outside the main lobe of the antenna directivity. The signal to which the high power is allocated causes interference to the reception device of the destination of the signal to which lower power is allocated. Therefore, in the reception device, it is necessary to cancel an interference signal using a technique such as SIC.

Figure 2:
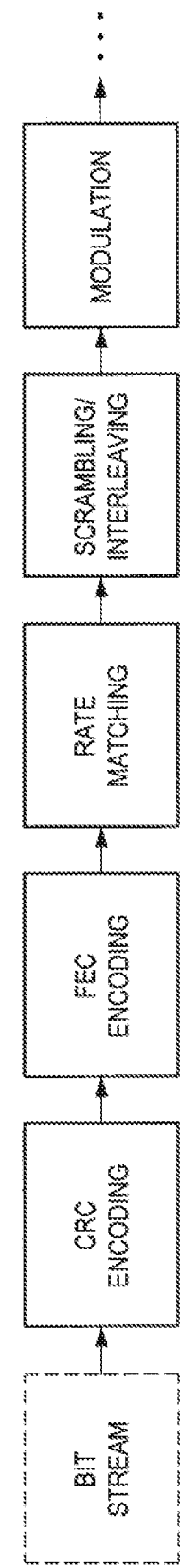
FIG. 2 is an explanatory diagram for explaining an example of a process in a transmission device that supports SPC.
Figure 3:
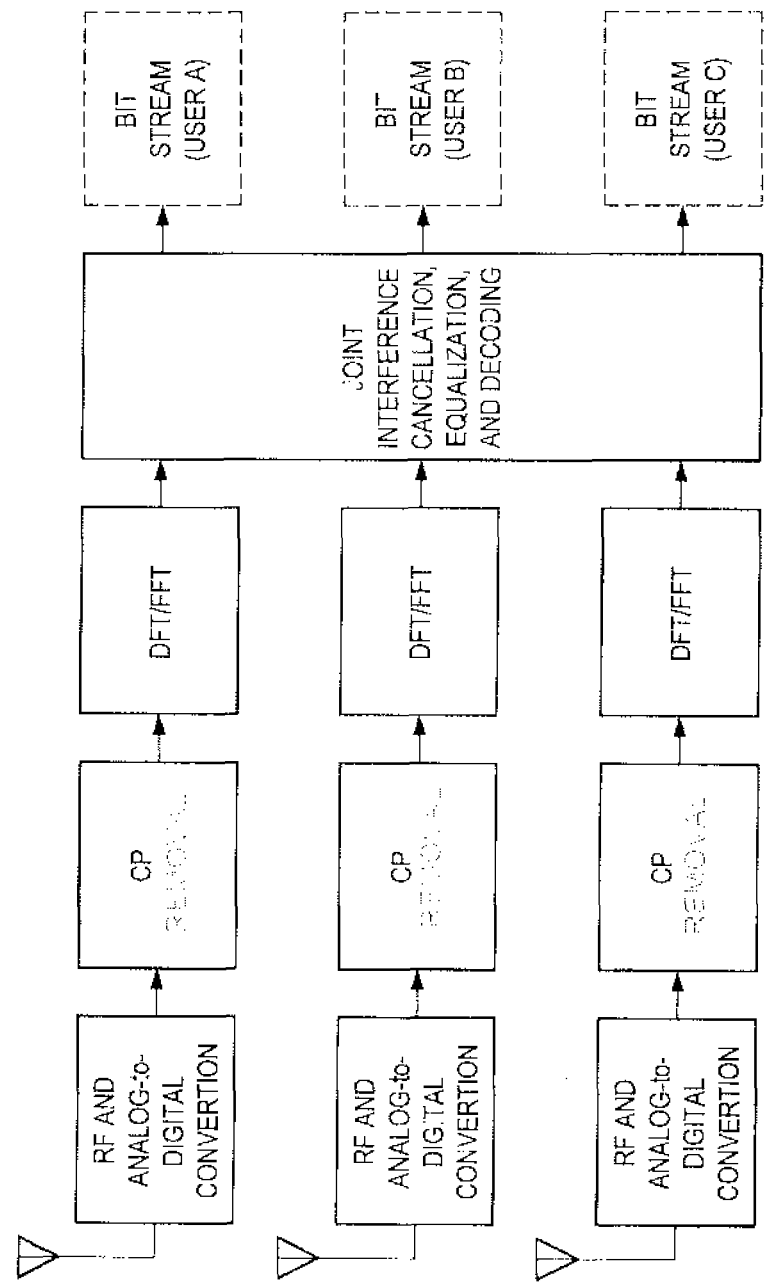
FIG. 3 is an explanatory diagram for explaining an example of a process in a reception device that performs interference cancellation.

Hereinafter, a process and a signal in SPC will be described with reference to FIG. 1 to FIG. 3.
(1) Process in Each Device
(a) Process in Transmission Device FIGS. 1 and 2 are explanatory diagrams for explaining an example of a process in a transmission device that supports SPC. According to FIG. 1, for example, respective bit streams (e.g., transport blocks) of a user A, a user B, and a user C are processed. For each of these bit streams, some processes (e.g., cyclic redundancy check (CRC) encoding, forward error correction (FEC) encoding, rate matching, and scrambling/interleaving, as illustrated in FIG. 2, for example) are performed and then modulation is performed. Further, layer mapping, power allocation, precoding, SPC multiplexing, resource element mapping, inverse discrete Fourier transform (IDFT)/inverse fast Fourier transform (IFFT), cyclic prefix (CP) insertion, digital-to-analog and radio frequency (RF) conversion, and the like are performed.

In particular, in power allocation, power is allocated to respective signals of the user A, the user B, and the user C, and in SPC multiplexing, the signals of the user A, the user B, and the user C are multiplexed.
(b) Process in Reception Device FIG. 3 is an explanatory diagram for explaining an example of a process in a reception device that performs interference cancellation. According to FIG. 3, for example, RF and analog-to-digital conversion, CP removal, discrete Fourier transform (DFT)/fast Fourier transform (FFT), joint interference cancellation, equalization, decoding, and the like are performed. As a result, this provides respective bit streams (e.g., transport blocks) of the user A, the user B, and the user C.

(2) Transmission Signals and Reception Signals (a) Downlink

Next, downlink transmission signals and reception signals when SPC is adopted will be described. Assumed here is a multi-cell system of heterogeneous network (HetNet), small cell enhancement (SCE), or the like.

An index of a cell to be in connection with a target user u is denoted by i, and the number of transmission antennas of a base station corresponding to the cell is denoted by $N_{TX,i}$. Each of the transmission antennas may also be called a transmission antenna port. A transmission signal from the cell i to the user u can be expressed in a vector form as below.

$$s_{i,u} = \begin{bmatrix} s_{i,u,0} \\ \vdots \\ s_{i,u,N_{TX,i}-1} \end{bmatrix} = W_{i,u} P_{i,u} x_{i,u} \quad [\text{Math. 1}]$$

$$W_{i,u} = \begin{bmatrix} w_{i,u,0,0} & \cdots & w_{i,u,0,N_{SS,u}-1} \\ \vdots & \ddots & \vdots \\ w_{i,u,N_{TX,i}-1,0} & \cdots & w_{i,u,N_{TX,i}-1,N_{SS,u}-1} \end{bmatrix} \quad [\text{Math. 2}]$$

$$P_{i,u} = \begin{bmatrix} P_{i,u,0,0} & \cdots & P_{i,u,0,N_{SS,u}-1} \\ \vdots & \ddots & \vdots \\ P_{i,u,N_{SS,u}-1,0} & \cdots & P_{i,u,N_{SS,u}-1,N_{SS,u}-1} \end{bmatrix} \quad [\text{Math. 3}]$$

$$x_{i,u} = \begin{bmatrix} x_{i,u,0} \\ \vdots \\ x_{i,u,N_{SS,u}-1} \end{bmatrix} \quad [\text{Math. 4}]$$

In the above expressions, $N_{SS,u}$ denotes the number of spatial transmission streams for the user u. Basically, $N_{SS,u}$ is a positive integer equal to or less than $N_{TX,i}$. A vector $x_{i,u}$ is a spatial stream signal to the user u. The respective elements of this vector basically correspond to digital modulation symbols of phase shift keying (PSK), quadrature amplitude modulation (QAM), or the like. A matrix $W_{i,u}$ is a precoding matrix for the user u. Elements in this matrix are basically complex numbers, but may be real numbers.

A matrix $P_{i,u}$ is a power allocation coefficient matrix for the user u in the cell i. In this matrix, each element is preferably a positive real number. Note that this matrix may be a diagonal matrix (i.e., a matrix whose components excluding diagonal components are zero) as below.

$$P_{i,u} = \begin{bmatrix} P_{i,u,0,0} & 0 & \cdots & 0 \\ 0 & P_{i,u,1,1} & \ddots & \vdots \\ \vdots & \ddots & \ddots & 0 \\ 0 & \cdots & \cdots & P_{i,u,N_{SS,u}-1,N_{SS,u}-1} \end{bmatrix} \quad [\text{Math. 5}]$$

If adaptive power allocation for a spatial stream is not performed, a scalar value $P_{i,u}$ may be used instead of the matrix $P_{i,u}$.

As well as the user u, another user v is present in the cell i, and a signal $s_{i,v}$ of the other user v is also transmitted on the same radio resource. These signals are multiplexed using SPC. A signal $s_i$ from the cell i after multiplexing is expressed as below.

$$s_i = \sum_{u' \in U_i} s_{i,u'} \quad [\text{Math. 6}]$$

In the above expression, $U_i$ denotes a set of users for which multiplexing is performed in the cell i. Also in a cell j (a cell that serves as an interference source for the user u) other than a serving cell of the user u, a transmission signal $s_j$ is generated similarly. Such a signal is received as interference at the user side. A reception signal $r_u$ of the user u can be expressed as below.

$$r_u = \begin{bmatrix} r_{u,0} \\ \vdots \\ r_{u,N_{RX,u}-1} \end{bmatrix} = \sum_{i'} H_{u,i'} s_{i'} + n_u \quad [\text{Math. 7}]$$

$$H_{u,i} = \begin{bmatrix} h_{u,i,0,0} & \cdots & h_{u,i,0,N_{TX,i}-1} \\ \vdots & \ddots & \vdots \\ h_{u,i,N_{RX,u}-1,0} & \cdots & h_{u,i,N_{RX,u}-1,N_{TX,i}-1} \end{bmatrix} \quad [\text{Math. 8}]$$

$$n_u = \begin{bmatrix} n_{u,0} \\ \vdots \\ n_{u,N_{RX,u}-1} \end{bmatrix} \quad [\text{Math. 9}]$$

In the above expressions, a matrix $H_{u,i}$ is a channel response matrix for the cell i and the user u. Each element of the matrix $H_{u,i}$ is basically a complex number. A vector $n_u$ is noise included in the reception signal $r_u$ of the user u. For example, the noise includes thermal noise, interference from another system, and the like. The average power of the noise is expressed as below.

$$\sigma_{n,u}^2 \quad [\text{Math. 10}]$$

The reception signal $r_u$ can also be expressed by a desired signal and another signal as below.

$$r_u = H_{u,i} s_{i,u} + H_{u,i} \sum_{v \in U_i, v \neq u} s_{i,v} + \sum_{j \neq i} H_{u,j} \sum_{v \in U_j} s_{j,v} + n_u \quad [\text{Math. 11}]$$

In the above expression, the first term of the right-hand side denotes a desired signal of the user u, the second term denotes interference in the serving cell i of the user u (called intra-cell interference, multi-user interference, multi-access interference, or the like), and the third term denotes interference from a cell other than the cell i (called inter-cell interference).

Note that, when orthogonal multiple access (e.g., OFDMA or SC-FDMA) or the like is adopted, the reception signal can be expressed as below.

$$r_u = H_{u,i} s_{i,u} + \sum_{j \neq i} H_{u,j} s_{j,v} + n_u \quad [\text{Math. 12}]$$

In orthogonal multiple access, no intra-cell interference occurs, and moreover, in the other cell j, a signal of the other user v is not multiplexed on the same radio resource.

(b) Uplink

Next, uplink transmission signals and reception signals when SPC is adopted will be described. Assumed here is a multi-cell system of HetNet, SCE, or the like. Note that the signs used for downlink will be further used as signs denoting signals and the like.

A transmission signal that the user u transmits in the cell i can be expressed in a vector form as below.

$$s_{i,u} = \begin{bmatrix} s_{i,u,0} \\ \vdots \\ s_{i,u,N_{TX,u}-1} \end{bmatrix} = W_{i,u} P_{i,u} x_{i,u} \quad \text{[Math. 13]}$$

$$W_{i,u} = \begin{bmatrix} w_{i,u,0,0} & \cdots & w_{i,u,0,N_{SS,u}-1} \\ \vdots & \ddots & \vdots \\ w_{i,u,N_{TX,u}-1,0} & \cdots & w_{i,u,N_{TX,u}-1,N_{SS,u}-1} \end{bmatrix} \quad \text{[Math. 14]}$$

$$P_{i,u} = \begin{bmatrix} P_{i,u,0,0} & \cdots & P_{i,u,0,N_{SS,u}-1} \\ \vdots & \ddots & \vdots \\ P_{i,u,N_{SS,u}-1,0} & \cdots & P_{i,u,N_{SS,u}-1,N_{SS,u}-1} \end{bmatrix} \quad \text{[Math. 15]}$$

$$x_{i,u} = \begin{bmatrix} x_{i,u,0} \\ \vdots \\ x_{i,u,N_{SS,u}-1} \end{bmatrix} \quad \text{[Math. 16]}$$

In the above expressions, the number of transmission antennas is the number of transmission antennas of the user, $N_{TX,u}$. As in downlink, a matrix $P_{i,u}$, which is a power allocation coefficient matrix for the user u in the cell i, may be a diagonal matrix.

In uplink, there is no case where a signal of a user and a signal of another user are multiplexed in the user; thus, a reception signal of a base station of the cell i can be expressed as below.

$$r_i = \begin{bmatrix} r_{i,0} \\ \vdots \\ r_{i,N_{RX,i}-1} \end{bmatrix} = \sum_{i'} \sum_{u' \in U_{i'}'} H_{i',u'} s_{i',u'} + n_i \quad \text{[Math. 17]}$$

$$H_{i,u} = \begin{bmatrix} h_{i,u,0,0} & \cdots & h_{i,u,0,N_{TX,u}-1} \\ \vdots & \ddots & \vdots \\ h_{i,u,N_{RX,i}-1,0} & \cdots & h_{i,u,N_{RX,i}-1,N_{TX,u}-1} \end{bmatrix} \quad \text{[Math. 18]}$$

$$n_i = \begin{bmatrix} n_{i,0} \\ \vdots \\ n_{i,N_{RX,i}-1} \end{bmatrix} \quad \text{[Math. 19]}$$

It should be noted that in uplink, unlike in downlink, a base station needs to decode all signals from a plurality of users in a cell. Note also that a channel response matrix differs depending on a user.

Specifically, when a focus is put on a signal transmitted by the user u, among uplink signals in the cell i, a reception signal can be expressed as below.

$$r_{i,u} = \begin{bmatrix} r_{i,u,0} \\ \vdots \\ r_{i,u,N_{RX,i}-1} \end{bmatrix} = \\ H_{i,u} s_{i,u} + \sum_{v \in U_i, v \neq u} H_{i,v} s_{i,v} + \sum_{j \neq i} \sum_{v \in U_j} H_{i,v} s_{j,v} + n_i \quad \text{[Math. 20]}$$

In the above expression, the first term of the right-hand side denotes a desired signal of the user u, the second term denotes interference in the serving cell i of the user u (called intra-cell interference, multi-user interference, multi-access interference, or the like), and the third term denotes interference from a cell other than the cell i (called inter-cell interference).

Note that, in the case where orthogonal multiple access (e.g., OFDMA or SC-FDMA) or the like is adopted, the reception signal can be expressed as below.

$$r_{i,u} = H_{i,u} s_{i,u} + \sum_{j \neq i} H_{i,v} s_{j,v} + n_i \quad \text{[Math. 21]}$$

In orthogonal multiple access, no intra-cell interference occurs, and moreover, in the other cell j, a signal of the other user v is not multiplexed on the same radio resource.

1.2. Constellation

A transmission signal sequence (that is, a signal) including a bit string is transmitted after a modulation process. At the time of modulation, the bit string is associated with a signal point (also referred to as a "symbol") on a complex plane. A correspondence relation between the bit string and the signal point is also referred to as a "constellation," "constellation mapping," "symbol mapping," a "symbol arrangement," or the like.

Generally, it is preferable to use a gray-mapped constellation. The gray mapping indicates that combinations of bit strings corresponding to adjacent symbols on the complex plane differ in at most 1 bit. In a case in which the gray-mapped constellation is used, although the reception device decodes erroneously, for example, in a case in which it is decoded as a symbol next to a correct symbol, the bit error is at most 1 bit.

As an example, Table 1 to Table 3 below show correspondence relations between bit strings and coordinates on an IQ plane of the gray-mapped constellation in respective modulation schemes of 64QAM, 16QAM, and QPSK. Table 1 shows a correspondence relation in 64QAM in which 6 bits per symbol bit can be expressed. Table 2 shows a correspondence relation in 16QAM in which 4 bits per symbol bit can be expressed. Table 3 shows a correspondence relation in QPSK in which 2 bits per symbol bit can be expressed.

TABLE 1

| bit string | I | Q |
|---|---|---|
| 000000 | $3/\sqrt{42}$ | $3/\sqrt{42}$ |
| 000001 | $3/\sqrt{42}$ | $1/\sqrt{42}$ |
| 000010 | $1/\sqrt{42}$ | $3/\sqrt{42}$ |
| 000011 | $1/\sqrt{42}$ | $1/\sqrt{42}$ |
| 000100 | $3/\sqrt{42}$ | $5/\sqrt{42}$ |
| 000101 | $3/\sqrt{42}$ | $7/\sqrt{42}$ |
| 000110 | $1/\sqrt{42}$ | $5/\sqrt{42}$ |
| 000111 | $1/\sqrt{42}$ | $7/\sqrt{42}$ |
| 001000 | $5/\sqrt{42}$ | $3/\sqrt{42}$ |
| 001001 | $5/\sqrt{42}$ | $1/\sqrt{42}$ |
| 001010 | $7/\sqrt{42}$ | $3/\sqrt{42}$ |
| 001011 | $7/\sqrt{42}$ | $1/\sqrt{42}$ |
| 001100 | $5/\sqrt{42}$ | $5/\sqrt{42}$ |
| 001101 | $5/\sqrt{42}$ | $7/\sqrt{42}$ |
| 001110 | $7/\sqrt{42}$ | $5/\sqrt{42}$ |
| 001111 | $7/\sqrt{42}$ | $7/\sqrt{42}$ |
| 010000 | $3/\sqrt{42}$ | $-3/\sqrt{42}$ |
| 010001 | $3/\sqrt{42}$ | $-1/\sqrt{42}$ |
| 010010 | $1/\sqrt{42}$ | $-3/\sqrt{42}$ |
| 010011 | $1/\sqrt{42}$ | $-1/\sqrt{42}$ |

TABLE 1-continued

| bit string | I | Q |
|---|---|---|
| 010100 | 3/√42 | -5/√42 |
| 010101 | 3/√42 | -7/√42 |
| 010110 | 1/√42 | -5/√42 |
| 010111 | 1/√42 | -7/√42 |
| 011000 | 5/√42 | -3/√42 |
| 011001 | 5/√42 | -1/√42 |
| 011010 | 7/√42 | -3/√42 |
| 011011 | 7/√42 | -1/√42 |
| 011100 | 5/√42 | -5/√42 |
| 011101 | 5/√42 | -7/√42 |
| 011110 | 7/√42 | -5/√42 |
| 011111 | 7/√42 | -7/√42 |
| 100000 | -3/√42 | 3/√42 |
| 100001 | -3/√42 | 1/√42 |
| 100010 | -1/√42 | 3/√42 |
| 100011 | -1/√42 | 1/√42 |
| 100100 | -3/√42 | 5/√42 |
| 100101 | -3/√42 | 7/√42 |
| 100110 | -1/√42 | 5/√42 |
| 100111 | -1/√42 | 7/√42 |
| 101000 | -5/√42 | 3/√42 |
| 101001 | -5/√42 | 1/√42 |
| 101010 | -7/√42 | 3/√42 |
| 101011 | -7/√42 | 1/√42 |
| 101100 | -5/√42 | 5/√42 |
| 101101 | -5/√42 | 7/√42 |
| 101110 | -7/√42 | 5/√42 |
| 101111 | -7/√42 | 7/√42 |
| 110000 | -3/√42 | -3/√42 |
| 110001 | -3/√42 | -1/√42 |
| 110010 | -1/√42 | -3/√42 |
| 110011 | -1/√42 | -1/√42 |
| 110100 | -3/√42 | -5/√42 |
| 110101 | -3/√42 | -7/√42 |
| 110110 | -1/√42 | -5/√42 |
| 110111 | -1/√42 | -7/√42 |
| 111000 | -5/√42 | -3/√42 |
| 111001 | -5/√42 | -1/√42 |
| 111010 | -7/√42 | -3/√42 |
| 111011 | -7/√42 | -1/√42 |
| 111100 | -5/√42 | -5/√42 |
| 111101 | -5/√42 | -7/√42 |
| 111110 | -7/√42 | -5/√42 |
| 111111 | -7/√42 | -7/√42 |

TABLE 2

| Bit string | I | Q |
|---|---|---|
| 0000 | 1/√10 | 1/√10 |
| 0001 | 1/√10 | 3/√10 |
| 0010 | 3/√10 | 1/√10 |
| 0011 | 3/√10 | 3/√10 |
| 0100 | 1/√10 | -1/√10 |
| 0101 | 1/√10 | -3/√10 |
| 0110 | 3/√10 | -1/√10 |
| 0111 | 3/√10 | -3/√10 |
| 1000 | -1/√10 | 1/√10 |
| 1001 | -1/√10 | 3/√10 |
| 1010 | -3/√10 | 1/√10 |
| 1011 | -3/√10 | 3/√10 |
| 1100 | -1/√10 | -1/√10 |
| 1101 | -1/√10 | -3/√10 |
| 1110 | -3/√10 | -1/√10 |
| 1111 | -3/√10 | -3/√10 |

TABLE 3

| Bit string | I | Q |
|---|---|---|
| 00 | 1/√2 | 1/√2 |
| 01 | 1/√2 | -1/√2 |
| 10 | -1/√2 | 1/√2 |
| 11 | -1/√2 | -1/√2 |

1.3. Technical Problem

In SPC, a signal is multiplexed after power allocation is performed on a modulated symbol. Here, in a case in which a signal to which the gray-mapped constellation is applied is multiplexed, a constellation after multiplexing (that is, a correspondence relation between a set of bit strings to be multiplexed and a symbol) may not have the gray mapping. As an example, FIG. 4 illustrates a constellation after multiplexing in a case in which two signals modulated using QPSK are multiplexed.

Figure 4:
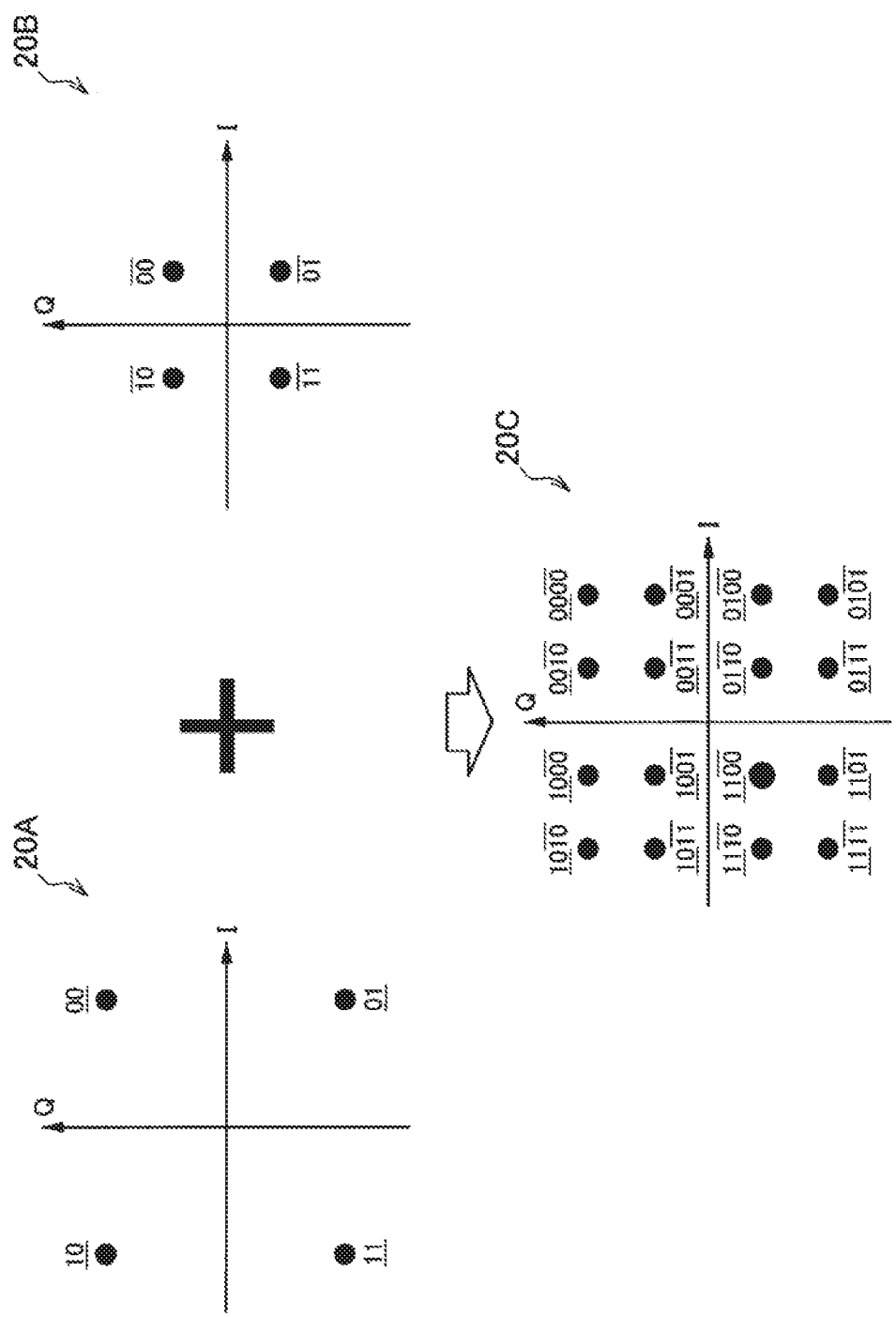
FIG. 4 is a diagram illustrating an example of a constellation of an SPC-multiplexed signal.

FIG. 4 is a diagram illustrating an example of a constellation of an SPC-multiplexed signal. A number attached to each symbol indicates a corresponding bit string. An amplitude magnitude relation of two QPSK constellations (reference numerals 20A and 20B) corresponds to a magnitude relation of allocated power. Among the bit strings corresponding to the symbols of the constellation (reference numeral 20C) of the SPC-multiplexed signal, two bits of a first half correspond to a bit string of a signal in which allocated power is large (that is, a signal to which the constellation 20A is applied). Each corresponding bit string is underlined in FIG. 4. Further, two bits of a second half correspond to a bit string of a signal in which allocated power is small (that is, a signal to which the constellation 20B is applied). Each corresponding bit string is marked with an upper line in FIG. 4.

As illustrated in FIG. 4, each of the two QPSK constellations 20A and 20B is gray-mapped. On the other hand, the constellation 20C of an SPC-multiplexed signal is not gray-mapped. Specifically, corresponding bit strings of adjacent symbols with an I axis or a Q axis interposed therebetween differ in 2 bits. For example, "0100" and "0001" adjacent thereto with the I axis interposed therebetween differ in a total of 2 bits in a second bit and a fourth bit.

In a case in which the constellation of the SPC-multiplexed signal is not gray-mapped, for example, if the reception device decodes it erroneously as a symbol adjacent to the correct symbol with the I axis or the Q axis interposed therebetween, a bit error of 2 or more bits may occur. The bit error of 2 or more bits leads to degradation of the decoding characteristic of the reception device. Further, the bit error occurs particularly remarkably in a case in which a maximum likelihood detection (MLD) technique is employed on the reception device side.

For such reasons, it is preferable that the gray mapping be implemented not only before multiplexing but also in the constellation after SPC multiplexing. In this regard, the present embodiment provides a mechanism for implementing this.

2. CONFIGURATION EXAMPLE

2.1 Schematic Configuration Example of System

Figure 5:
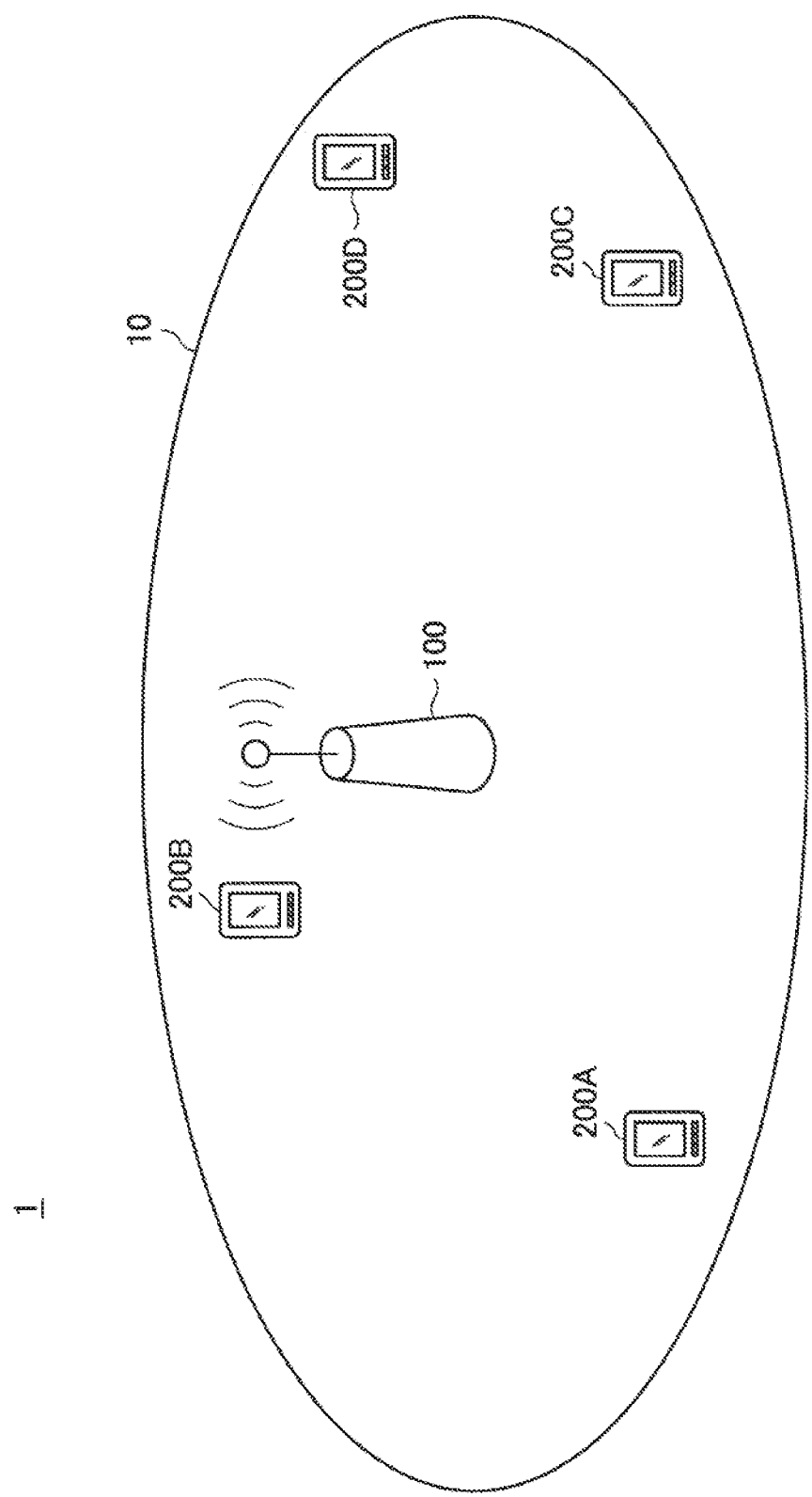
FIG. 5 is an explanatory diagram illustrating an example of a schematic configuration of a system according to an embodiment of the present disclosure.

Next, a schematic configuration of a system 1 according to an embodiment of the present disclosure will be described with reference to FIG. 5. FIG. 5 is an explanatory diagram illustrating an example of the schematic configuration of the system 1 according to an embodiment of the present disclosure. According to FIG. 5, the system 1 includes a base station 100 and a terminal device 200. Here, the terminal device 200 is also called a user. The user may also be called user equipment (UE). Here, the UE may be UE defined in LTE or LTE-A, or may generally refer to communication equipment.

(1) Base Station 100

The base station 100 is a base station of a cellular system (or mobile communication system). The base station 100 performs wireless communication with a terminal device (e.g., the terminal device 200) located in a cell 10 of the base station 100. For example, the base station 100 transmits a downlink signal to the terminal device, and receives an uplink signal from the terminal device.

(2) Terminal Device 200

The terminal device 200 can perform communication in a cellular system (or mobile communication system). The terminal device 200 performs wireless communication with a base station (e.g., the base station 100) of the cellular system. For example, the terminal device 200 receives a downlink signal from the base station, and transmits an uplink signal to the base station.

(3) Multiplexing/Multiple Access

In particular, in an embodiment of the present disclosure, the base station 100 performs wireless communication with a plurality of terminal devices by non-orthogonal multiple access. More specifically, the base station 100 performs wireless communication with a plurality of terminal devices by multiplexing/multiple access using power allocation. For example, the base station 100 performs wireless communication with the plurality of terminal devices by multiplexing/multiple access using SPC.

For example, the base station 100 performs wireless communication with the plurality of terminal devices by multiplexing/multiple access using SPC in downlink. Specifically, for example, the base station 100 multiplexes signals to the plurality of terminal devices using SPC. In this case, for example, the terminal device 200 removes one or more other signals, as interference, from a multiplexed signal including a desired signal (that is, a signal to the terminal device 200), and decodes the desired signal.

Note that the base station 100 may perform wireless communication with the plurality of terminal devices by multiplexing/multiple access using SPC in uplink, instead of or together with downlink. In this case, the base station 100 may decode a multiplexed signal including signals transmitted from the plurality of terminal devices into the respective signals.

2.2. Configuration Example of Base Station

Figure 6:
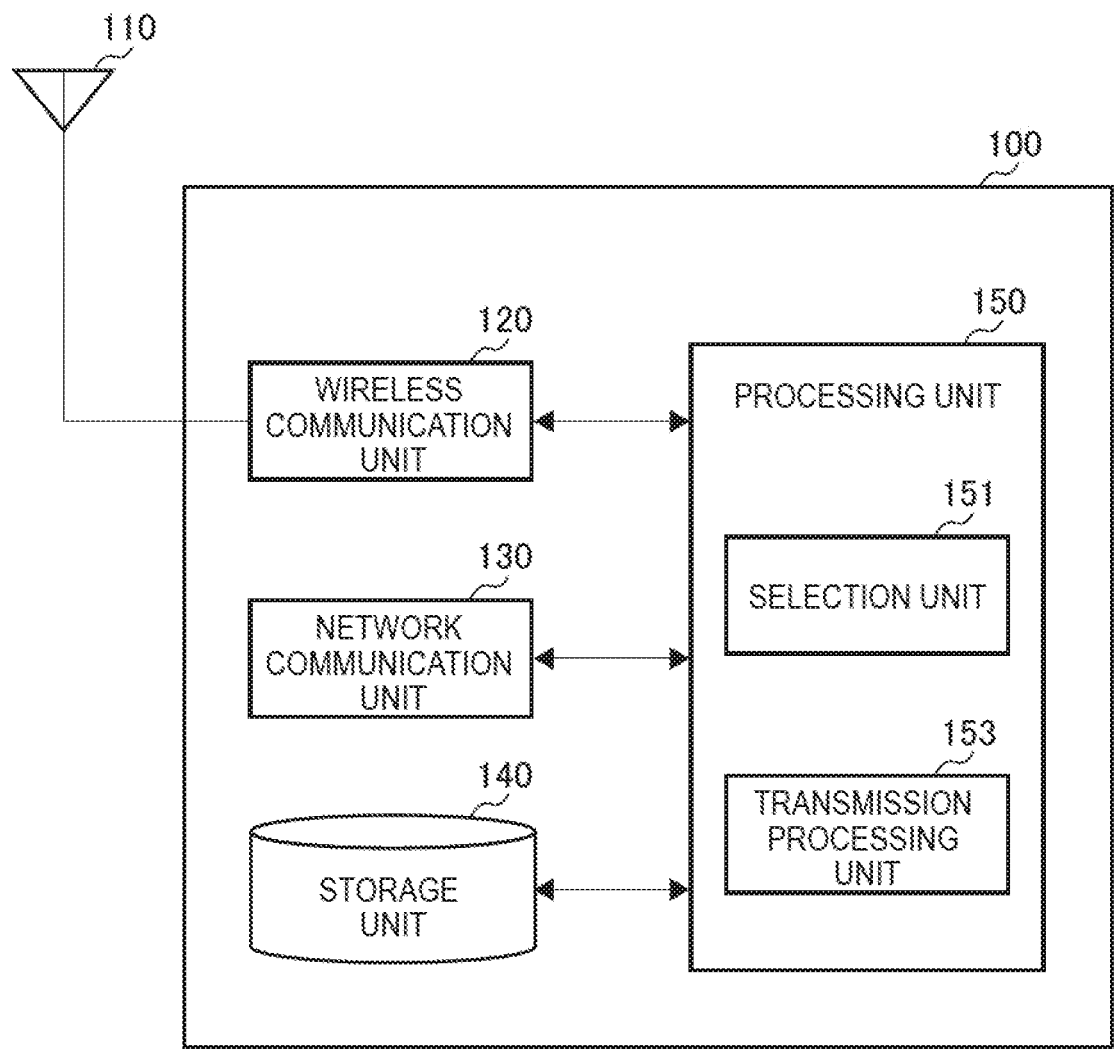
FIG. 6 is a block diagram illustrating an example of a configuration of a base station according to the embodiment.

Next, the configuration of the base station 100 according to an embodiment of the present disclosure will be described with reference to FIG. 6. FIG. 6 is a block diagram illustrating the example of the configuration of the base station 100 according to an embodiment of the present disclosure. According to FIG. 6, the base station 100 includes an antenna unit 110, a wireless communication unit 120, a network communication unit 130, a storage unit 140, and a processing unit 150.

(1) Antenna Unit 110

The antenna unit 110 radiates signals output by the wireless communication unit 120 out into space as radio waves. In addition, the antenna unit 110 converts radio waves in the space into signals, and outputs the signals to the wireless communication unit 120.

(2) Wireless Communication Unit 120

The wireless communication unit 120 transmits and receives signals. For example, the wireless communication unit 120 transmits a downlink signal to a terminal device, and receives an uplink signal from a terminal device.

(3) Network Communication Unit 130

The network communication unit 130 transmits and receives information. For example, the network communication unit 130 transmits information to other nodes, and receives information from other nodes. For example, the other nodes include another base station and a core network node.

(4) Storage Unit 140

The storage unit 140 temporarily or permanently stores a program and various data for operation of the base station 100.

(5) Processing Unit 150

The processing unit 150 provides various functions of the base station 100. The processing unit 150 includes a selection unit 151 and a transmission processing unit 153. Further, the processing unit 150 may further include other constituent elements in addition to these constituent elements. In other words, the processing unit 150 may also perform an operation in addition to operation of these components.

The operations of the selection unit 151 and the transmission processing unit 153 will be described later in detail.

3. FIRST EMBODIMENT

Next, a first embodiment will be described with reference to FIGS. 7 to 15.

3.1. Technical Features (1) SPC Multiplexing

The base station 100 (for example, the transmission processing unit 153) multiplexes transmission signal sequences of a plurality of power layers using the power allocation. In other words, the transmission signal sequence transmitted from the base station 100 is multiplexed using the power allocation. Further, in this specification, the expression "the power layer is multiplexed" is synonymous with the expression "a signal of the power layer is multiplexed." Further, the expression "power is allocated to the power layer" is synonymous with the expression "power is allocated to the signal of the power layer."

The base station 100 performs the power allocation in accordance with an arbitrary criterion. Hereinafter, an example of a relation between the power layer and the allocated power will be described with reference to FIG. 7.

Figure 7:
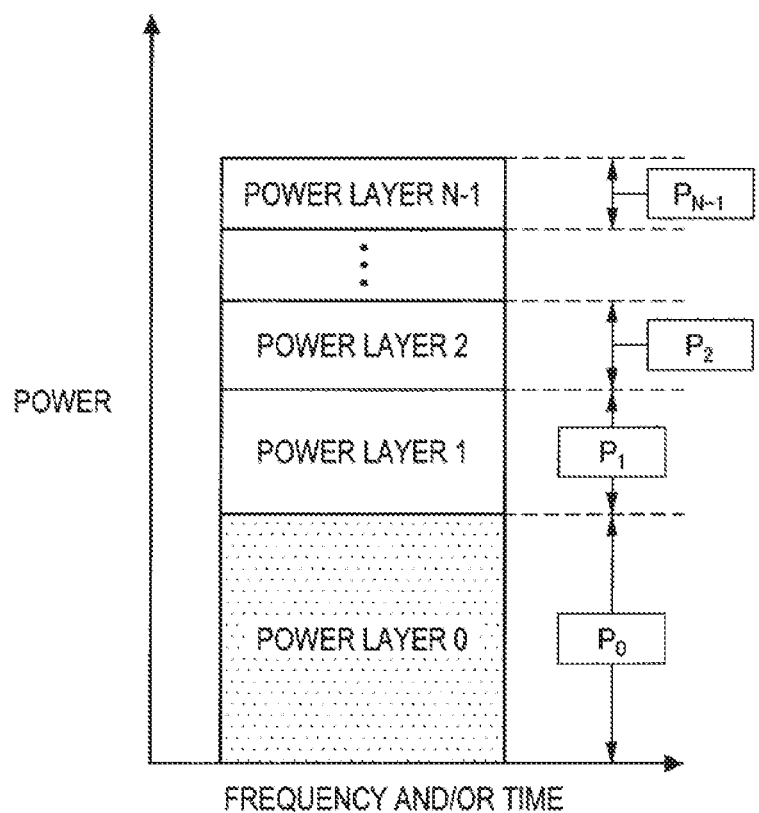
FIG. 7 is an explanatory diagram for describing technical features of a base station according to a first embodiment.

FIG. 7 is an explanatory diagram for describing an example of the power allocation to the power layer. A horizontal axis indicates frequency resources and/or time resources, and a vertical axis indicates a power level (a height of allocated power). Referring to FIG. 7, N power layers (power layer 0 to power layer N−1) to be multiplexed using SPC are illustrated. Numbers from 0 to N−1 are also referred to as indices of the power layers. The height of the power layer (that is, the width in the vertical direction) indicates the height of power to be allocated. In the example illustrated in FIG. 7, power allocated to a power layer having a smaller index is higher, and for example, power $P_0$ is higher than power $P_1$, power $P_1$ is higher than power $P_2$, and power $P_{N-1}$ is the lowest. The transmission signal sequence to be multiplexed using SPC is transmitted using at least one power layer.

Here, the relation between the index of the power layer and the power to be allocated is not limited to the example illustrated in FIG. 7. For example, an index of a power layer to which the highest power is allocated may be not 0, and the power to be allocated may decrease as the index of the power layer decreases.

(2) Constellation Selection Process

The base station 100 (for example, the selection unit 151) selects the constellation to be applied to each of the transmission signal sequences to be multiplexed. Further, the base station 100 (for example, the transmission processing unit 153) applies the selected constellation to each of the transmission signal sequences.

Here, for convenience of description, the number of multiplexed transmission signal sequences is assumed to be two. It will be appreciated that the number of multiplexed transmission signal sequences may be three or more. A bit string of the transmission signal sequence which is higher in the power to be allocated than the other bit string is referred to as a "first bit string," and a bit string of the transmission signal sequence which is lower in the power to be allocated than the other bit string is referred to as a "second bit string." The base station 100 selects a constellation to be applied to each of the first bit string and the second bit string. A constellation applied to the first bit string is also referred to as a "first constellation," and a constellation applied to the second bit string is also referred to as a "second constellation." Here, the first and second constellations applied to the respective bit strings are assumed to be gray-mapped.

Figure 8:
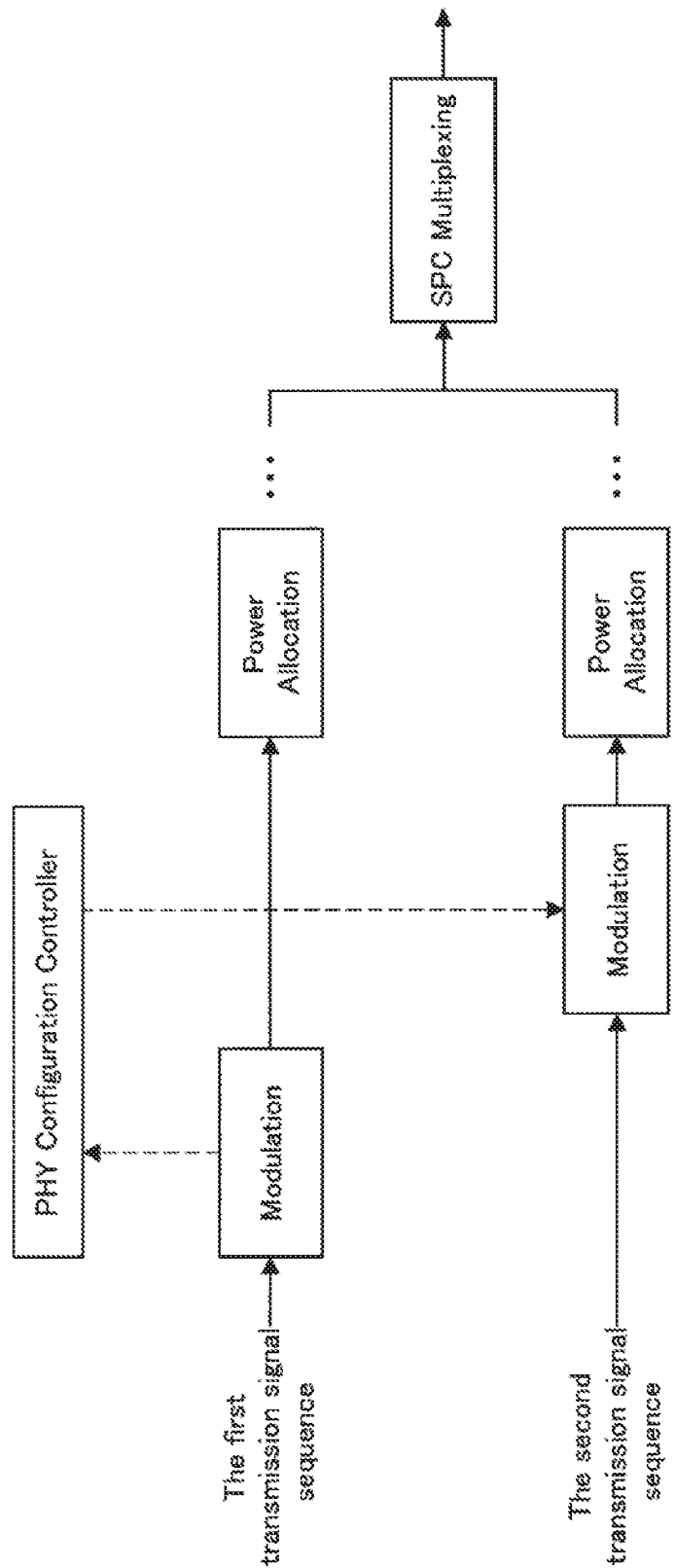
FIG. 8 is an explanatory diagram for describing technical features of the base station according to the embodiment.

The base station 100 selects a constellation to be applied to the other bit string in accordance with one bit string. Specifically, the base station 100 selects the second constellation corresponding to a symbol position of the first bit string in the first constellation applied to the first bit string. FIG. 8 is an explanatory diagram for describing an example of a process in a transmission device (for example, the wireless communication unit 120) that performs such selection. As illustrated in FIG. 8, a physical layer configuration controller (for example, operating under the control of the processing unit 150) acquires information from a modulator that modulates the bit string of the first transmission signal sequence. Specifically, the physical layer configuration controller acquires information indicating the symbol position of the first bit string in the first constellation applied to the first bit string. Then, as illustrated in FIG. 8, the physical configuration controller gives an instruction to the modulator that modulates the bit string of the second transmission signal sequence. Specifically, the physical layer configuration controller gives an instruction to apply the second constellation selected on the basis of the acquired information. Further, power is allocated to each signal output from each modulator. For example, high power is allocated to the signal of the first transmission signal sequence, and low power is allocated to the signal of the second transmission signal sequence. Thereafter, the signals of the two transmission signal sequences undergo the SPC multiplexing through various processes.

A method of selecting the second constellation will be described in detail.

For example, the base station 100 selects the second constellation so that bit strings corresponding to symbols of end portions in a direction of adjacency of the respective second constellations corresponding to adjacent symbols in the first constellation are identical. Here, the direction of adjacency in the present embodiment is assumed to be either of an I direction (that is, a positive I-axis direction or a negative I-axis direction) or a Q direction (that is, a positive Q-axis direction or a negative Q-axis direction). In this regard, two signals modulated using QPSK will be described in detail with reference to FIG. 9.

Figure 9:
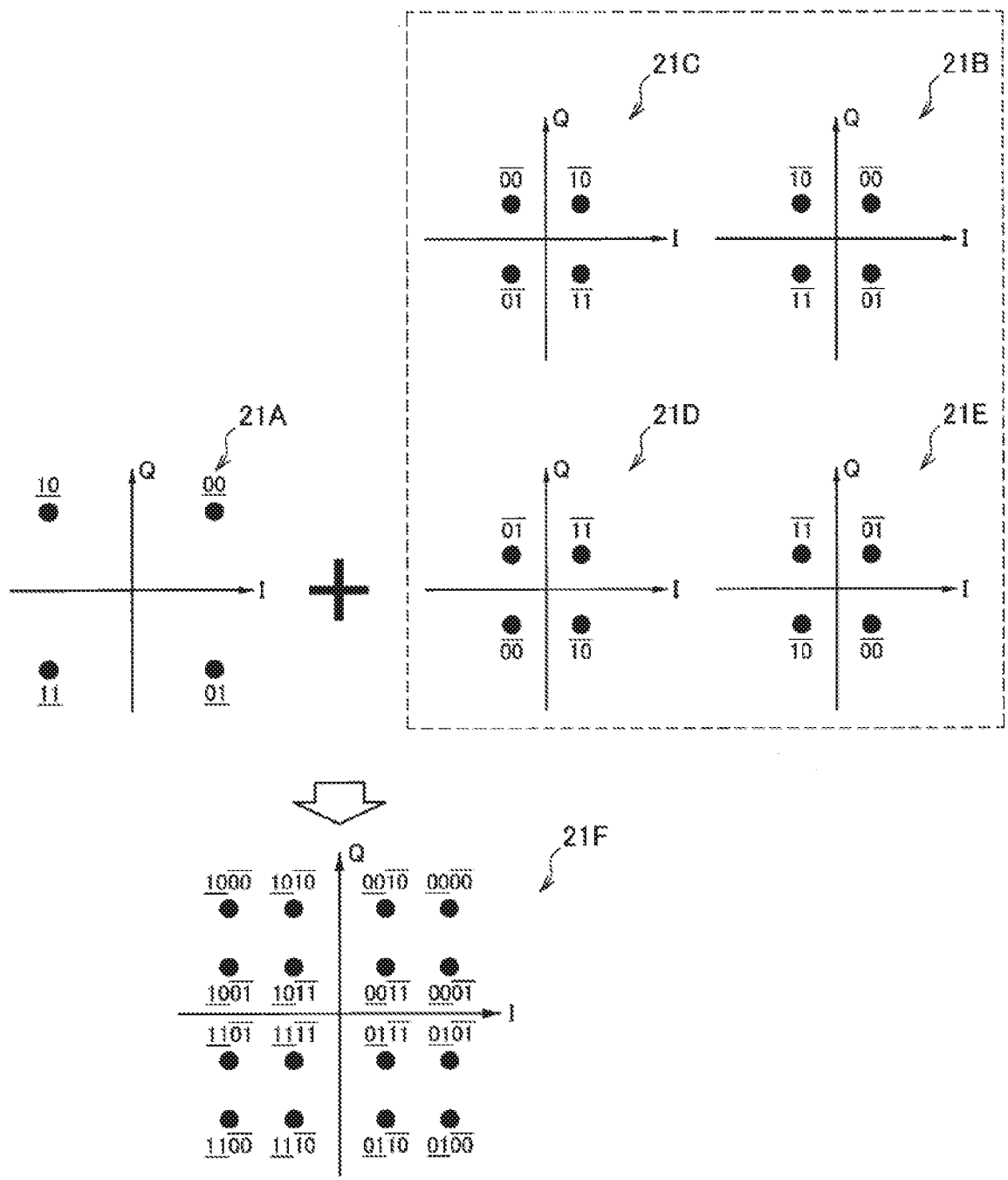
FIG. 9 is an explanatory diagram for describing technical features of the base station according to the embodiment.

FIG. 9 is an explanatory diagram for describing a constellation selection process according to the present embodiment. The first constellation applied to the first bit string is indicated by reference numeral 21A. On the other hand, the second constellations applied to the second bit string are indicated by reference numerals 21B to 21E. For example, in a case in which the first bit string is "00," the second constellation 21B is applied to the second bit string. Further, in a case in which the first bit string is "10," the second constellation 21C is applied to the second bit string. Further, in a case in which the first bit string is "11," the second constellation 21D is applied to the second bit string. Further, in a case in which the first bit string is "01," the second constellation 21E is applied to the second bit string. Further, meanings of underlines and upper lines attached to the respective bit strings in FIG. 9 are similar to those in FIG. 4.

The second constellations corresponding to, for example, "00" and "10" which are adjacent symbols in the first constellation 21A are the second constellation 21B and reference numeral 21C. Further, in the first constellation 21A, a direction from "00" to "10" is the negative I-axis direction. On the other hand, in the first constellation 21A, a direction of from "10" to "00" is the positive I-axis direction. Therefore, the bit strings (that is, "10" and "11") corresponding to the symbol of the end portion in the negative I-axis direction of the second constellation 21B corresponding to "00" in the first constellation 21A are identical to the bit strings (that is, "10" and "11") corresponding to the symbols of the end portion in the I-axis positive direction of the second constellation 21C corresponds to "10" in the first constellation 21A. Such a relation is similarly held for "10" and "11," "11" and "01," "01" and "00" which are other adjacent symbols in the first constellation as well.

Here, the above relation can also be understood as the second constellations corresponding to the adjacent symbols in the first constellation being inverted in the direction of adjacency. For example, the second constellation 21C is obtained by inverting the second constellation 21B in the negative I-axis direction (that is, on the Q axis). Similarly, the second constellation 21B is obtained by inverting the second constellation 21C in the positive I-axis direction (that is, on the Q axis). Such a relation is similarly held for "10" and "11," "11" and "01," "01" and "00" which are other adjacent symbols in the first constellation as well.

Further, the above relation can be realized by deciding one reference symbol in the first constellation and selecting the second constellation in accordance with a deviation of the symbol corresponding to the first bit string from the reference symbol. For example, in a case in which the symbol corresponding to the first bit string is a symbol that deviates from the reference symbol by an odd number of symbols in the positive I-axis direction (or the negative I-axis direction), the base station 100 selects a constellation obtained by inverting the second constellation corresponding to the reference symbol in the positive I-axis direction (or the negative I-axis direction) (that is, on the Q axis). Further, in a case in which the symbol corresponding to the first bit string is a symbol that deviates from the reference symbol by an odd number of symbols in the positive Q-axis direction (or the negative Q-axis direction), the base station 100 selects a constellation obtained by inverting the second constellation corresponding to the reference symbol in the positive Q-axis direction (or the negative Q-axis direction) (that is, on the I axis). Further, in a case in which the symbol corresponding to the first bit string is a symbol that deviates from the reference symbol by an odd number of symbols in the positive I-axis direction (or the negative I-axis direction) and the positive Q-axis direction (or the negative Q-axis direction), the base station 100 selects a constellation obtained by inverting the second constellation corresponding to the reference symbol in the positive I-axis direction (or the negative I-axis direction) and the positive Q-axis direction (or the negative Q-axis direction) (that is, on the Q axis and the I axis).

For example, in the example illustrated in FIG. 9, the symbol corresponding to "00" in the first constellation indicated by reference numeral 21A is set as the reference symbol. In this case, since the symbol corresponding to "10" is a symbol which deviates from the reference symbol by 1 symbol in the negative I-axis direction, the base station 100 selects the second constellation 21C obtained by inverting the second constellation 21B corresponding to the reference symbol around the Q axis. Further, since the symbol corresponding to "01" is a symbol which deviates from the reference symbol by 1 symbol in the negative Q-axis direction, the base station 100 selects the second constellation 21E obtained by inverting the second constellation 21B corresponding to the reference symbol around the I axis. Further, since the symbol corresponding to "11" is a symbol which deviates from the reference symbol by 1 symbol in the negative I-axis direction and the negative Q-axis direction, the base station 100 selects the second constellation 21D obtained by inverting the second constellation 21B corresponding to the reference symbol around the Q axis and the I axis.

Reference numeral 21F in FIG. 9 indicates a constellation of an SPC-multiplexed signal. Referring to the constellation 21F, it is understood that the gray mapping is implemented. For example, in each quadrant, bit strings corresponding to adjacent symbols differ in 1 bit. Further, bit strings corresponding to adjacent symbols with the I axis or the Q axis interposed therebetween also differ in 1 bit. For example, "0001" and "0101" adjacent thereto with the I axis interposed therebetween differ in a total of 1 bit, that is, only the second bit.

As described above, since the second constellation selected by the above method is used, the gray mapping is implemented not only in multiplexing but also in the constellation after the SPC multiplexing. Accordingly, even when the reception device decodes erroneously, for example, in a case in which it is decoded as a symbol next to a correct symbol, the bit error of 2 or more bits does not occur, and the bit error of at most 1 bit occurs. As described above, it is possible to prevent the degradation of the decoding characteristic of the reception device.

Further, in a case in which the number of multiplexed transmission signal sequences is 3 or more, the constellation selection described above is first performed on the basis of a relation of two transmission signal sequences, and then the constellation selection described above is performed on the basis of a relation between a non-multiplexed transmission signal sequence and a multiplexed transmission signal sequence. In other words, even when the number of multiplexed transmission signal sequences is 3 or more, the present technology is applicable.

Further, in the above example, QPSK has been described as an example, but the present technology may employ an arbitrary modulation scheme such as BPSK, 16QAM, or the like. Further, the modulation scheme may be different between the first bit string and the second bit string.

Table 4 to Table 7 below show correspondence relations between the bit strings and coordinates of the first constellation 21A and the second constellations 21B to 21E on the IQ plane. Table 4 shows a correspondence relation in the first constellation 21A and the second constellation 21B. Table 5 shows a correspondence relation in the second constellation 21C, that is, a correspondence relation inverted around the Q axis. Table 6 shows a correspondence relation in the second constellation 21E, that is, a correspondence relation inverted around the I axis. Table 7 shows a correspondence relation in the second constellation 21D, that is, a correspondence relation inverted around the I axis and the Q axis.

TABLE 4

| Bit string | | I | Q |
|---|---|---|---|
| 0 | 0 | 1/sqrt (2) | 1/sqrt (2) |
| 0 | 1 | 1/sqrt (2) | −1/sqrt (2) |
| 1 | 0 | −1/sqrt (2) | 1/sqrt (2) |
| 1 | 1 | −1/sqrt (2) | −1/sqrt (2) |

TABLE 5

| Bit string | | I | Q |
|---|---|---|---|
| 0 | 0 | −1/sqrt (2) | 1/sqrt (2) |
| 0 | 1 | −1/sqrt (2) | −1/sqrt (2) |
| 1 | 0 | 1/sqrt (2) | 1/sqrt (2) |
| 1 | 1 | 1/sqrt (2) | −1/sqrt (2) |

TABLE 6

| Bit string | | I | Q |
|---|---|---|---|
| 0 | 0 | 1/sqrt (2) | −1/sqrt (2) |
| 0 | 1 | 1/sqrt (2) | 1/sqrt (2) |
| 1 | 0 | −1/sqrt (2) | −1/sqrt (2) |
| 1 | 1 | −1/sqrt (2) | 1/sqrt (2) |

TABLE 7

| Bit string | | I | Q |
|---|---|---|---|
| 0 | 0 | −1/sqrt (2) | −1/sqrt (2) |
| 0 | 1 | −1/sqrt (2) | 1/sqrt (2) |
| 1 | 0 | 1/sqrt (2) | −1/sqrt (2) |
| 1 | 1 | 1/sqrt (2) | 1/sqrt (2) |

Further, Table 8 to Table 11 below show correspondence relations between the bit strings and coordinates of the first constellation and the second constellation on the IQ plane in the case of 16QAM. Table 8 shows a correspondence relation in the first constellation and the second constellation without inversion. Table 9 shows a correspondence relation in the second constellation obtained by inverting the first constellation around the Q axis. Table 10 shows a correspondence relation in the second constellation obtained by inverting the first constellation around the I axis. Table 11 shows a correspondence relation in the second constellation obtained by inverting the first constellation around the I axis and the Q axis.

TABLE 8

| Bit string | | | | I | Q |
|---|---|---|---|---|---|
| 0 | 0 | 0 | 0 | 1/sqrt (10) | 1/sqrt (10) |
| 0 | 0 | 0 | 1 | 1/sqrt (10) | 3/sqrt (10) |
| 0 | 0 | 1 | 0 | 3/sqrt (10) | 1/sqrt (10) |
| 0 | 0 | 1 | 1 | 3/sqrt (10) | 3/sqrt (10) |
| 0 | 1 | 0 | 0 | 1/sqrt (10) | −1/sqrt (10) |
| 0 | 1 | 0 | 1 | 1/sqrt (10) | −3/sqrt (10) |
| 0 | 1 | 1 | 0 | 3/sqrt (10) | −1/sqrt (10) |
| 0 | 1 | 1 | 1 | 3/sqrt (10) | −3/sqrt (10) |
| 1 | 0 | 0 | 0 | −1/sqrt (10) | 1/sqrt (10) |
| 1 | 0 | 0 | 1 | −1/sqrt (10) | 3/sqrt (10) |
| 1 | 0 | 1 | 0 | −3/sqrt (10) | 1/sqrt (10) |
| 1 | 0 | 1 | 1 | −3/sqrt (10) | 3/sqrt (10) |
| 1 | 1 | 0 | 0 | −1/sqrt (10) | −1/sqrt (10) |
| 1 | 1 | 0 | 1 | −1/sqrt (10) | −3/sqrt (10) |
| 1 | 1 | 1 | 0 | −3/sqrt (10) | −1/sqrt (10) |
| 1 | 1 | 1 | 1 | −3/sqrt (10) | −3/sqrt (10) |

TABLE 9

| Bit string | | | | I | Q |
|---|---|---|---|---|---|
| 0 | 0 | 0 | 0 | −1/sqrt (10) | 1/sqrt (10) |
| 0 | 0 | 0 | 1 | −1/sqrt (10) | 3/sqrt (10) |
| 0 | 0 | 1 | 0 | −3/sqrt (10) | 1/sqrt (10) |
| 0 | 0 | 1 | 1 | −3/sqrt (10) | 3/sqrt (10) |
| 0 | 1 | 0 | 0 | −1/sqrt (10) | −1/sqrt (10) |
| 0 | 1 | 0 | 1 | −1/sqrt (10) | −3/sqrt (10) |
| 0 | 1 | 1 | 0 | −3/sqrt (10) | −1/sqrt (10) |
| 0 | 1 | 1 | 1 | −3/sqrt (10) | −3/sqrt (10) |
| 1 | 0 | 0 | 0 | 1/sqrt (10) | 1/sqrt (10) |
| 1 | 0 | 0 | 1 | 1/sqrt (10) | 3/sqrt (10) |
| 1 | 0 | 1 | 0 | 3/sqrt (10) | 1/sqrt (10) |
| 1 | 0 | 1 | 1 | 3/sqrt (10) | 3/sqrt (10) |
| 1 | 1 | 0 | 0 | 1/sqrt (10) | −1/sqrt (10) |
| 1 | 1 | 0 | 1 | 1/sqrt (10) | −3/sqrt (10) |
| 1 | 1 | 1 | 0 | 3/sqrt (10) | −1/sqrt (10) |
| 1 | 1 | 1 | 1 | 3/sqrt (10) | −3/sqrt (10) |

TABLE 10

| Bit string | | | | I | Q |
|---|---|---|---|---|---|
| 0 | 0 | 0 | 0 | 1/sqrt (10) | −1/sqrt (10) |
| 0 | 0 | 0 | 1 | 1/sqrt (10) | −3/sqrt (10) |
| 0 | 0 | 1 | 0 | 3/sqrt (10) | −1/sqrt (10) |
| 0 | 0 | 1 | 1 | 3/sqrt (10) | −3/sqrt (10) |
| 0 | 1 | 0 | 0 | 1/sqrt (10) | 1/sqrt (10) |
| 0 | 1 | 0 | 1 | 1/sqrt (10) | 3/sqrt (10) |
| 0 | 1 | 1 | 0 | 3/sqrt (10) | 1/sqrt (10) |
| 0 | 1 | 1 | 1 | 3/sqrt (10) | 3/sqrt (10) |
| 1 | 0 | 0 | 0 | −1/sqrt (10) | −1/sqrt (10) |
| 1 | 0 | 0 | 1 | −1/sqrt (10) | −3/sqrt (10) |
| 1 | 0 | 1 | 0 | −3/sqrt (10) | −1/sqrt (10) |
| 1 | 0 | 1 | 1 | −3/sqrt (10) | −3/sqrt (10) |
| 1 | 1 | 0 | 0 | −1/sqrt (10) | 1/sqrt (10) |
| 1 | 1 | 0 | 1 | −1/sqrt (10) | 3/sqrt (10) |
| 1 | 1 | 1 | 0 | −3/sqrt (10) | 1/sqrt (10) |
| 1 | 1 | 1 | 1 | −3/sqrt (10) | 3/sqrt (10) |

TABLE 11

| Bit string | | | | I | Q |
|---|---|---|---|---|---|
| 0 | 0 | 0 | 0 | −1/sqrt (10) | −1/sqrt (10) |
| 0 | 0 | 0 | 1 | −1/sqrt (10) | −3/sqrt (10) |
| 0 | 0 | 1 | 0 | −3/sqrt (10) | −1/sqrt (10) |
| 0 | 0 | 1 | 1 | −3/sqrt (10) | −3/sqrt (10) |
| 0 | 1 | 0 | 0 | −1/sqrt (10) | 1/sqrt (10) |
| 0 | 1 | 0 | 1 | −1/sqrt (10) | 3/sqrt (10) |
| 0 | 1 | 1 | 0 | −3/sqrt (10) | 1/sqrt (10) |
| 0 | 1 | 1 | 1 | −3/sqrt (10) | 3/sqrt (10) |
| 1 | 0 | 0 | 0 | 1/sqrt (10) | −1/sqrt (10) |
| 1 | 0 | 0 | 1 | 1/sqrt (10) | −3/sqrt (10) |
| 1 | 0 | 1 | 0 | 3/sqrt (10) | −1/sqrt (10) |
| 1 | 0 | 1 | 1 | 3/sqrt (10) | −3/sqrt (10) |
| 1 | 1 | 0 | 0 | 1/sqrt (10) | 1/sqrt (10) |
| 1 | 1 | 0 | 1 | 1/sqrt (10) | 3/sqrt (10) |
| 1 | 1 | 1 | 0 | 3/sqrt (10) | 1/sqrt (10) |
| 1 | 1 | 1 | 1 | 3/sqrt (10) | 3/sqrt (10) |

Further, Table 12 to Table 15 below show correspondence relations between the bit strings and coordinates of the first constellation and the second constellation on the IQ plane in the case of 64QAM. Table 12 shows a correspondence relation in the first constellation and the second constellation which is not inverted. Table 13 shows a correspondence relation in the second constellation obtained by inverting the first constellation around the Q axis. Table 14 shows a correspondence relation in the second constellation obtained by inverting the first constellation around the I axis. Table 15 shows a correspondence relation in the second constellation obtained by inverting the first constellation around the I axis and the Q axis.

TABLE 12

| Bit string | | | | | | I | Q | Bit string | | | | | | I | Q |
|---|---|---|---|---|---|---|---|---|---|---|---|---|---|---|---|
| 0 | 0 | 0 | 0 | 0 | 0 | 3/sqrt(42) | 3/sqrt(42) | 1 | 0 | 0 | 0 | 0 | 0 | −3/sqrt(42) | 3/sqrt(42) |
| 0 | 0 | 0 | 0 | 0 | 1 | 3/sqrt(42) | 1/sqrt(42) | 1 | 0 | 0 | 0 | 0 | 1 | −3/sqrt(42) | 1/sqrt(42) |
| 0 | 0 | 0 | 0 | 1 | 0 | 1/sqrt(42) | 3/sqrt(42) | 1 | 0 | 0 | 0 | 1 | 0 | −1/sqrt(42) | 3/sqrt(42) |
| 0 | 0 | 0 | 0 | 1 | 1 | 1/sqrt(42) | 1/sqrt(42) | 1 | 0 | 0 | 0 | 1 | 1 | −1/sqrt(42) | 1/sqrt(42) |
| 0 | 0 | 0 | 1 | 0 | 0 | 3/sqrt(42) | 5/sqrt(42) | 1 | 0 | 0 | 1 | 0 | 0 | −3/sqrt(42) | 5/sqrt(42) |
| 0 | 0 | 0 | 1 | 0 | 1 | 3/sqrt(42) | 7/sqrt(42) | 1 | 0 | 0 | 1 | 0 | 1 | −3/sqrt(42) | 7/sqrt(42) |
| 0 | 0 | 0 | 1 | 1 | 0 | 1/sqrt(42) | 5/sqrt(42) | 1 | 0 | 0 | 1 | 1 | 0 | −1/sqrt(42) | 5/sqrt(42) |
| 0 | 0 | 0 | 1 | 1 | 1 | 1/sqrt(42) | 7/sqrt(42) | 1 | 0 | 0 | 1 | 1 | 1 | −1/sqrt(42) | 7/sqrt(42) |
| 0 | 0 | 1 | 0 | 0 | 0 | 5/sqrt(42) | 3/sqrt(42) | 1 | 0 | 1 | 0 | 0 | 0 | −5/sqrt(42) | 3/sqrt(42) |
| 0 | 0 | 1 | 0 | 0 | 1 | 5/sqrt(42) | 1/sqrt(42) | 1 | 0 | 1 | 0 | 0 | 1 | −5/sqrt(42) | 1/sqrt(42) |
| 0 | 0 | 1 | 0 | 1 | 0 | 7/sqrt(42) | 3/sqrt(42) | 1 | 0 | 1 | 0 | 1 | 0 | −7/sqrt(42) | 3/sqrt(42) |
| 0 | 0 | 1 | 0 | 1 | 1 | 7/sqrt(42) | 1/sqrt(42) | 1 | 0 | 1 | 0 | 1 | 1 | −7/sqrt(42) | 1/sqrt(42) |
| 0 | 0 | 1 | 1 | 0 | 0 | 5/sqrt(42) | 5/sqrt(42) | 1 | 0 | 1 | 1 | 0 | 0 | −5/sqrt(42) | 5/sqrt(42) |
| 0 | 0 | 1 | 1 | 0 | 1 | 5/sqrt(42) | 7/sqrt(42) | 1 | 0 | 1 | 1 | 0 | 1 | −5/sqrt(42) | 7/sqrt(42) |
| 0 | 0 | 1 | 1 | 1 | 0 | 7/sqrt(42) | 5/sqrt(42) | 1 | 0 | 1 | 1 | 1 | 0 | −7/sqrt(42) | 5/sqrt(42) |
| 0 | 0 | 1 | 1 | 1 | 1 | 7/sqrt(42) | 7/sqrt(42) | 1 | 0 | 1 | 1 | 1 | 1 | −7/sqrt(42) | 7/sqrt(42) |
| 0 | 1 | 0 | 0 | 0 | 0 | 3/sqrt(42) | −3/sqrt(42) | 1 | 1 | 0 | 0 | 0 | 0 | −3/sqrt(42) | −3/sqrt(42) |
| 0 | 1 | 0 | 0 | 0 | 1 | 3/sqrt(42) | −1/sqrt(42) | 1 | 1 | 0 | 0 | 0 | 1 | −3/sqrt(42) | −1/sqrt(42) |
| 0 | 1 | 0 | 0 | 1 | 0 | 1/sqrt(42) | −3/sqrt(42) | 1 | 1 | 0 | 0 | 1 | 0 | −1/sqrt(42) | −3/sqrt(42) |
| 0 | 1 | 0 | 0 | 1 | 1 | 1/sqrt(42) | −1/sqrt(42) | 1 | 1 | 0 | 0 | 1 | 1 | −1/sqrt(42) | −1/sqrt(42) |

TABLE 12-continued

| Bit string | | | | | | I | Q | Bit string | | | | | | I | Q |
|---|---|---|---|---|---|---|---|---|---|---|---|---|---|---|---|
| 0 | 1 | 0 | 1 | 0 | 0 | 3/sqrt(42) | −5/sqrt(42) | 1 | 1 | 0 | 1 | 0 | 0 | −3/sqrt(42) | −5/sqrt(42) |
| 0 | 1 | 0 | 1 | 0 | 1 | 3/sqrt(42) | −7/sqrt(42) | 1 | 1 | 0 | 1 | 0 | 1 | −3/sqrt(42) | −7/sqrt(42) |
| 0 | 1 | 0 | 1 | 1 | 0 | 1/sqrt(42) | −5/sqrt(42) | 1 | 1 | 0 | 1 | 1 | 0 | −1/sqrt(42) | −5/sqrt(42) |
| 0 | 1 | 0 | 1 | 1 | 1 | 1/sqrt(42) | −7/sqrt(42) | 1 | 1 | 0 | 1 | 1 | 1 | −1/sqrt(42) | −7/sqrt(42) |
| 0 | 1 | 1 | 0 | 0 | 0 | 5/sqrt(42) | −3/sqrt(42) | 1 | 1 | 1 | 0 | 0 | 0 | −5/sqrt(42) | −3/sqrt(42) |
| 0 | 1 | 1 | 0 | 0 | 1 | 5/sqrt(42) | −1/sqrt(42) | 1 | 1 | 1 | 0 | 0 | 1 | −5/sqrt(42) | −1/sqrt(42) |
| 0 | 1 | 1 | 0 | 1 | 0 | 7/sqrt(42) | −3/sqrt(42) | 1 | 1 | 1 | 0 | 1 | 0 | −7/sqrt(42) | −3/sqrt(42) |
| 0 | 1 | 1 | 0 | 1 | 1 | 7/sqrt(42) | −1/sqrt(42) | 1 | 1 | 1 | 0 | 1 | 1 | −7/sqrt(42) | −1/sqrt(42) |
| 0 | 1 | 1 | 1 | 0 | 0 | 5/sqrt(42) | −5/sqrt(42) | 1 | 1 | 1 | 1 | 0 | 0 | −5/sqrt(42) | −5/sqrt(42) |
| 0 | 1 | 1 | 1 | 0 | 1 | 5/sqrt(42) | −7/sqrt(42) | 1 | 1 | 1 | 1 | 0 | 1 | −5/sqrt(42) | −7/sqrt(42) |
| 0 | 1 | 1 | 1 | 1 | 0 | 7/sqrt(42) | −5/sqrt(42) | 1 | 1 | 1 | 1 | 1 | 0 | −7/sqrt(42) | −5/sqrt(42) |
| 0 | 1 | 1 | 1 | 1 | 1 | 7/sqrt(42) | −7/sqrt(42) | 1 | 1 | 1 | 1 | 1 | 1 | −7/sqrt(42) | −7/sqrt(42) |

TABLE 13

| Bit string | | | | | | I | Q | Bit string | | | | | | I | Q |
|---|---|---|---|---|---|---|---|---|---|---|---|---|---|---|---|
| 0 | 0 | 0 | 0 | 0 | 0 | −3/sqrt(42) | 3/sqrt(42) | 1 | 0 | 0 | 0 | 0 | 0 | 3/sqrt(42) | 3/sqrt(42) |
| 0 | 0 | 0 | 0 | 0 | 1 | −3/sqrt(42) | 1/sqrt(42) | 1 | 0 | 0 | 0 | 0 | 1 | 3/sqrt(42) | 1/sqrt(42) |
| 0 | 0 | 0 | 0 | 1 | 0 | −1/sqrt(42) | 3/sqrt(42) | 1 | 0 | 0 | 0 | 1 | 0 | 1/sqrt(42) | 3/sqrt(42) |
| 0 | 0 | 0 | 0 | 1 | 1 | −1/sqrt(42) | 1/sqrt(42) | 1 | 0 | 0 | 0 | 1 | 1 | 1/sqrt(42) | 1/sqrt(42) |
| 0 | 0 | 0 | 1 | 0 | 0 | −3/sqrt(42) | 5/sqrt(42) | 1 | 0 | 0 | 1 | 0 | 0 | 3/sqrt(42) | 5/sqrt(42) |
| 0 | 0 | 0 | 1 | 0 | 1 | −3/sqrt(42) | 7/sqrt(42) | 1 | 0 | 0 | 1 | 0 | 1 | 3/sqrt(42) | 7/sqrt(42) |
| 0 | 0 | 0 | 1 | 1 | 0 | −1/sqrt(42) | 5/sqrt(42) | 1 | 0 | 0 | 1 | 1 | 0 | 1/sqrt(42) | 5/sqrt(42) |
| 0 | 0 | 0 | 1 | 1 | 1 | −1/sqrt(42) | 7/sqrt(42) | 1 | 0 | 0 | 1 | 1 | 1 | 1/sqrt(42) | 7/sqrt(42) |
| 0 | 0 | 1 | 0 | 0 | 0 | −5/sqrt(42) | 3/sqrt(42) | 1 | 0 | 1 | 0 | 0 | 0 | 5/sqrt(42) | 3/sqrt(42) |
| 0 | 0 | 1 | 0 | 0 | 1 | −5/sqrt(42) | 1/sqrt(42) | 1 | 0 | 1 | 0 | 0 | 1 | 5/sqrt(42) | 1/sqrt(42) |
| 0 | 0 | 1 | 0 | 1 | 0 | −7/sqrt(42) | 3/sqrt(42) | 1 | 0 | 1 | 0 | 1 | 0 | 7/sqrt(42) | 3/sqrt(42) |
| 0 | 0 | 1 | 0 | 1 | 1 | −7/sqrt(42) | 1/sqrt(42) | 1 | 0 | 1 | 0 | 1 | 1 | 7/sqrt(42) | 1/sqrt(42) |
| 0 | 0 | 1 | 1 | 0 | 0 | −5/sqrt(42) | 5/sqrt(42) | 1 | 0 | 1 | 1 | 0 | 0 | 5/sqrt(42) | 5/sqrt(42) |
| 0 | 0 | 1 | 1 | 0 | 1 | −5/sqrt(42) | 7/sqrt(42) | 1 | 0 | 1 | 1 | 0 | 1 | 5/sqrt(42) | 7/sqrt(42) |
| 0 | 0 | 1 | 1 | 1 | 0 | −7/sqrt(42) | 5/sqrt(42) | 1 | 0 | 1 | 1 | 1 | 0 | 7/sqrt(42) | 5/sqrt(42) |
| 0 | 0 | 1 | 1 | 1 | 1 | −7/sqrt(42) | 7/sqrt(42) | 1 | 0 | 1 | 1 | 1 | 1 | 7/sqrt(42) | 7/sqrt(42) |
| 0 | 1 | 0 | 0 | 0 | 0 | −3/sqrt(42) | −3/sqrt(42) | 1 | 1 | 0 | 0 | 0 | 0 | 3/sqrt(42) | −3/sqrt(42) |
| 0 | 1 | 0 | 0 | 0 | 1 | −3/sqrt(42) | −1/sqrt(42) | 1 | 1 | 0 | 0 | 0 | 1 | 3/sqrt(42) | −1/sqrt(42) |
| 0 | 1 | 0 | 0 | 1 | 0 | −1/sqrt(42) | −3/sqrt(42) | 1 | 1 | 0 | 0 | 1 | 0 | 1/sqrt(42) | −3/sqrt(42) |
| 0 | 1 | 0 | 0 | 1 | 1 | −1/sqrt(42) | −1/sqrt(42) | 1 | 1 | 0 | 0 | 1 | 1 | 1/sqrt(42) | −1/sqrt(42) |
| 0 | 1 | 0 | 1 | 0 | 0 | −3/sqrt(42) | −5/sqrt(42) | 1 | 1 | 0 | 1 | 0 | 0 | 3/sqrt(42) | −5/sqrt(42) |
| 0 | 1 | 0 | 1 | 0 | 1 | −3/sqrt(42) | −7/sqrt(42) | 1 | 1 | 0 | 1 | 0 | 1 | 3/sqrt(42) | −7/sqrt(42) |
| 0 | 1 | 0 | 1 | 1 | 0 | −1/sqrt(42) | −5/sqrt(42) | 1 | 1 | 0 | 1 | 1 | 0 | 1/sqrt(42) | −5/sqrt(42) |
| 0 | 1 | 0 | 1 | 1 | 1 | −1/sqrt(42) | −7/sqrt(42) | 1 | 1 | 0 | 1 | 1 | 1 | 1/sqrt(42) | −7/sqrt(42) |
| 0 | 1 | 1 | 0 | 0 | 0 | −5/sqrt(42) | −3/sqrt(42) | 1 | 1 | 1 | 0 | 0 | 0 | 5/sqrt(42) | −3/sqrt(42) |
| 0 | 1 | 1 | 0 | 0 | 1 | −5/sqrt(42) | −1/sqrt(42) | 1 | 1 | 1 | 0 | 0 | 1 | 5/sqrt(42) | −1/sqrt(42) |
| 0 | 1 | 1 | 0 | 1 | 0 | −7/sqrt(42) | −3/sqrt(42) | 1 | 1 | 1 | 0 | 1 | 0 | 7/sqrt(42) | −3/sqrt(42) |
| 0 | 1 | 1 | 0 | 1 | 1 | −7/sqrt(42) | −1/sqrt(42) | 1 | 1 | 1 | 0 | 1 | 1 | 7/sqrt(42) | −1/sqrt(42) |
| 0 | 1 | 1 | 1 | 0 | 0 | −5/sqrt(42) | −5/sqrt(42) | 1 | 1 | 1 | 1 | 0 | 0 | 5/sqrt(42) | −5/sqrt(42) |
| 0 | 1 | 1 | 1 | 0 | 1 | −5/sqrt(42) | −7/sqrt(42) | 1 | 1 | 1 | 1 | 0 | 1 | 5/sqrt(42) | −7/sqrt(42) |
| 0 | 1 | 1 | 1 | 1 | 0 | −7/sqrt(42) | −5/sqrt(42) | 1 | 1 | 1 | t | 1 | 0 | 7/sqrt(42) | −5/sqrt(42) |
| 0 | 1 | 1 | 1 | 1 | 1 | −7/sqrt(42) | −7/sqrt(42) | 1 | 1 | 1 | 1 | 1 | 0 | 7/sqrt(42) | −7/sqrt(42) |

TABLE 14

| Bit string | | | | | | I | Q | Bit string | | | | | | I | Q |
|---|---|---|---|---|---|---|---|---|---|---|---|---|---|---|---|
| 0 | 0 | 0 | 0 | 0 | 0 | 3/sqrt(42) | −3/sqrt(42) | 1 | 0 | 0 | 0 | 0 | 0 | −3/sqrt(42) | −3/sqrt(42) |
| 0 | 0 | 0 | 0 | 0 | 1 | 3/sqrt(42) | −1/sqrt(42) | 1 | 0 | 0 | 0 | 0 | 1 | −3/sqrt(42) | −1/sqrt(42) |
| 0 | 0 | 0 | 0 | 1 | 0 | 1/sqrt(42) | −3/sqrt(42) | 1 | 0 | 0 | 0 | 1 | 0 | −1/sqrt(42) | −3/sqrt(42) |
| 0 | 0 | 0 | 0 | 1 | 1 | 1/sqrt(42) | −1/sqrt(42) | 1 | 0 | 0 | 0 | 1 | 1 | 1/sqrt(42) | −1/sqrt(42) |
| 0 | 0 | 0 | 1 | 0 | 0 | 3/sqrt(42) | −5/sqrt(42) | 1 | 0 | 0 | 1 | 0 | 0 | −3/sqrt(42) | −5/sqrt(42) |
| 0 | 0 | 0 | 1 | 0 | 1 | 3/sqrt(42) | −7/sqrt(42) | 1 | 0 | 0 | 1 | 0 | 1 | 3/sqrt(42) | −7/sqrt(42) |
| 0 | 0 | 0 | 1 | 1 | 0 | 1/sqrt(42) | −5/sqrt(42) | 1 | 0 | 0 | 1 | 1 | 0 | −1/sqrt(42) | −5/sqrt(42) |
| 0 | 0 | 0 | 1 | 1 | 1 | 1/sqrt(42) | −7/sqrt(42) | 1 | 0 | 0 | 1 | 1 | 1 | −1/sqrt(42) | −7/sqrt(42) |
| 0 | 0 | 1 | 0 | 0 | 0 | 5/sqrt(42) | −3/sqrt(42) | 1 | 0 | 1 | 0 | 0 | 0 | −5/sqrt(42) | −3/sqrt(42) |
| 0 | 0 | 1 | 0 | 0 | 1 | 5/sqrt(42) | −1/sqrt(42) | 1 | 0 | 1 | 0 | 0 | 1 | −5/sqrt(42) | −1/sqrt(42) |
| 0 | 0 | 1 | 0 | 1 | 0 | 7/sqrt(42) | −3/sqrt(42) | 1 | 0 | 1 | 0 | 1 | 0 | −7/sqrt(42) | −3/sqrt(42) |
| 0 | 0 | 1 | 0 | 1 | 1 | 7/sqrt(42) | −1/sqrt(42) | 1 | 0 | 1 | 0 | 1 | 1 | −7/sqrt(42) | −1/sqrt(42) |
| 0 | 0 | 1 | 1 | 0 | 0 | 5/sqrt(42) | −5/sqrt(42) | 1 | 0 | 1 | 1 | 0 | 0 | −5/sqrt(42) | −5/sqrt(42) |
| 0 | 0 | 1 | 1 | 0 | 1 | 5/sqrt(42) | −7/sqrt(42) | 1 | 0 | 1 | 1 | 0 | 1 | −5/sqrt(42) | −7/sqrt(42) |
| 0 | 0 | 1 | 1 | 1 | 0 | 7/sqrt(42) | −5/sqrt(42) | 1 | 0 | 1 | 1 | 1 | 0 | −7/sqrt(42) | −5/sqrt(42) |

TABLE 14-continued

| Bit string | | | | | | I | Q | Bit string | | | | | | I | Q |
|---|---|---|---|---|---|---|---|---|---|---|---|---|---|---|---|
| 0 | 0 | 1 | 1 | 1 | 1 | 7/sqrt(42) | −7/sqrt(42) | 1 | 0 | 1 | 1 | 1 | 1 | −7/sqrt(42) | −7/sqrt(42) |
| 0 | 1 | 0 | 0 | 0 | 0 | 3/sqrt(42) | 3/sqrt(42) | 1 | 1 | 0 | 0 | 0 | 0 | −3/sqrt(42) | 3/sqrt(42) |
| 0 | 1 | 0 | 0 | 0 | 1 | 3/sqrt(42) | 1/sqrt(42) | 1 | 1 | 0 | 0 | 0 | 1 | −3/sqrt(42) | 1/sqrt(42) |
| 0 | 1 | 0 | 0 | 1 | 0 | 1/sqrt(42) | 3/sqrt(42) | 1 | 1 | 0 | 0 | 1 | 0 | −1/sqrt(42) | 3/sqrt(42) |
| 0 | 1 | 0 | 0 | 1 | 1 | 1/sqrt(42) | 1/sqrt(42) | 1 | 1 | 0 | 0 | 1 | 1 | −1/sqrt(42) | 1/sqrt(42) |
| 0 | 1 | 0 | 1 | 0 | 0 | 3/sqrt(42) | 5/sqrt(42) | 1 | 1 | 0 | 1 | 0 | 0 | −3/sqrt(42) | 5/sqrt(42) |
| 0 | 1 | 0 | 1 | 0 | 1 | 3/sqrt(42) | 7/sqrt(42) | 1 | 1 | 0 | 1 | 0 | 1 | −3/sqrt(42) | 7/sqrt(42) |
| 0 | 1 | 0 | 1 | 1 | 0 | 1/sqrt(42) | 5/sqrt(42) | 1 | 1 | 0 | 1 | 1 | 0 | −1/sqrt(42) | 5/sqrt(42) |
| 0 | 1 | 0 | 1 | 1 | 1 | 1/sqrt(42) | 7/sqrt(42) | 1 | 1 | 0 | 1 | 1 | 1 | −1/sqrt(42) | 7/sqrt(42) |
| 0 | 1 | 1 | 0 | 0 | 0 | 5/sqrt(42) | 3/sqrt(42) | 1 | 1 | 1 | 0 | 0 | 0 | −5/sqrt(42) | 3/sqrt(42) |
| 0 | 1 | 1 | 0 | 0 | 1 | 5/sqrt(42) | 1/sqrt(42) | 1 | 1 | 1 | 0 | 0 | 1 | −5/sqrt(42) | 1/sqrt(42) |
| 0 | 1 | 1 | 0 | 1 | 0 | 7/sqrt(42) | 3/sqrt(42) | 1 | 1 | 1 | 0 | 1 | 0 | −7/sqrt(42) | 3/sqrt(42) |
| 0 | 1 | 1 | 0 | 1 | 1 | 7/sqrt(42) | 1/sqrt(42) | 1 | 1 | 1 | 0 | 1 | 1 | −7/sqrt(42) | 1/sqrt(42) |
| 0 | 1 | 1 | 1 | 0 | 0 | 5/sqrt(42) | 5/sqrt(42) | 1 | 1 | 1 | 1 | 0 | 0 | −5/sqrt(42) | 5/sqrt(42) |
| 0 | 1 | 1 | 1 | 0 | 1 | 5/sqrt(42) | 7/sqrt(42) | 1 | 1 | 1 | 1 | 0 | 1 | −5/sqrt(42) | 7/sqrt(42) |
| 0 | 1 | 1 | 1 | 1 | 0 | 7/sqrt(42) | 5/sqrt(42) | 1 | 1 | 1 | 1 | 1 | 0 | −7/sqrt(42) | 5/sqrt(42) |
| 0 | 1 | 1 | 1 | 1 | 1 | 7/sqrt(42) | 7/sqrt(42) | 1 | 1 | 1 | 1 | 1 | 1 | −7/sqrt(42) | 7/sqrt(42) |

TABLE 15

| Bit string | | | | | | I | Q | Bit string | | | | | | I | Q |
|---|---|---|---|---|---|---|---|---|---|---|---|---|---|---|---|
| 0 | 0 | 0 | 0 | 0 | 0 | −3/sqrt(42) | −3/sqrt(42) | 1 | 0 | 0 | 0 | 0 | 0 | 3/sqrt(42) | −3/sqrt(42) |
| 0 | 0 | 0 | 0 | 0 | 1 | −3/sqrt(42) | −1/sqrt(42) | 1 | 0 | 0 | 0 | 0 | 1 | 3/sqrt(42) | −1/sqrt(42) |
| 0 | 0 | 0 | 0 | 1 | 0 | −1/sqrt(42) | −3/sqrt(42) | 1 | 0 | 0 | 0 | 1 | 0 | 1/sqrt(42) | −3/sqrt(42) |
| 0 | 0 | 0 | 0 | 1 | 1 | −1/sqrt(42) | −1/sqrt(42) | 1 | 0 | 0 | 0 | 1 | 1 | 1/sqrt(42) | −1/sqrt(42) |
| 0 | 0 | 0 | 1 | 0 | 0 | −3/sqrt(42) | −5/sqrt(42) | 1 | 0 | 0 | 1 | 0 | 0 | 3/sqrt(42) | −5/sqrt(42) |
| 0 | 0 | 0 | 1 | 0 | 1 | −3/sqrt(42) | −7/sqrt(42) | 1 | 0 | 0 | 1 | 0 | 1 | 3/sqrt(42) | −7/sqrt(42) |
| 0 | 0 | 0 | 1 | 1 | 0 | −1/sqrt(42) | −5/sqrt(42) | 1 | 0 | 0 | 1 | 1 | 0 | 1/sqrt(42) | −5/sqrt(42) |
| 0 | 0 | 0 | 1 | 1 | 1 | −1/sqrt(42) | −7/sqrt(42) | 1 | 0 | 0 | 1 | 1 | 1 | 1/sqrt(42) | −7/sqrt(42) |
| 0 | 0 | 1 | 0 | 0 | 0 | −5/sqrt(42) | −3/sqrt(42) | 1 | 0 | 1 | 0 | 0 | 0 | 5/sqrt(42) | −3/sqrt(42) |
| 0 | 0 | 1 | 0 | 0 | 1 | −5/sqrt(42) | −1/sqrt(42) | 1 | 0 | 1 | 0 | 0 | 1 | 5/sqrt(42) | −1/sqrt(42) |
| 0 | 0 | 1 | 0 | 1 | 0 | −7/sqrt(42) | −3/sqrt(42) | 1 | 0 | 1 | 0 | 1 | 0 | 7/sqrt(42) | −3/sqrt(42) |
| 0 | 0 | 1 | 0 | 1 | 1 | −7/sqrt(42) | −1/sqrt(42) | 1 | 0 | 1 | 0 | 1 | 1 | 7/sqrt(42) | −1/sqrt(42) |
| 0 | 0 | 1 | 1 | 0 | 0 | −5/sqrt(42) | −5/sqrt(42) | 1 | 0 | 1 | 1 | 0 | 0 | 5/sqrt(42) | −5/sqrt(42) |
| 0 | 0 | 1 | 1 | 0 | 1 | −5/sqrt(42) | −7/sqrt(42) | 1 | 0 | 1 | 1 | 0 | 1 | 5/sqrt(42) | −7/sqrt(42) |
| 0 | 0 | 1 | 1 | 1 | 0 | −7/sqrt(42) | −5/sqrt(42) | 1 | 0 | 1 | 1 | 1 | 0 | 7/sqrt(42) | −5/sqrt(42) |
| 0 | 0 | 1 | 1 | 1 | 1 | −7/sqrt(42) | −7/sqrt(42) | 1 | 0 | 1 | 1 | 1 | 1 | 7/sqrt(42) | −7/sqrt(42) |
| 0 | 1 | 0 | 0 | 0 | 0 | −3/sqrt(42) | 3/sqrt(42) | 1 | 1 | 0 | 0 | 0 | 0 | 3/sqrt(42) | 3/sqrt(42) |
| 0 | 1 | 0 | 0 | 0 | 1 | −3/sqrt(42) | 1/sqrt(42) | 1 | 1 | 0 | 0 | 0 | 1 | 3/sqrt(42) | 1/sqrt(42) |
| 0 | 1 | 0 | 0 | 1 | 0 | −1/sqrt(42) | 3/sqrt(42) | 1 | 1 | 0 | 0 | 1 | 0 | 1/sqrt(42) | 3/sqrt(42) |
| 0 | 1 | 0 | 0 | 1 | 1 | −1/sqrt(42) | 1/sqrt(42) | 1 | 1 | 0 | 0 | 1 | 1 | 1/sqrt(42) | 1/sqrt(42) |
| 0 | 1 | 0 | 1 | 0 | 0 | −3/sqrt(42) | 5/sqrt(42) | 1 | 1 | 0 | 1 | 0 | 0 | 3/sqrt(42) | 5/sqrt(42) |
| 0 | 1 | 0 | 1 | 0 | 1 | −3/sqrt(42) | 7/sqrt(42) | 1 | 1 | 0 | 1 | 0 | 1 | 3/sqrt(42) | 7/sqrt(42) |
| 0 | 1 | 0 | 1 | 1 | 0 | −1/sqrt(42) | 5/sqrt(42) | 1 | 1 | 0 | 1 | 1 | 0 | 1/sqrt(42) | 5/sqrt(42) |
| 0 | 1 | 0 | 1 | 1 | 1 | −1/sqrt(42) | 7/sqrt(42) | 1 | 1 | 0 | 1 | 1 | 1 | 1/sqrt(42) | 7/sqrt(42) |
| 0 | 1 | 1 | 0 | 0 | 0 | −5/sqrt(42) | 3/sqrt(42) | 1 | 1 | 1 | 0 | 0 | 0 | 5/sqrt(42) | 3/sqrt(42) |
| 0 | 1 | 1 | 0 | 0 | 1 | −5/sqrt(42) | 1/sqrt(42) | 1 | 1 | 1 | 0 | 0 | 1 | 5/sqrt(42) | 1/sqrt(42) |
| 0 | 1 | 1 | 0 | 1 | 0 | −7/sqrt(42) | 3/sqrt(42) | 1 | 1 | 1 | 0 | 1 | 0 | 7/sqrt(42) | 3/sqrt(42) |
| 0 | 1 | 1 | 0 | 1 | 1 | −7/sqrt(42) | 1/sqrt(42) | 1 | 1 | 1 | 0 | 1 | 1 | 7/sqrt(42) | 1/sqrt(42) |
| 0 | 1 | 1 | 1 | 0 | 0 | −5/sqrt(42) | 5/sqrt(42) | 1 | 1 | 1 | 1 | 0 | 0 | 5/sqrt(42) | 5/sqrt(42) |
| 0 | 1 | 1 | 1 | 0 | 1 | −5/sqrt(42) | 7/sqrt(42) | 1 | 1 | 1 | 1 | 0 | 1 | 5/sqrt(42) | 7/sqrt(42) |
| 0 | 1 | 1 | 1 | 1 | 0 | −7/sqrt(42) | 5/sqrt(42) | 1 | 1 | 1 | 1 | 1 | 0 | 7/sqrt(42) | 5/sqrt(42) |
| 0 | 1 | 1 | 1 | 1 | 1 | −7/sqrt(42) | 7/sqrt(42) | 1 | 1 | 1 | 1 | 1 | 1 | 7/sqrt(42) | 7/sqrt(42) |

(3) Determination Based on Signal Processing at Stage after Modulation

The base station 100 (for example, the transmission processing unit 153) determines whether or not the second constellation selected in the selection process is applied to the second bit string in accordance with content of signal processing at a stage after modulation (that is, the application of the first and second constellations). Accordingly, for example, in a case in which the gray mapping is not implemented although the second constellation selected in the selection process is applied, the selection process may be omitted. Further, in a case in which the second constellation selected in the selection process is determined not to be applied to the second bit string, for example, a default constellation (for example, a constellation identical to the first constellation) is applied.

For example, in a case in which the same transmission weighting is applied to both the transmission signal sequence of the first bit string and the transmission signal sequence of the second bit string or the transmission weighting is not applied to any of the transmission signal sequence of the first bit string and the transmission signal sequence of the second bit string, the base station 100 may apply the second constellation selected in the selection process to the second bit string. This is because, in a case in which different transmission weightings are applied, it is difficult to implement the gray mapping as will be described later in detail with reference to FIG. 20. Further, it is for backward compatibility. Further, as the transmission weighting, for example, precoding, beam-forming, or the like may be used, and a weighting is applied using a complex coefficient.

In addition to the transmission weighting, in a case in which the same transmission setting is applied to both the transmission signal sequence of the first bit string and the transmission signal sequence of the second bit string, the base station 100 may apply the second constellation selected in the selection process to the second bit string. This is because, in the case of the transmission setting other than the transmission weighting, it may be difficult to implement the gray mapping in a case in which the transmission settings are different from each other. Further, as the transmission setting, for example, a transmission mode or the like may be used. In other words, in a case in which the same transmission mode is applied to both transmission signal sequences, the base station 100 may apply the second constellation selected in the selection process to the second bit string, and the number of space multiplexings (that is, the number of spatial layers) in spatial multiplexing (spatial multiplexing, spatial division multiplexing, or the like) or space diversity (transmit diversity, space-time block/trellis coding, or space-frequency block/trellis coding) in MIMO, the number of transmission antennas, or the like may be used as the transmission setting. For example, in a case in which the spatial multiplexing process or the space diversity process of the same number of space multiplexings is applied to both transmission signal sequences, the base station 100 may apply the second constellation selected in the selection process to the second bit string. Further, in a case in which the same number of transmission antennas are used for both transmission signal sequences, the base station 100 may apply the second constellation selected in the selection process to the second bit string.

For example, the base station 100 may determine whether or not the second constellation selected in the selection process is applied to the second bit string in accordance with a channel used for transmission of the transmission signal sequence of the first bit string and the transmission signal sequence of the second bit string. Specifically, in a case in which both the transmission signal sequence of the first bit string and the transmission signal sequence of the second bit string are transmitted using a data channel, a shared channel, or a dedicated channel, the base station 100 may apply the second constellation selected in the selection process to the second bit string. This is because SPC multiplexing is basically considered not to be suitable for a channel which is received by a plurality of reception devices such as a control channel in terms of compatibility.

The same applies to a channel which is received by a plurality of reception devices such as a multicast channel or a broadcast channel. Therefore, the base station 100 may determine whether or not the second constellation selected in the selection process is applied to the second bit string in accordance with a destination of the transmission signal sequence of the first bit string and a destination of the transmission signal sequence of the second bit string. For example, in a case in which a destination of the transmission signal sequence of the first bit string and a destination of the transmission signal sequences of the second bit string are a single device (that is, unicast), the base station 100 may apply the second constellation selected in the selection process to the second bit string. Further, in a case in which the destination of the transmission signal sequence of the first bit string and the destination of the transmission signal sequence of the second bit string are different, the base station 100 may apply the second constellation selected in the selection process to the second bit string.

It will be appreciated that, in a case in which the destination of the transmission signal sequence of the first bit string and the destination of the transmission signal sequence of the second bit string are a plurality of devices (that is, multicast or broadcast), the base station 100 may apply the second constellation selected in the selection process to the second bit string. Further, in a case in which the destination of the transmission signal sequence of the first bit string is a plurality of devices, the base station 100 may apply the second constellation selected in the selection process to the second bit string regardless of the destination of the transmission signal sequence of the second bit string.

3.2. Flow of Process

Figure 10:
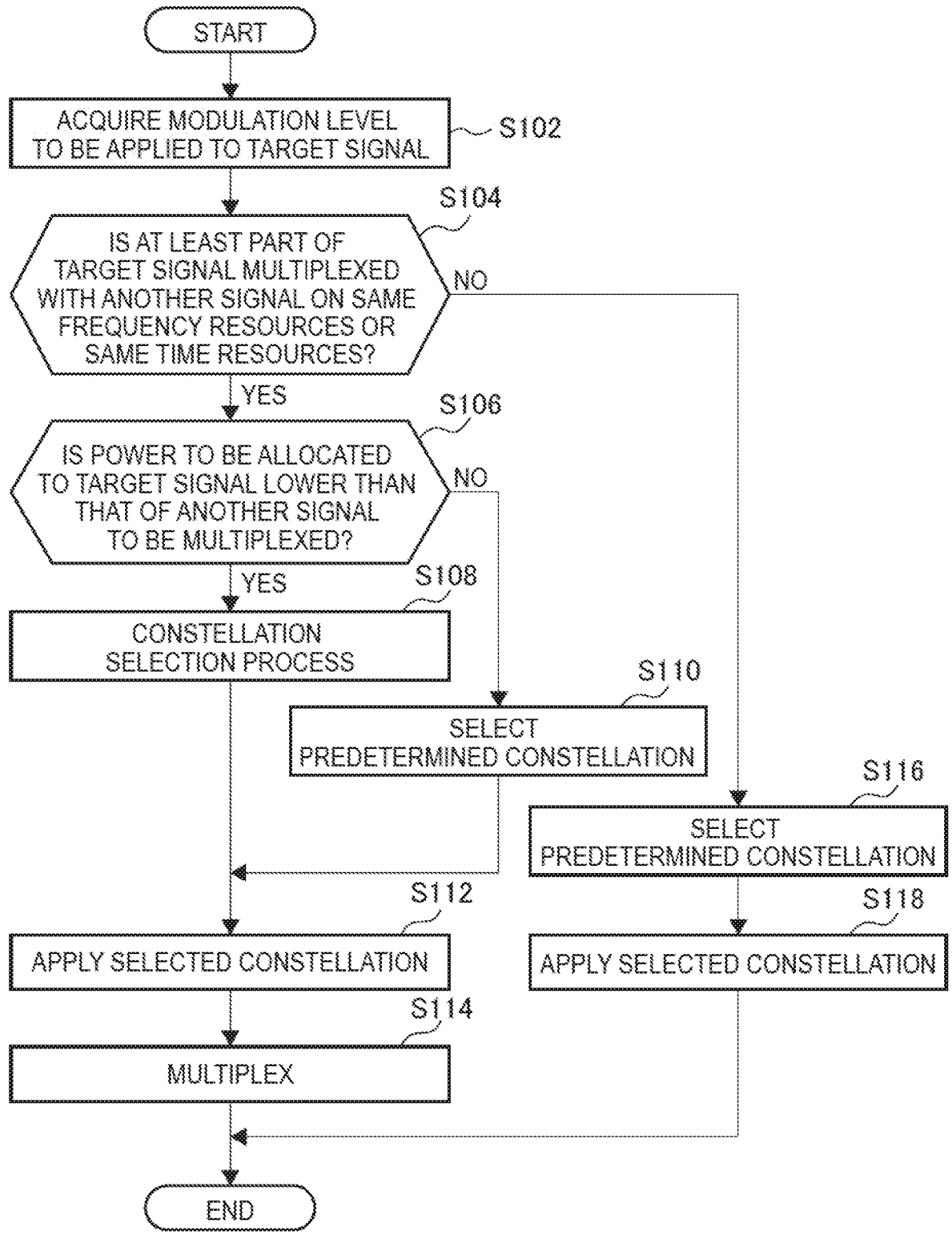
FIG. 10 is a flowchart illustrating an example of a flow of a multiplexing process executed in the base station according to the embodiment.

FIG. 10 is a flowchart illustrating an example of a flow of a multiplexing process executed in the base station 100 according to the present embodiment.

As illustrated in FIG. 10, first, the base station 100 (for example, the selection unit 151) acquires a modulation level to be applied to a target signal (step S102). Here, the modulation level corresponds to each modulation scheme such as BPSK, QPSK, 16QAM, or 64QAM. Further, the modulation level may be the number of bits per symbol (1 bit/symbol in the case of BPSK, 2 bits/symbol in the case of QPSK, 4 bits/symbol in the case of 16QAM, and 6 bits/symbol in the case of 64QAM).

Then, the base station 100 (for example, the selection unit 151) determines whether or not at least a part of the target signal is multiplexed with another signal on the same frequency resources or the same time resources (step S104). Further, in a case in which at least a part of the target signal is determined to be multiplexed with another signal on the same frequency resources or the same time resources (YES in step S104), the base station 100 (for example, the selection unit 151) determines whether or not the power to be allocated to the target signal is lower than that of another signal to be multiplexed (Step S106).

In a case in which the power to be allocated to the target signal is determined to be lower (YES in step S106), the base station 100 (for example, the selection unit 151) performs the constellation selection process (step S108). Specifically, the base station 100 selects the second constellation corresponding to the symbol position of the first bit string in the first constellation applied to the bit string of another signal to be multiplexed (that is, the first transmission signal sequence). On the other hand, in a case in which the power to be allocated to the target signal is determined to be higher (NO in step S106), the base station 100 (for example, the selection unit 151) selects a predetermined constellation (step S110). For example, the base station 100 (the selection unit 151) selects a default constellation (for example, a constellation identical to the first constellation).

Then, the base station 100 (for example, the transmission processing unit 153) applies the selected constellation to the target signal (that is, the second transmission signal sequence) (step S112). Thereafter, the base station 100 (for example, the transmission processing unit 153) multiplexes the modulated target signal with another signal (step S114).

On the other hand, in a case in which at least a part of the target signal is determined not to be multiplexed with other signals on the same frequency resources or the same time resources (NO in step S104), the base station 100 (for example, the selection unit 151) selects a predetermined constellation (step S116). For example, the base station 100

(the selection unit 151) selects a default constellation (for example, a constellation identical to the first constellation). Then, the base station 100 (for example, the transmission processing unit 153) applies the selected constellation to the target signal (that is, the second transmission signal sequence) (step S118).

Then, the constellation applying process ends.

Figure 11:
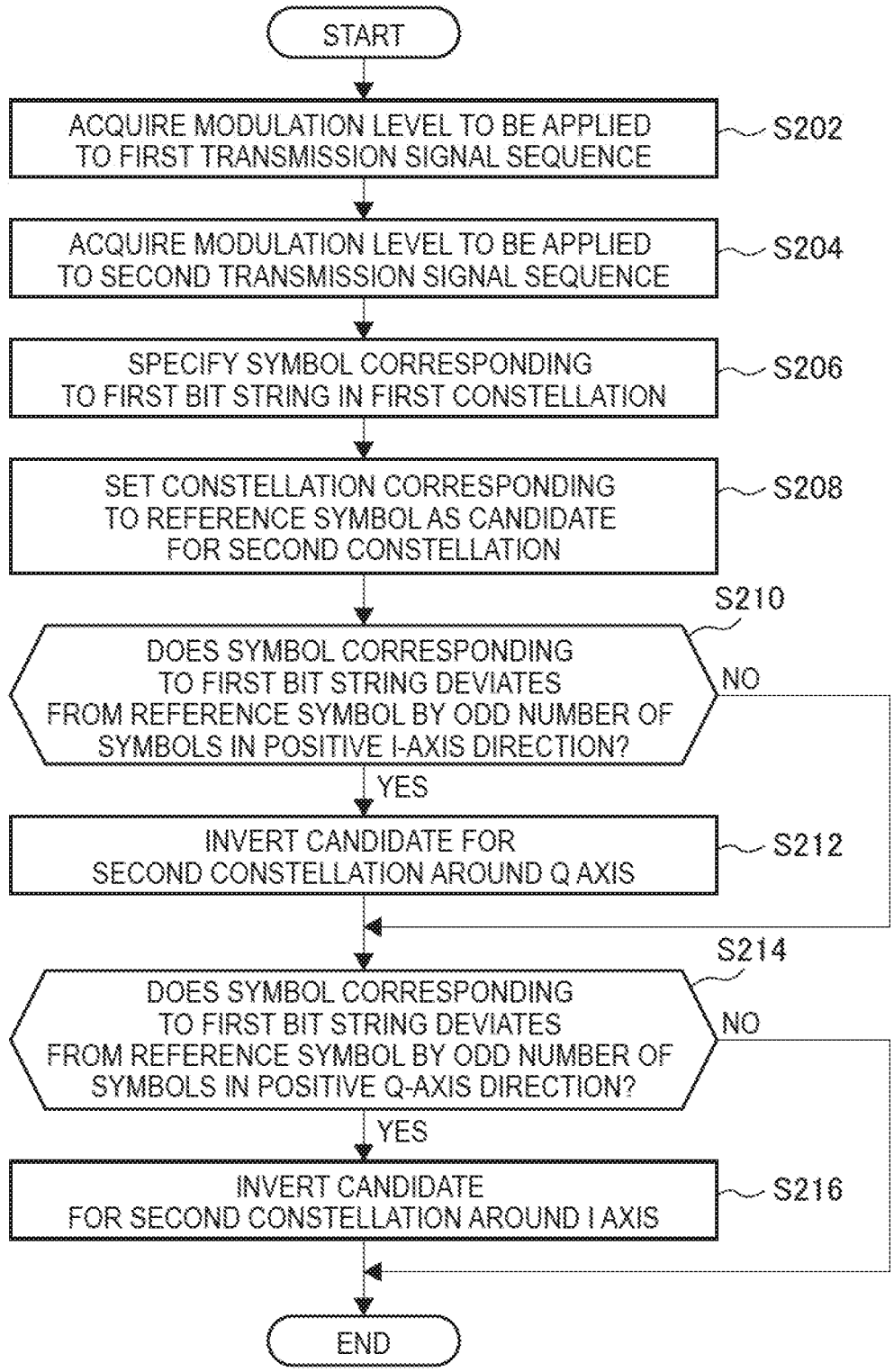
FIG. 11 is a flowchart illustrating an example of a flow of a constellation selection process executed in the base station according to the embodiment.

FIG. 11 is a flowchart illustrating an example of a flow of the constellation selection process executed in the base station 100 according to the present embodiment. The present flow corresponds to step S108 in FIG. 10.

As illustrated in FIG. 11, first, the base station 100 (for example, the selection unit 151) acquires the modulation level to be applied to the first transmission signal sequence (step S202). Then, the base station 100 (for example, the selection unit 151) acquires the modulation level to be applied to the second transmission signal sequence (step S204). Then, the base station 100 (for example, the selection unit 151) specifies the symbol corresponding to the first bit string in the first constellation (step S206). Then, the base station 100 (for example, the selection unit 151) sets the constellation corresponding to the reference symbol as a candidate for the second constellation (step S208).

Then, the base station 100 (for example, the selection unit 151) determines whether or not the symbol corresponding to the first bit string deviates from the reference symbol by an odd number of symbols in the positive I-axis direction (or the negative I-axis direction) (step S210). In a case in which the symbol corresponding to the first bit string is determined to deviate from the reference symbol by an odd number of symbols in the positive I-axis direction (YES in step S210), the base station 100 (for example, the selection unit 151) inverts the candidate for the second constellation around the Q axis (step S212). In a case in which the symbol corresponding to the first bit string is determined to deviate from the reference symbol by an even number of symbols in the positive I-axis direction (NO in step S210), a process of step S212 is skipped.

Then, the base station 100 (for example, the selection unit 151) determines whether or not the symbol corresponding to the first bit string deviates from the reference symbol by an odd number of symbols in the positive Q-axis direction (or the negative Q-axis direction) (step S214). In a case in which the symbol corresponding to the first bit string is determined to deviate from the reference symbol by an odd number of symbols in the positive Q-axis direction (YES in step S214), the base station 100 (for example, the selection unit 151) inverts the candidate for the second constellation around I axis (step S216). In a case in which the symbol corresponding to the first bit string is determined to deviate from the reference symbol by an even number of symbols in the positive Q-axis direction (NO in step S214), a process of step S216 is skipped.

Then, the constellation selection process ends.

Figure 12:
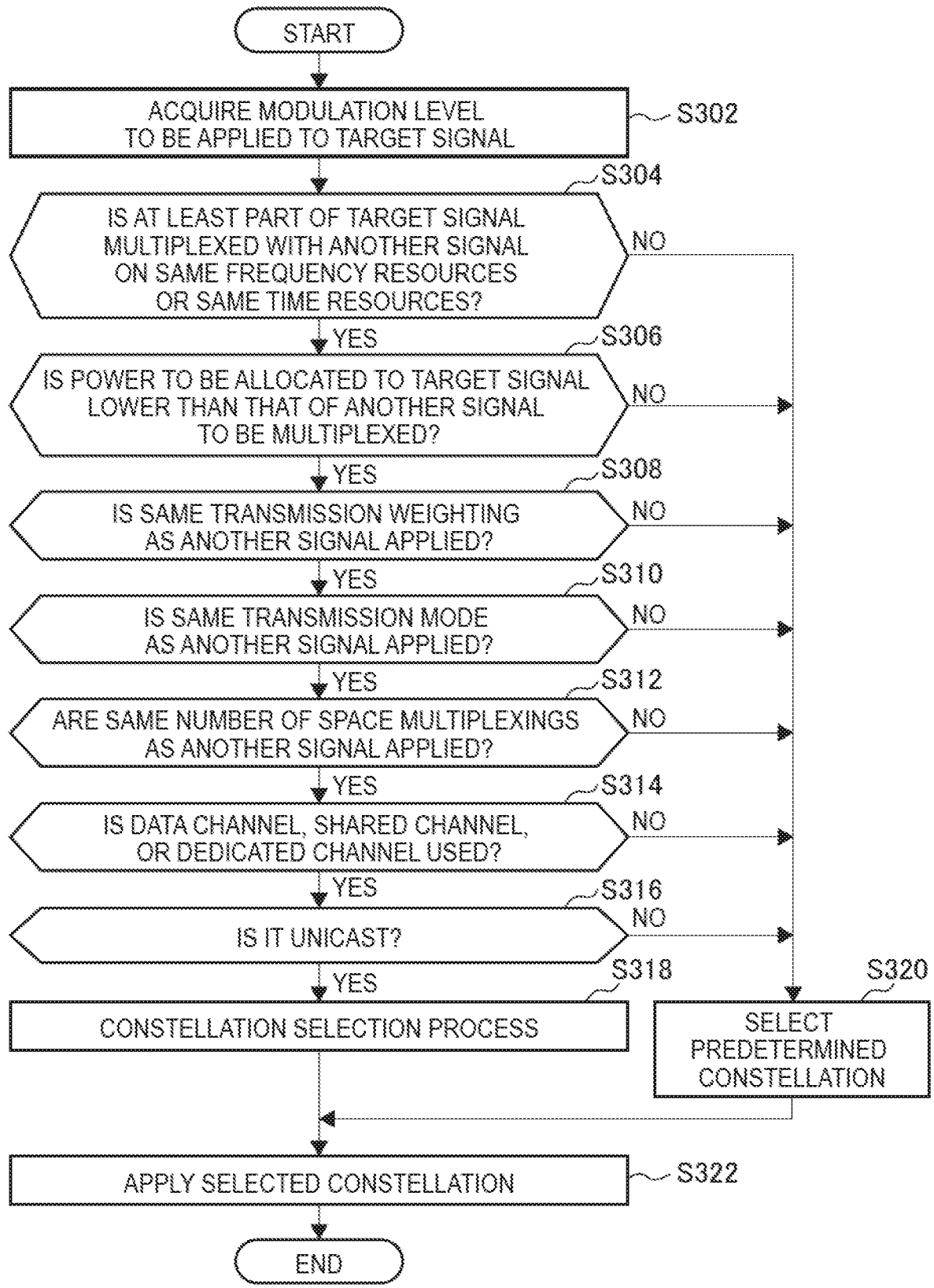
FIG. 12 is a flowchart illustrating an example of a flow of a constellation applying process executed in the base station according to the embodiment.

Then, a constellation applying process including determination based on signal processing at a stage after modulation will be described with reference to FIGS. 12 to 15. FIG. 12 is a flowchart illustrating an example of a flow of a constellation applying process executed in the base station 100 according to the present embodiment.

As illustrated in FIG. 12, first, the base station 100 (for example, the selection unit 151) acquires the modulation level to be applied to the target signal (step S302). Thereafter, in steps S304 to S316, the base station 100 (for example, the selection unit 151) determines whether the constellation selection process is performed or a predetermined constellation is selected.

Specifically, first, the base station 100 determines whether or not at least a part of the target signal is multiplexed with another signal on the same frequency resources or the same time resources (step S304). Then, the base station 100 determines whether or not the power to be allocated to the target signal is lower than that of another signal to be multiplexed (step S306). Then, the base station 100 determines whether or not the same transmission weighting as another signal is applied to the target signal (step S308). Then, the base station 100 determines whether or not the same transmission mode as another signal is applied to the target signal (step S310). Then, the base station 100 determines whether or not the same number of space multiplexings as another signal are applied to the target signal (step S312). Then, the base station 100 determines whether or not a data channel, a shared channel, or a dedicated channel is used for the target signal (step S314). Then, the base station 100 determines whether or not the target signal is unicast (step S316).

In a case in which all the condition determination results are YES, the base station 100 (for example, the selection unit 151) performs the constellation selection process (step S318). The process here is similar to step S108 of FIG. 10 as described above with reference to FIG. 11. On the other hand, in a case in which any one or more determination results are NO, the base station 100 (for example, the selection unit 151) selects a predetermined constellation (step S320).

Then, the base station 100 (for example, the transmission processing unit 153) applies the selected constellation to the target signal (step S322).

Then, the constellation applying process including the determination based on the signal processing at a stage after the modulation ends.

Figure 13:
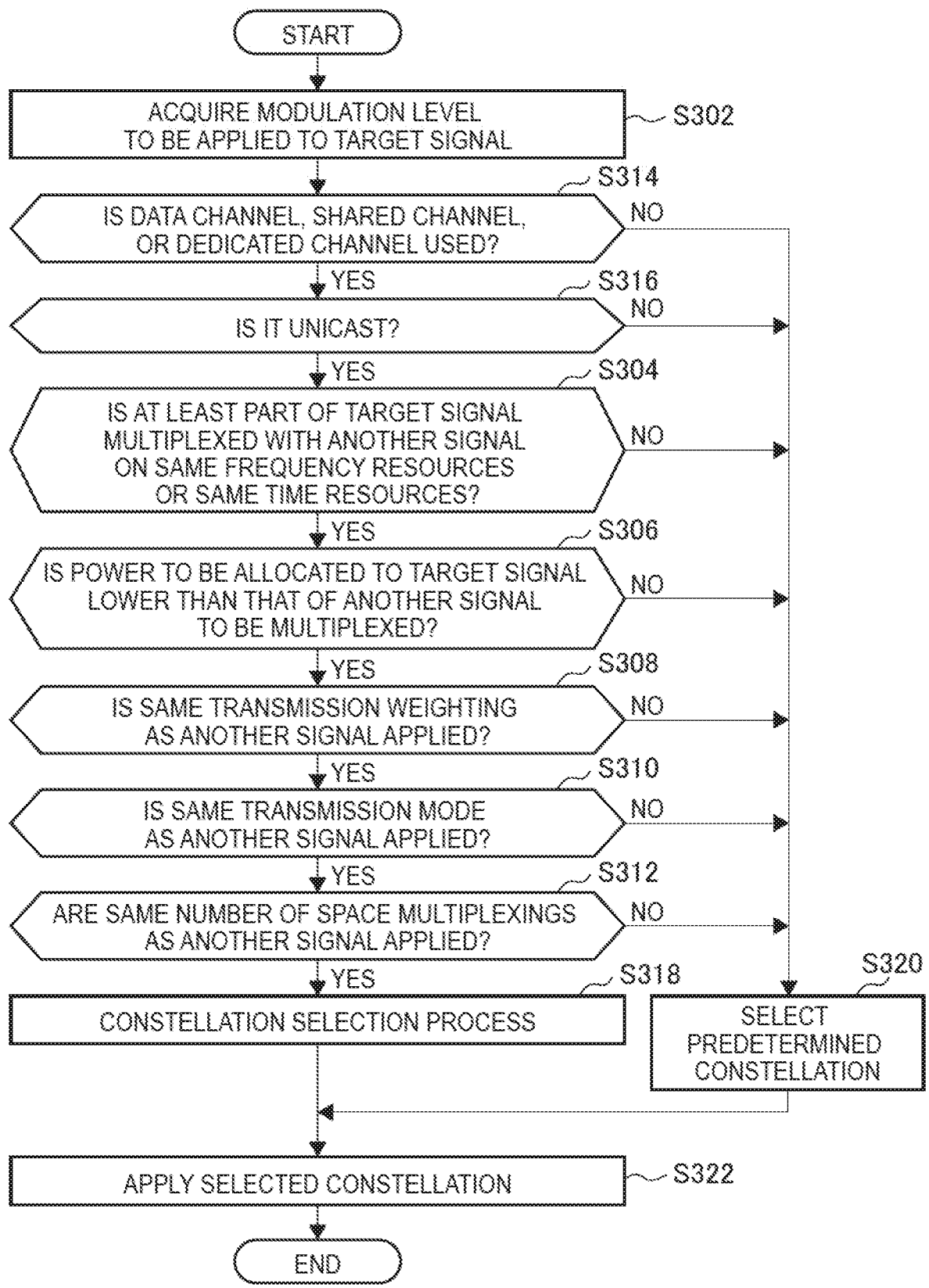
FIG. 13 is a flowchart illustrating an example of a flow of a constellation applying process executed in the base station according to the embodiment.

FIG. 13 is a flowchart illustrating an example of a flow of a constellation applying process executed in the base station 100 according to the present embodiment. In the flow illustrated in FIG. 13, step S314 and step S316 of FIG. 12 are shifted to a stage before step S304, and since content is similar, detailed description thereof is omitted.

Figure 14:
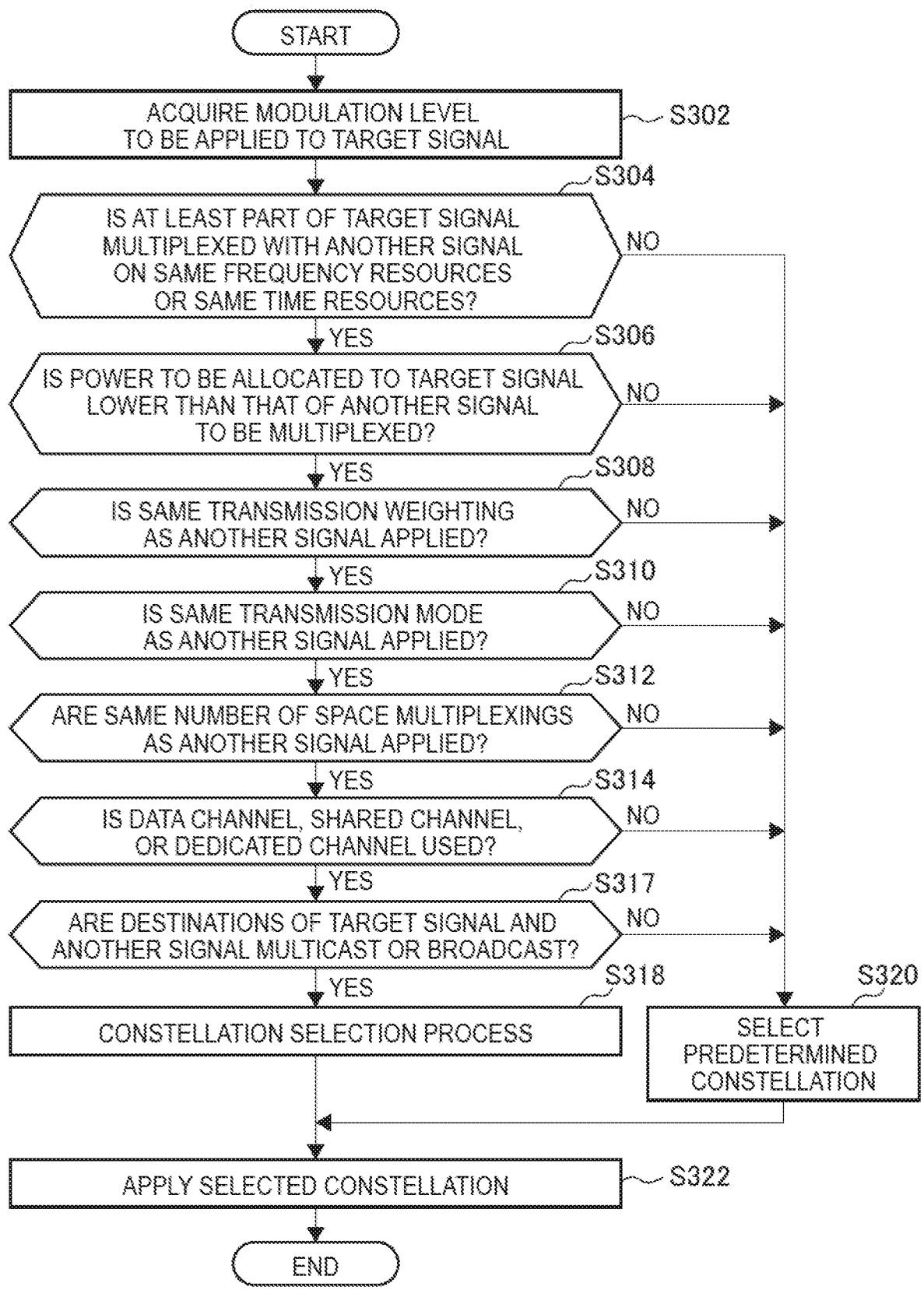
FIG. 14 is a flowchart illustrating an example of a flow of a constellation applying process executed in the base station according to the embodiment.

FIG. 14 is a flowchart illustrating an example of a flow of a constellation applying process executed in the base station 100 according to the present embodiment. The flow illustrated in FIG. 14 is a flowchart in which step S316 in the flow illustrated in FIG. 12 is replaced with step S317. In step S317, the base station 100 determines whether or not the destination of the target signal and the destination of another signal are multicast or broadcast. In the description of the flow illustrated in FIG. 14, the description of step S316 of FIG. 12 may be used for description of step S317.

Figure 15:
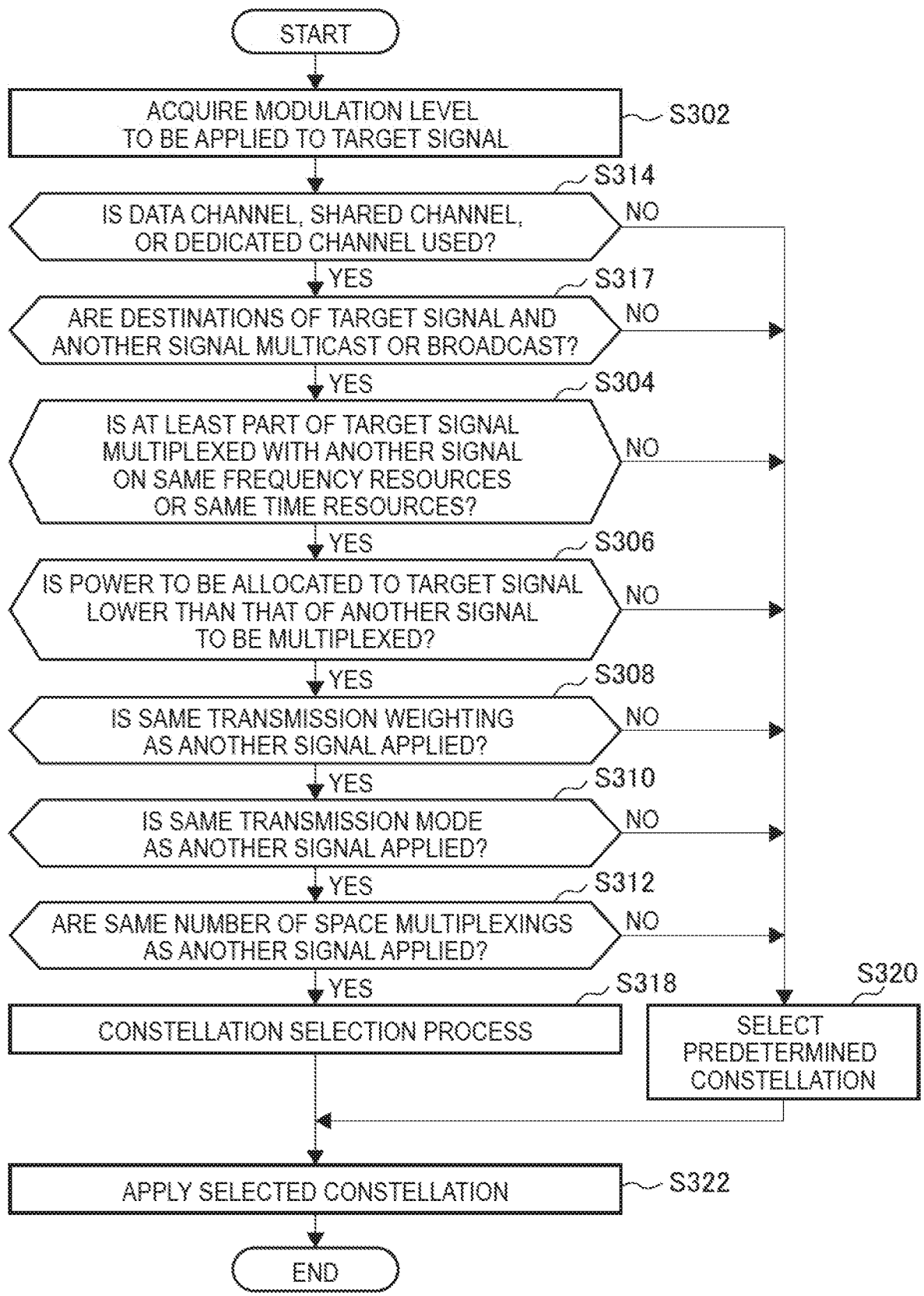
FIG. 15 is a flowchart illustrating an example of a flow of a constellation applying process executed in the base station according to the embodiment.

FIG. 15 is a flowchart illustrating an example of a flow of a constellation applying process executed in the base station 100 according to the present embodiment. In the flow illustrated in FIG. 15, step S314 and step S317 of FIG. 14 are shifted to a stage before step S304, and since content is similar, detailed description thereof is omitted.

3.3. First Modified Example

In the above example, in order to implement gray mapping even in the constellation after multiplexing, the selection of the second constellation is performed, and the selected second constellation is applied to the second bit string. Accordingly, the signal in which the gray mapping can be implemented even in the constellation after multiplexing is generated. On the other hand, in the present modified example, the signal in which the gray mapping can be implemented even in the constellation after multiplexing is generated by performing a conversion process after modulation (that is, conversion of a phase and an amplitude. Conversion of a symbol arrangement may be used) on the second bit string. A final output is the same as in a case in which the selection of the second constellation is performed and the present modified example. In other words, a process for generating the signal in which the gray mapping can be implemented even in the constellation after multiplexing may be implemented by selecting the second constellation or may be implemented by the conversion process after modulation. A difference between these methods is an implementation difference, but there is no basic technological difference.

Figure 16:
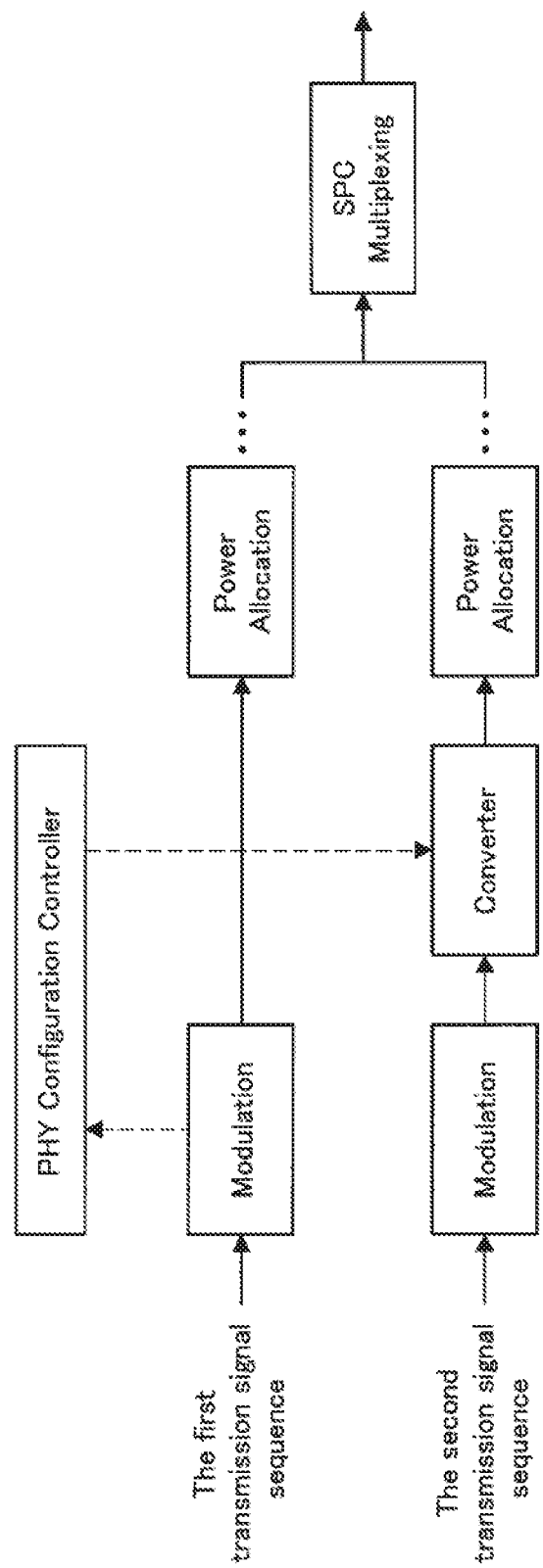
FIG. 16 is an explanatory diagram for describing technical features of a base station according to a first modified example.

FIG. 16 is an explanatory diagram for describing an example of a process in the transmission device (for example, the wireless communication unit 120) that converts the symbol arrangement after modulation. As illustrated in FIG. 16, the physical layer configuration controller (for example, operating under the control of the processing unit 150) acquires information from the modulator that modulates the first transmission signal sequence. Specifically, the physical layer configuration controller acquires information indicating the symbol position of the first bit string in the first constellation applied to the first bit string. Further, the first constellation and the second constellation are assumed to be identical to each other. Then, as illustrated in FIG. 16, the physical configuration controller gives an instruction to the converter that performs the conversion process on the symbol of the bit string of the second transmission signal sequence output from the modulator. Specifically, the physical layer configuration controller gives an instruction to perform conversion for implementing a similar symbol arrangement to the result of applying the second constellation selected in the transmission device illustrated in FIG. 8 in the modulator. Accordingly, the signal output from the modulator to which the second transmission signal sequence is input in FIG. 8 and the signal output from the converter in FIG. 16 coincide with each other if the first and second transmission signal sequences input to both the transmission devices are identical. Further, power is allocated to the signal of the first transmission signal sequence output from the modulator and the signal of the second transmission signal sequence output from the converter. For example, high power is allocated to the signal of the first transmission signal sequence, and low power is allocated to the signal of the second transmission signal sequence. Thereafter, the signals of the two transmission signal sequences undergo the SPC multiplexing through various processes.

Next, a flowchart illustrating an example of a flow of a multiplexing process executed in the base station 100 according to the present modified example will be described with reference to FIG. 17.

Figure 17:
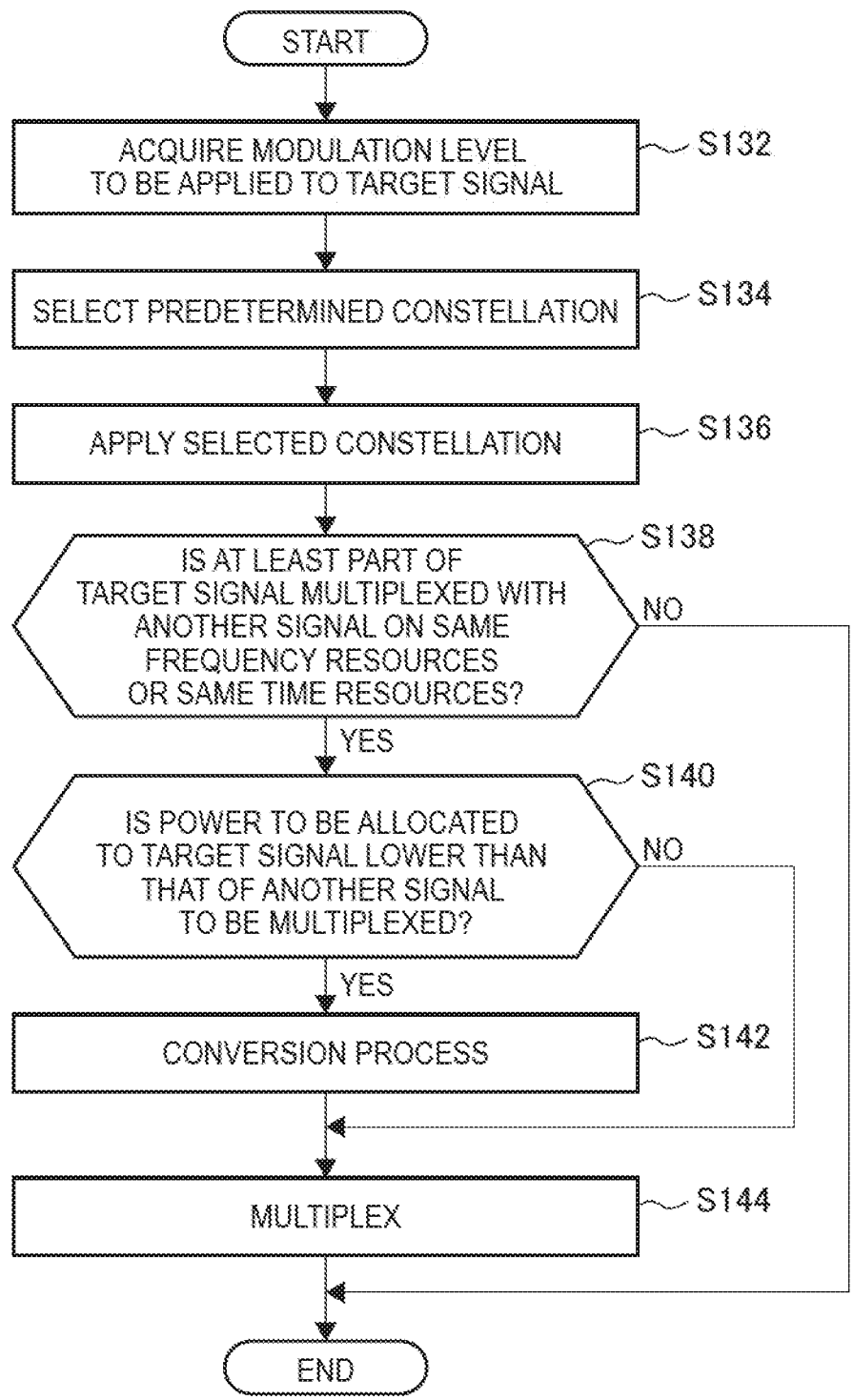
FIG. 17 is a flowchart illustrating an example of a flow of a multiplexing process executed in the base station according to the modified example.

As illustrated in FIG. 17, first, the base station 100 (for example, the selection unit 151) acquires the modulation level to be applied to the target signal (step S132).

Then, the base station 100 (for example, the selection unit 151) selects a predetermined constellation (step S134). For example, the base station 100 (the selection unit 151) selects a default constellation (for example, a constellation identical to the first constellation).

Then, the base station 100 (for example, the transmission processing unit 153) applies the selected constellation to the target signal (that is, the second transmission signal sequence) (step S136).

Then, the base station 100 (for example, the selection unit 151) determines whether or not at least a part of the target signal is multiplexed with another signal on the same frequency resources or the same time resources (step S138). In a case in which at least a part of the target signal is determined not to be multiplexed with another signal on the same frequency resources or the same time resources (NO in step S138), the process ends. On the other hand, in a case in which at least a part of the target signal is determined to be multiplexed with another signal on the same frequency resources or the same time resources (YES in step S138), the base station 100 (for example, the selection unit 151) determines whether or not the power to be allocated to the target signal is lower than that of another signal to be multiplexed (Step S140).

In a case in which the power to be allocated to the target signal is determined to be lower (YES in step S140), the base station 100 (for example, the transmission processing unit 153) performs the conversion process (step S142). Specifically, the base station 100 converts the phase or the amplitude of the signal modulated in step S136 so that the same signal as the signal generated in a case in which the second constellation corresponding to the symbol position of the first bit string in the first constellation applied to the bit string of another signal to be multiplexed (that is, the first transmission signal sequence) applied to the target signal is generated. Thereafter, the base station 100 (for example, the transmission processing unit 153) multiplexes the converted target signal with another signal (step S144).

On the other hand, in a case in which the power to be allocated to the target signal is determined to be higher (NO in step S140), the base station 100 (for example, the transmission processing unit 153) multiplexes the target signal with another signal (step S144).

Then, the process ends.

4. SECOND EMBODIMENT

In the first embodiment, each of a plurality of transmission signal sequences is modulated and then SPC-multiplexed. Accordingly, as illustrated in FIG. 9, for example, two signals to which QPSK is applied are SPC-multiplexed, and a signal of 16QAM is generated in a pseudo manner. On the other hand, in the present embodiment, one combined transmission signal sequence is generated from a bit string extracted from a plurality of transmission signal sequences and modulated together, and a similar output to that of the first embodiment is obtained.

4.1. Technical Features

Figure 18:
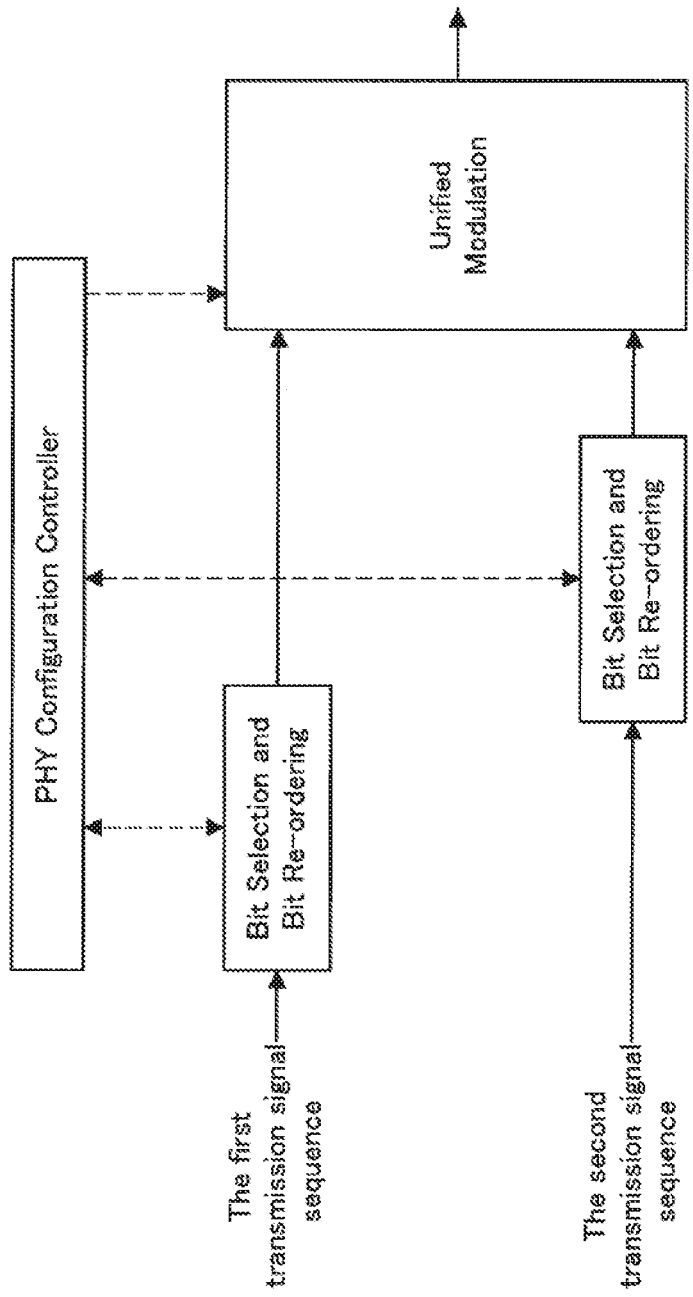
FIG. 18 is an explanatory diagram for describing technical features of a base station according to a second embodiment.

FIG. 18 is an explanatory diagram for describing technical features of the base station 100 according to the present embodiment. As illustrated in FIG. 18, the physical layer configuration controller (for example, operating under the control of the processing unit 150) applies bit selection and bit rearrangement to each of the first transmission signal sequence and the second transmission signal sequence. At this time, the physical layer configuration controller extracts a bit string multiplexed with one symbol from each of the transmission signal sequences. Then, the physical layer configuration controller modulates the bit strings extracted from the respective transmission signal sequences together.

For example, the physical layer configuration controller selects two bits from each of the first transmission signal sequence and the second transmission signal sequence and modulates a total of 4 bits using 16QAM. At this time, the physical layer configuration controller performs a rearrangement such that the 2 bits of the transmission signal sequence which is higher in the power to be allocated are placed as 2 bits of a first half, and the 2 bits of the transmission signal sequence which is lower in the power to be allocated are placed as 2 bits of a second half. A normal constellation gray-mapped for 16QAM is typically applied to the 16QAM modulation. Accordingly, even when the reception device decodes erroneously, for example, in a case in which it is decoded as a symbol next to a correct symbol, the bit error of 2 or more bits does not occur, and the bit error of at most 1 bit occurs. As described above, in the present embodiment, it is possible to prevent the degradation of the decoding characteristic of the reception device. Further, for the modulation, a modification of the gray-mapped normal constellation may be applied, or a constellation similar to the constellation after multiplexing in the first embodiment may be applied.

As described above, in the present embodiment, it is possible to obtain the similar output as the transmission device according to the first embodiment illustrated in FIG. 8. Thereafter, various kinds of signal processing such as resource element mapping and OFDM modulation are applied to the modulated signal.

4.2. Flow of Process

Figure 19:
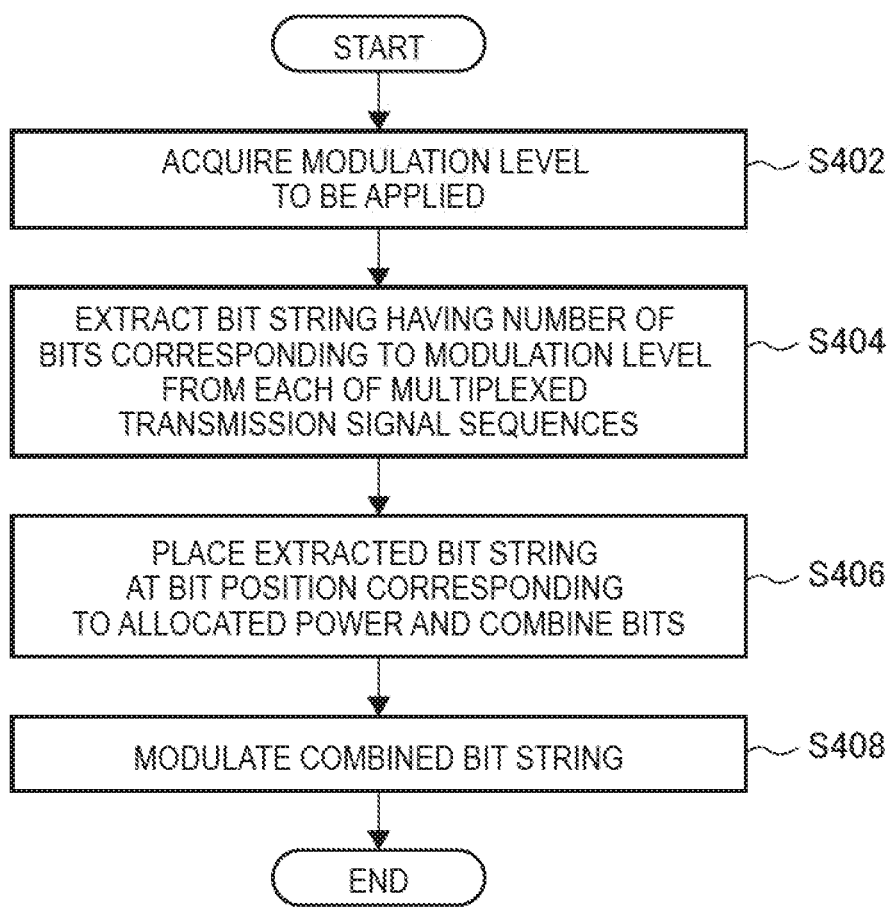
FIG. 19 is a flowchart illustrating an example of a flow of a modulation process executed in the base station according to the embodiment.

FIG. 19 is a flowchart illustrating an example of a flow of a modulation process executed in the base station 100 according to the present embodiment.

As illustrated in FIG. 19, first, the base station 100 (for example, the transmission processing unit 153) acquires the modulation level to be applied to the transmission signal (step S402). Here, 16QAM is assumed to be used as an example.

Then, the base station 100 (for example, the transmission processing unit 153) extracts a bit string having the number of bits corresponding to the modulation level from each of the multiplexed transmission signal sequences (step S404). For example, in a case in which the modulation level is 16QAM, and the number of multiplexings is 2, the base station 100 extracts two bits from two transmission signal sequences.

Then, the base station 100 (for example, the transmission processing unit 153) places the extracted bit string at a bit position corresponding to the allocated power and combines the bits (step S406). For example, the base station 100 combines the bits such that 2 bits of the transmission signal sequence which is higher in the power to be allocated are placed as 2 bits of a first half, and 2 bits of the transmission signal sequence which is lower in the power to be allocated are placed as 2 bits of a second half.

Then, the base station 100 (for example, the transmission processing unit 153) modulates the combined bit string (step S408). For example, the base station 100 modulates the combined 4-bit bit string using the normal constellation gray-mapped for 16QAM.

Then, the modulation process ends.

5. THIRD EMBODIMENT

5.1. Technical Problem

In the first and second embodiments, in a case in which different transmission weights are applied to both the transmission signal sequence of the first bit string and the transmission signal sequence of the second bit string, further processing may be necessary to implement the gray mapping. Such a situation is illustrated in FIG. 20.

Figure 20:
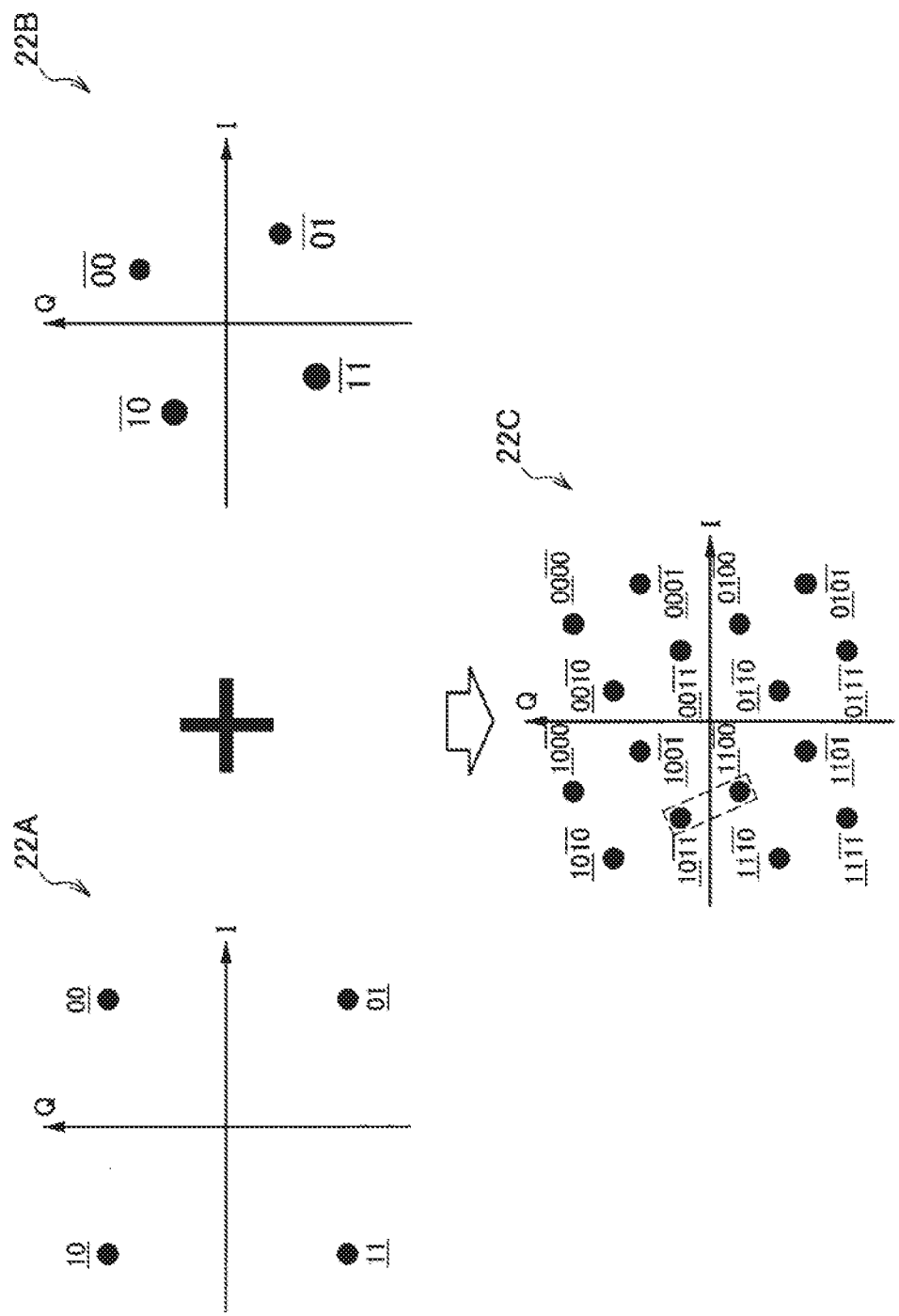
FIG. 20 is an explanatory diagram for describing a technical problem relating to a third embodiment.

FIG. 20 is an explanatory diagram for describing an example of a constellation in a case in which different transmission weightings are applied. Meanings of underlines and upper lines attached to respective bit strings in FIG. 20 are similar as those of FIG. 4. As illustrated in FIG. 20, a phase difference occurs between two QPSK constellations 22A and 22B. This phase difference occurs since a difference between transmission weights applied to the respective signals after modulation is reflected at the symbol position. As illustrated in FIG. 20, it is hard to regard that the gray mapping is implemented in the constellation 22C of the signal obtained by SPC-multiplexing the signal including the phase difference. For example, a symbol of "1011" surrounded by a broken line is different from a symbol of "1100" adjacent thereto (for example, located at the closest distance) with the I axis interposed therebetween in 2 bits. For this reason, for example, in a case in to which the reception device decodes erroneously and decodes it as a symbol adjacent to the correct symbol with the I axis or the Q axis interposed therebetween, a bit error of 2 or more bits may occur. The bit error of 2 or more bits leads to degradation of the decoding characteristic of the reception device.

Hereinafter, such a symbol arrangement is also referred to as quasi non-gray mapping. Further, a symbol arrangement in which, in a case in which different transmission weightings are applied, adjacent symbols with the I axis or the Q axis interposed therebetween among the multiplexed symbols in addition to within each quadrant differ in only 1 bit is also referred to as a "quasi gray mapping." The base station 100 according to the present embodiment implements the quasi gray mapping in a case in which different transmission weightings are performed.

5.2. Technical Features

The base station 100 (for example, the selection unit 151) selects the constellation to be applied to each of the transmission signal sequences to be multiplexed. In the present embodiment, the base station 100 selects the second constellation further corresponding to the transmission weight applied to each of the transmission signal sequence of the first bit string and the transmission signal sequence of the second bit string.

Here, for convenience of description, the number of multiplexed transmission signal sequences is assumed to be two. It will be appreciated that the number of multiplexed transmission signal sequences may be three or more. In this case, it is preferable that transmission weights to be applied be different in at least one set of a plurality of transmission signal sequences. A power relation between the first bit string and the second bit string is similar to that of the first embodiment.

The base station 100 selects a constellation to be applied to the other bit string in accordance with one bit string. Specifically, the base station 100 selects the second constellation corresponding to a symbol position of the first bit string in the first constellation applied to the first bit string. The transmission device (such as a wireless communication unit 120) that performs such selection can be implemented, for example, as FIG. 8 or FIG. 16 described above.

For example, the second constellation selected by the base station 100 is obtained by rotating a reference constellation by an amount corresponding to the transmission weight applied to each of the transmission signal sequence of the first bit string and the transmission signal sequence of the second bit string, and the symbol position of the first bit string in the first constellation applied to the first bit string. In this regard, with reference to FIG. 21, two signals modulated using QPSK will be described in detail.

Figure 21:
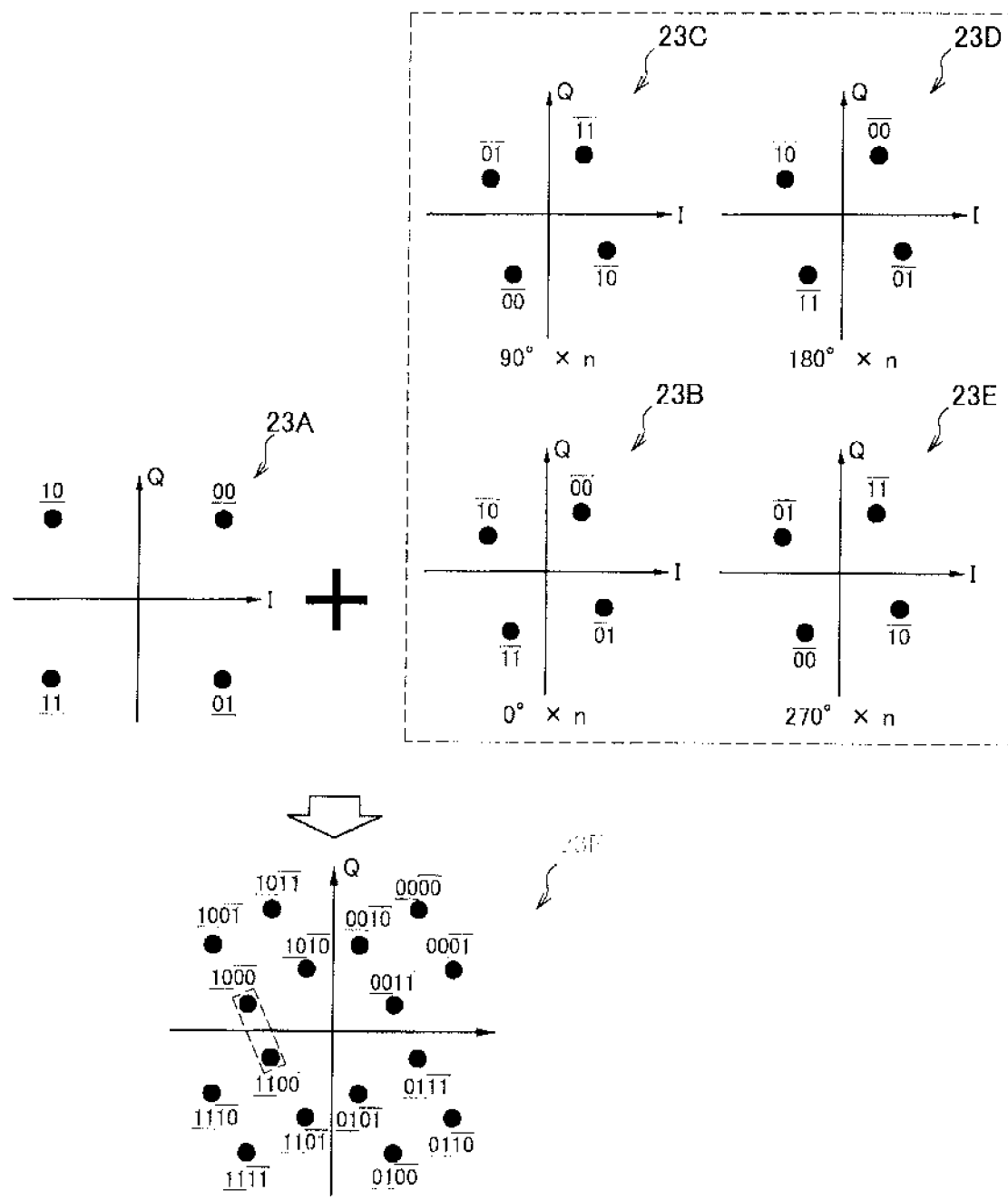
FIG. 21 is an explanatory diagram for describing technical features of the base station according to the embodiment.

FIG. 21 is an explanatory diagram for describing the constellation selection process according to the present embodiment. The first constellation applied to the first bit string is indicated by 23A. On the other hand, the second constellations applied to the second bit string are indicated by reference numerals 23B to 23E. For example, in a case in which the first bit string is "11," the second constellation 23B is applied to the second bit string. Further, in a case in which the first bit string is "10," the second constellation 23C is applied to the second bit string. Further, in a case in which the first bit string is "00," the second constellation 23D is applied to the second bit string. Further, in a case in which the first bit string is "01," the second constellation 23E is applied to the second bit string. Further, meanings of underlines and upper lines attached to the respective bit strings in FIG. 9 are similar to those in FIG. 4.

Here, the transmission weight applied to the transmission signal sequence of the first bit string is different from the transmission weight applied to the transmission signal sequence of the second bit string. Therefore, a phase difference occurs between the first constellation and the second constellation. Further, as an example, the first constellation 23A is used as the reference constellation. The base station 100 selects a constellation obtained by rotating the reference constellation 0×n° as the second constellation 23B. Further, in FIG. 21, a phase difference caused by a difference in a transmission weight is further reflected in the selected constellation and illustrated. Here, the second constellation 23B may be regarded as the reference constellation. Further, the rotation direction is clockwise. The base station 100 selects a constellation obtained by rotating the reference constellation 90×n° as the second constellation 23C. The base station 100 selects a constellation obtained by rotating the reference constellation 180×n° as the second constellation 23D. The base station 100 selects a constellation obtained by rotating the reference constellation 270×n° as the second constellation 23E. Further, "n" is calculated by the following Formula.

$$\text{if } \frac{A}{B} \leq |\sin\theta| \leq \sqrt{1 - \left(\frac{A}{2B}\right)^2} \ n = 2$$

$$\text{otherwise } n = 1$$

[Math. 22]

Figure 22:
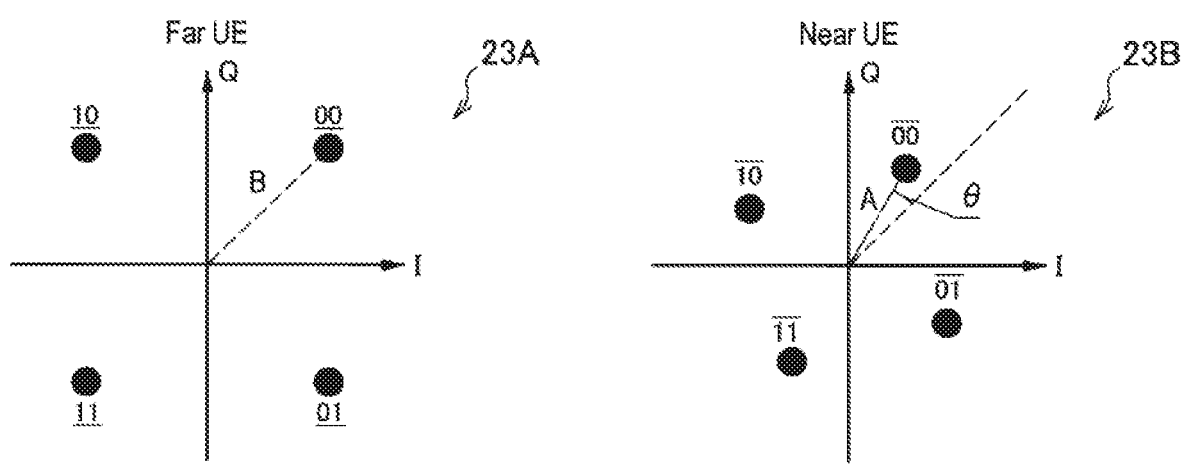
FIG. 22 is an explanatory diagram for describing technical features of the base station according to the embodiment.

Here, "A" and "B" in the above Formula indicate amplitudes of corresponding symbols in the first constellation 23A and the second constellation 23B as illustrated in FIG. 22. Further, "θ" is a phase difference appearing in a case in which the difference in the transmission weight applied to each signal after modulation illustrated in FIG. 22 is reflected at the symbol position.

Reference numeral 23F in FIG. 21 indicates a constellation of an SPC-multiplexed signal. Referring to the constellation 23F, it is understood that the quasi gray mapping is implemented. For example, in each quadrant, bit strings corresponding to adjacent symbols differ in 1 bit. Further, adjacent symbols with the I axis or the Q axis interposed therebetween differ in 1 bit as in "1000" and "1100" surrounded by broken lines.

As described above, since the second constellation selected by the above method is used, the quasi gray mapping is implemented even in the constellation after the SPC multiplexing. Accordingly, even when the reception device decodes erroneously, for example, in a case in which it is decoded as a symbol next to a correct symbol, the bit error of 2 or more bits does not occur, and the bit error of at most 1 bit occurs. As described above, it is possible to prevent the degradation of the decoding characteristic of the reception device.

5.3. Flow of Process

Figure 23:
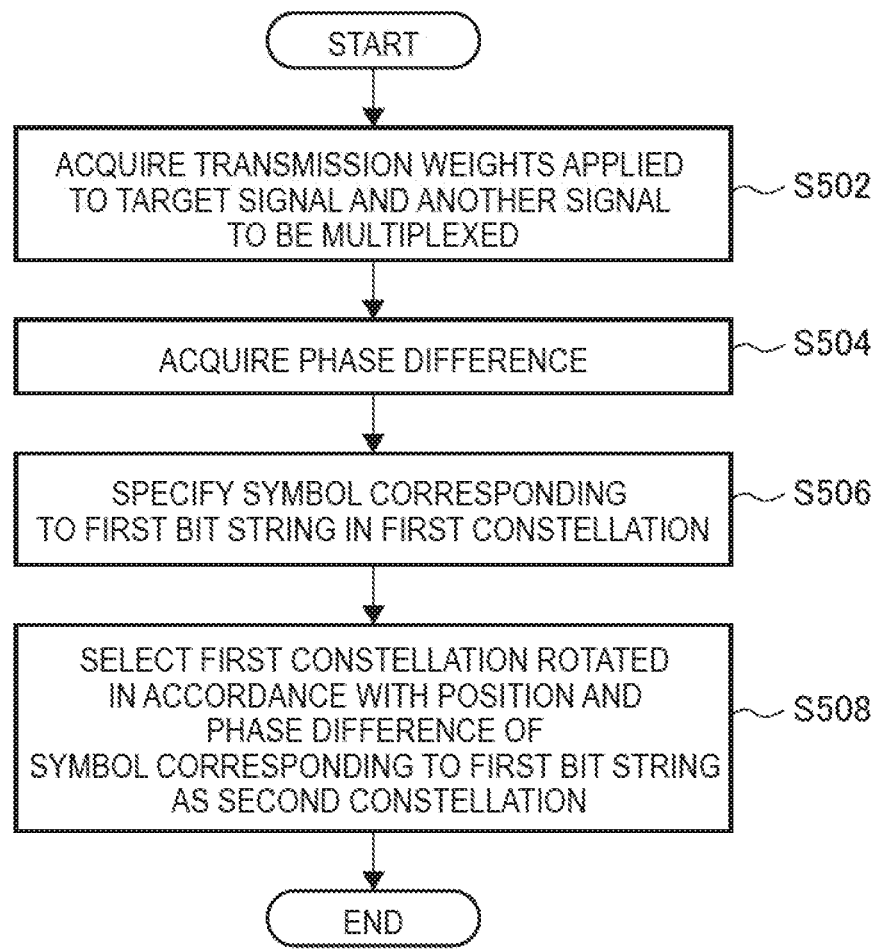
FIG. 23 is a flowchart illustrating an example of a flow of a constellation selection process executed in the base station according to the embodiment.

FIG. 23 is a flowchart illustrating an example of a flow of a constellation selection process executed in the base station 100 according to the present embodiment.

As illustrated in FIG. 23, first, the base station 100 (for example, the selection unit 151) acquires the transmission weights applied to the target signal and another signal to be multiplexed (step S502). Then, the base station 100 (for example, the selection unit 151) acquires the phase difference caused by the difference between the transmission weights. Then, the base station 100 (for example, the selection unit 151) specifies the symbol corresponding to the first bit string in the first constellation. Then, the base station 100 (for example, the selection unit 151) selects the first constellation rotated in accordance with the position and the phase difference of the symbol corresponding to the first bit string as the second constellation.

Then, the process ends.

6. APPLICATION EXAMPLE

The technology of the present disclosure can be applied to various products. For example, the base station 100 may be realized as any type of evolved node B (eNB), such as a macro eNB, a small eNB, or the like. A small eNB may be an eNB that covers a smaller cell than a macro cell, such as a pico eNB, a micro eNB, or a home (femto) eNB. Alternatively, the base station 100 may be realized as another type of base station such as a node B or a base transceiver station (BTS). The base station 100 may include a main body that controls wireless communication (also referred to as a base station device) and one or more remote radio heads (RRHs) disposed in a different place from the main body. In addition, various types of terminals to be described below may operate as the base station 100 by temporarily or semi-permanently executing the base station function. Furthermore, at least some of constituent elements of the base station 100 may be realized in a base station device or a module for a base station device.

First Application Example

Figure 24:
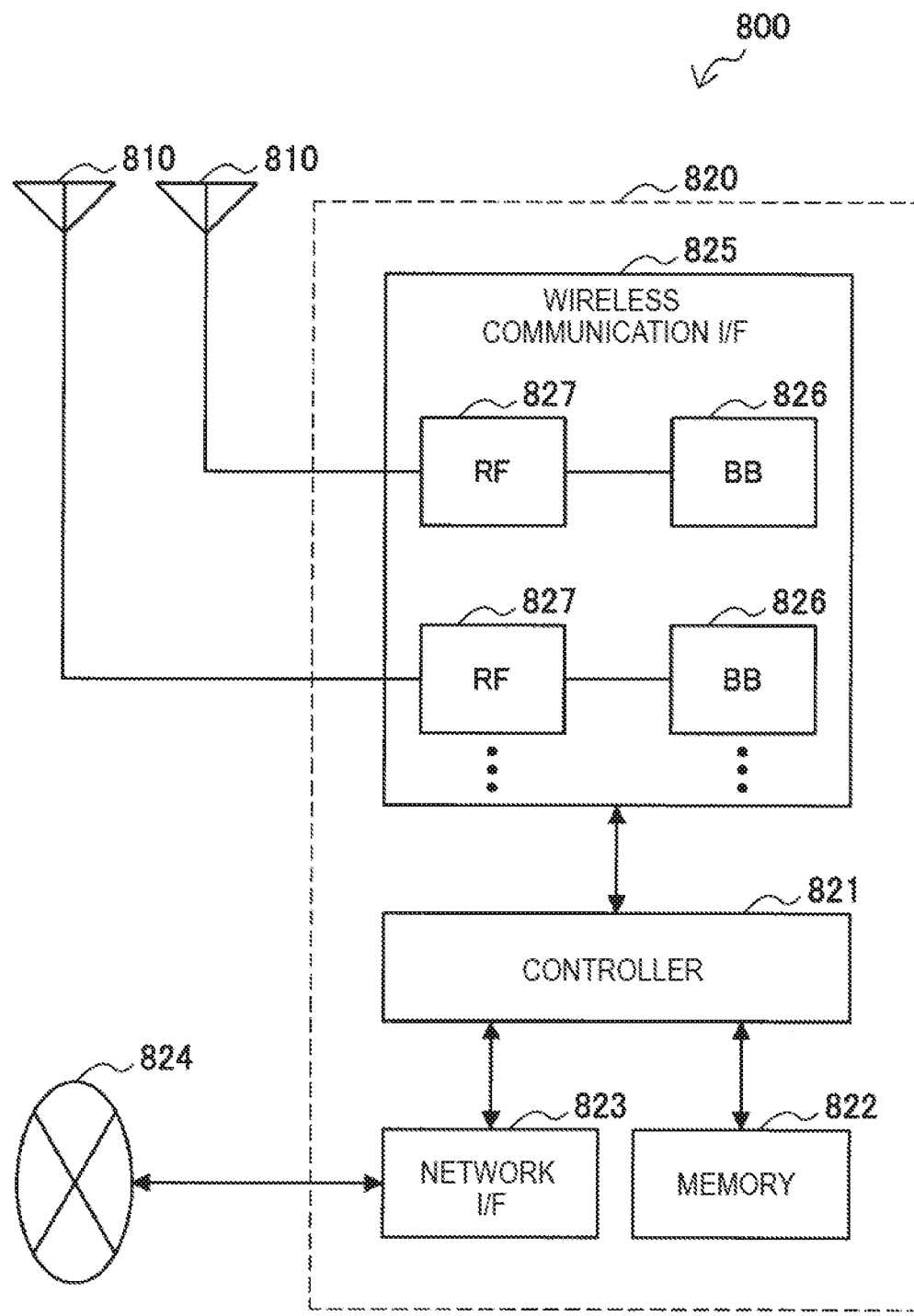
FIG. 24 is a block diagram illustrating a first example of a schematic configuration of an eNB.

FIG. 24 is a block diagram illustrating a first example of a schematic configuration of an eNB to which the technology of the present disclosure may be applied. An eNB 800 includes one or more antennas 810 and a base station device 820. Each antenna 810 and the base station device 820 may be connected to each other via an RF cable.

Each of the antennas 810 includes a single or multiple antenna elements (such as multiple antenna elements included in an MIMO antenna), and is used for the base station device 820 to transmit and receive radio signals. The eNB 800 may include the multiple antennas 810, as illustrated in FIG. 24. For example, the multiple antennas 810 may be compatible with multiple frequency bands used by the eNB 800. Note that, although FIG. 24 illustrates the example in which the eNB 800 includes the multiple antennas 810, the eNB 800 may also include a single antenna 810.

The base station device 820 includes a controller 821, a memory 822, a network interface 823, and a wireless communication interface 825.

The controller 821 may be, for example, a CPU or a DSP, and operates various functions of a higher layer of the base station device 820. For example, the controller 821 generates a data packet from data in signals processed by the wireless communication interface 825, and transfers the generated packet via the network interface 823. The controller 821 may bundle data from multiple base band processors to generate the bundled packet, and transfer the generated bundled packet. In addition, the controller 821 may have logical functions of performing control such as radio resource control, radio bearer control, mobility management, admission control, and scheduling. The control may be performed in corporation with an eNB or a core network node in the vicinity. The memory 822 includes RAM and ROM, and stores a program that is executed by the controller 821, and various types of control data (such as a terminal list, transmission power data, and scheduling data).

The network interface 823 is a communication interface for connecting the base station device 820 to a core network 824. The controller 821 may communicate with a core network node or another eNB via the network interface 823. In this case, the eNB 800 may be connected to a core network node or another eNB through a logical interface (e.g. S1 interface or X2 interface). The network interface 823 may also be a wired communication interface or a wireless communication interface for radio backhaul. If the network interface 823 is a wireless communication interface, the network interface 823 may use a higher frequency band for wireless communication than a frequency band used by the wireless communication interface 825.

The wireless communication interface 825 supports any cellular communication scheme such as Long Term Evolution (LTE) and LTE-Advanced, and provides radio connection to a terminal positioned in a cell of the eNB 800 via the antenna 810. The wireless communication interface 825 may typically include, for example, a baseband (BB) processor 826 and an RF circuit 827. The BB processor 826 may perform, for example, encoding/decoding, modulating/demodulating, multiplexing/demultiplexing, or the like, and performs various types of signal processing of layers (such as L1, medium access control (MAC), radio link control (RLC), and a packet data convergence protocol (PDCP)). The BB processor 826 may have a part or all of the above-described logical functions instead of the controller 821. The BB processor 826 may be a memory that stores a communication control program, or a module that includes a processor and a related circuit configured to execute the program. Updating the program may allow the functions of the BB processor 826 to be changed. In addition, the module may be a card or a blade that is inserted into a slot of the base station device 820. Alternatively, the module may also be a chip that is mounted on the card or the blade. Meanwhile, the RF circuit 827 may include, for example, a mixer, a filter, and an amplifier, and transmits and receives radio signals via the antenna 810.

The wireless communication interface 825 may include the multiple BB processors 826, as illustrated in FIG. 24. For example, the multiple BB processors 826 may be compatible with multiple frequency bands used by the eNB 800. In addition, the wireless communication interface 825 may include the multiple RF circuits 827, as illustrated in FIG. 24. For example, the multiple RF circuits 827 may be compatible with multiple antenna elements. Note that, although FIG. 24 illustrates the example in which the wireless communication interface 825 includes the multiple BB processors 826 and the multiple RF circuits 827, the wireless communication interface 825 may also include a single BB processor 826 or a single RF circuit 827.

In the eNB 800 illustrated in FIG. 24, one or more structural elements included in the base station 100 (the selection unit 151 and/or the transmission processing unit 153) described with reference to FIG. 6 may be implemented by the wireless communication interface 825. Alternatively, at least some of these constituent elements may be implemented by the controller 821. As an example, a module which includes a part (for example, the BB processor 826) or all of the wireless communication interface 825 and/or the controller 821 may be mounted in eNB 800, and the one or more structural elements may be implemented by the module. In this case, the module may store a program for causing the processor to function as the one or more structural elements (i.e., a program for causing the processor to execute operations of the one or more structural elements) and may execute the program. As another example, the program for causing the processor to function as the one or more structural elements may be installed in the eNB 800, and the wireless communication interface 825 (for example, the BB processor 826) and/or the controller 821 may execute the program. As described above, the eNB 800, the base station device 820, or the module may be provided as a device which includes the one or more structural elements, and the program for causing the processor to function as the one or more structural elements may be provided. In addition, a readable recording medium in which the program is recorded may be provided.

In addition, in the eNB 800 illustrated in FIG. 24, the wireless communication unit 120 described with reference to FIG. 6 may be implemented by the wireless communication interface 825 (for example, the RF circuit 827). Moreover, the antenna unit 110 may be implemented by the antenna 810. In addition, the network communication unit 130 may be implemented by the controller 821 and/or the network interface 823. Further, the storage unit 140 may be implemented by the memory 822.

Second Application Example

Figure 25:
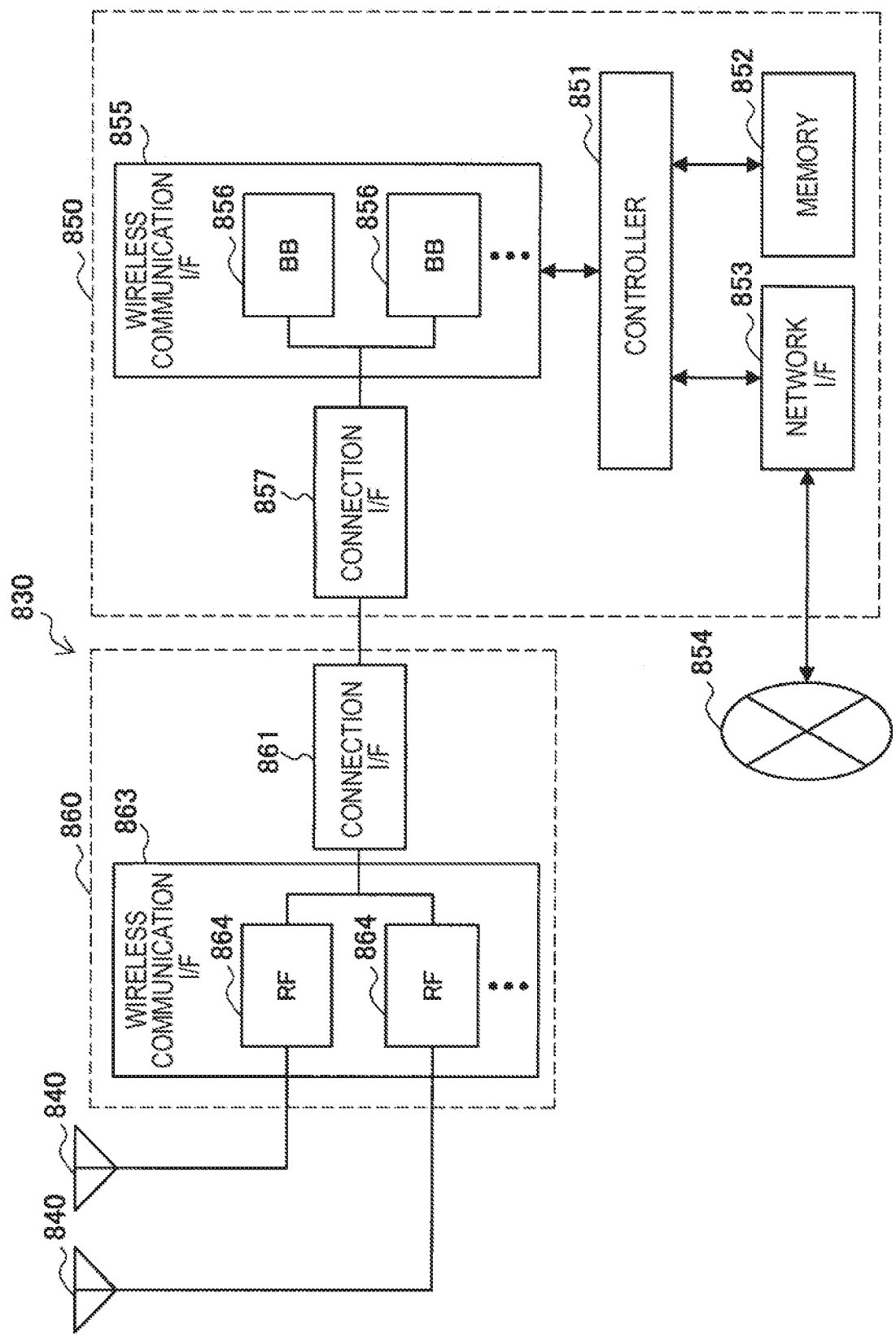
FIG. 25 is a block diagram illustrating a second example of the schematic configuration of the eNB.

FIG. 25 is a block diagram illustrating a second example of a schematic configuration of an eNB to which the technology of the present disclosure may be applied. An eNB 830 includes one or more antennas 840, a base station device 850, and an RRH 860. Each antenna 840 and the RRH 860 may be connected to each other via an RF cable. In addition, the base station device 850 and the RRH 860 may be connected to each other via a high speed line such as an optical fiber cable.

Each of the antennas 840 includes a single or multiple antenna elements (such as multiple antenna elements included in an MIMO antenna), and is used for the RRH 860 to transmit and receive radio signals. The eNB 830 may include the multiple antennas 840, as illustrated in FIG. 25. For example, the multiple antennas 840 may be compatible with respective frequency bands used by the eNB 830. Note that, although FIG. 25 illustrates the example in which the eNB 830 includes the multiple antennas 840, the eNB 830 may also include a single antenna 840.

The base station device 850 includes a controller 851, a memory 852, a network interface 853, a wireless communication interface 855, and a connection interface 857. The controller 851, the memory 852, and the network interface 853 are similar to the controller 821, the memory 822, and the network interface 823 described with reference to FIG. 24.

The wireless communication interface 855 supports any cellular communication scheme such as LTE and LTE-Advanced, and provides wireless connection to a terminal positioned in a sector corresponding to the RRH 860 via the RRH 860 and the antenna 840. The wireless communication interface 855 may typically include, for example, a BB processor 856. The BB processor 856 is similar to the BB processor 826 described with reference to FIG. 24, except connection to the RF circuit 864 of the RRH 860 via the connection interface 857. The wireless communication interface 855 may include the multiple BB processors 856, as illustrated in FIG. 25. For example, the multiple BB processors 856 may be compatible with respective frequency bands used by the eNB 830. Note that, although FIG. 25 illustrates the example in which the wireless communication interface 855 includes the multiple BB processors 856, the wireless communication interface 855 may also include a single BB processor 856.

The connection interface 857 is an interface for connecting the base station device 850 (wireless communication interface 855) to the RRH 860. The connection interface 857 may also be a communication module for communication in the above-described high speed line that connects the base station device 850 (wireless communication interface 855) to the RRH 860.

In addition, the RRH 860 includes a connection interface 861 and a wireless communication interface 863.

The connection interface 861 is an interface for connecting the RRH 860 (wireless communication interface 863) to the base station device 850. The connection interface 861 may also be a communication module for communication in the above-described high speed line.

The wireless communication interface 863 transmits and receives radio signals via the antenna 840. The wireless communication interface 863 may typically include, for example, the RF circuit 864. The RF circuit 864 may include, for example, a mixer, a filter, and an amplifier, and transmits and receives radio signals via the antenna 840. The wireless communication interface 863 may include multiple RF circuits 864, as illustrated in FIG. 25. For example, the multiple RF circuits 864 may support multiple antenna elements. Note that, although FIG. 25 illustrates the example in which the wireless communication interface 863 includes the multiple RF circuits 864, the wireless communication interface 863 may also include a single RF circuit 864.

In the eNB 830 illustrated in FIG. 25, one or more structural elements included in the base station 100 (the selection unit 151 and/or the transmission processing unit 153) described with reference to FIG. 6 may be implemented by the wireless communication interface 855 and/or the wireless communication interface 863. Alternatively, at least some of these constituent elements may be implemented by the controller 851. As an example, a module which includes a part (for example, the BB processor 856) or all of the wireless communication interface 855 and/or the controller 851 may be mounted in eNB 830, and the one or more structural elements may be implemented by the module. In this case, the module may store a program for causing the processor to function as the one or more structural elements (i.e., a program for causing the processor to execute operations of the one or more structural elements) and may execute the program. As another example, the program for causing the processor to function as the one or more structural elements may be installed in the eNB 830, and the wireless communication interface 855 (for example, the BB processor 856) and/or the controller 851 may execute the program. As described above, the eNB 830, the base station device 850, or the module may be provided as a device which includes the one or more structural elements, and the program for causing the processor to function as the one or more structural elements may be provided. In addition, a readable recording medium in which the program is recorded may be provided.

In addition, in the eNB 830 illustrated in FIG. 25, the wireless communication unit 120 described, for example, with reference to FIG. 6 may be implemented by the wireless communication interface 863 (for example, the RF circuit 864). Moreover, the antenna unit 110 may be implemented by the antenna 840. In addition, the network communication unit 130 may be implemented by the controller 851 and/or the network interface 853. Further, the storage 140 may be implemented by the memory 852.

7. CONCLUSION

One embodiment of the present disclosure has been described in detail above with reference to FIGS. 1 to 25. As described above, the base station 100 according to the present embodiment applies the second constellation corresponding to the symbol position of the first bit string in the first constellation applied to the first bit string to the second bit string in regard to a plurality of bit strings to be multiplexed for each of the transmission signal sequences to be multiplexed in resource blocks which at least some of frequency resources or time resources overlap). Further, the bit strings corresponding to symbols of end portions in an direction of adjacency of the respective second constellations corresponding to adjacent symbols in the first constellation are identical. Accordingly, it is possible to implement the gray mapping in the constellation applied to each bit string and implement the gray mapping even in the constellation after multiplexing. Therefore, it is possible to suppress the occurrence of the bit error in the reception device for the signal multiplexed using non-orthogonal resources and further improve the decoding accuracy.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, in the above embodiments, SPC has been described as an example of multiplexing/multiple-access technology using non-orthogonal resources, but the present technology is not limited to such examples. For example, the present technology can be applied even in multiplexing/multiple-access technology using arbitrary non-orthogonal resources such as interleave division multiple access (IDMA).

Further, in the above embodiments, the case of downlink has mainly been described, but the present technology is not limited to such an example. For example, the present technology may be applied to uplink, and the present technique may also be applied to D2D communication, MTC communication, or the like.

Note that it is not necessary for the processes described in this specification with reference to the flowchart and the sequence diagram to be executed in the order shown in the flowchart or the sequence diagram. Some processing steps may be performed in parallel. Further, some of additional steps can be adopted, or some processing steps can be omitted.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A device, including:

a processing unit configured to apply a second constellation corresponding to a symbol position of a first bit string in a first constellation applied to the first bit string, to a second bit string in regard to a plurality of bit strings to be multiplexed for each of transmission signal sequences to be multiplexed in resource blocks for which at least a part of frequency resources or time resources overlap.

(2)

The device according to (1), in which bit strings corresponding to symbols of end portions in an adjacent direction of the respective second constellations corresponding to adjacent symbols in the first constellation, are identical.

(3)

The device according to (2), in which the second constellations corresponding to the adjacent symbols in the first constellation are constellations inverted in an adjacent direction.

(4)

The device according to any one of (1) to (3), in which the transmission signal sequences are multiplexed using power allocation.

(5)

The device according to (4), in which a transmission signal sequence of the first bit string is higher in power to be allocated than a transmission signal sequence of the second bit string.

(6)

The device according to any one of (1) to (5), in which the first and the second constellations indicate a gray-mapped correspondence relation between a bit string and a symbol on a complex plane.

(7)

The device according to any one of (1) to (6), in which the processing unit determines whether or not to apply the second constellation to the second bit string in accordance with content of signal processing at a stage after application of the first and the second constellations.

(8)

The device according to (7), in which, in a case in which same transmission weighting is applied to both a transmission signal sequence of the first bit string and a transmission signal sequence of the second bit string or in a case in which transmission weighting is not applied to any of the transmission signal sequence of the first bit string and the transmission signal sequence of the second bit string, the processing unit applies the second constellation to the second bit string.

(9)

The device according to (7) or (8), in which, in a case in which a same transmission mode is applied to both a transmission signal sequence of the first bit string and a transmission signal sequence of the second bit string, the processing unit applies the second constellation to the second bit string.

(10)

The device according to any one of (7) to (9), in which, in a case in which a spatial multiplexing process or a space diversity process of a same number of space multiplexings is applied to both a transmission signal sequence of the first bit string and a transmission signal sequence of the second bit string, the processing unit applies the second constellation to the second bit string.

(11)

The device according to any one of (1) to (10), in which the processing unit determines whether or not to apply the second constellation to the second bit string in accordance with channels to be used for transmission of a transmission signal sequence of the first bit string and a transmission signal sequence of the second bit string.

(12)

The device according to any one of (1) to (11), in which, in a case in which both a transmission signal sequence of the first bit string and a transmission signal sequence of the second bit string are transmitted using a data channel, a shared channel, or a dedicated channel, the processing unit applies the second constellation to the second bit string.

(13)

The device according to any one of (1) to (12), in which, in a case in which a destination of a transmission signal sequence of the first bit string and a destination of a transmission signal sequence of the second bit string are a single device, the processing unit applies the second constellation to the second bit string.

(14)

The device according to any one of (1) to (13), in which, in a case in which a destination of a transmission signal sequence of the first bit string and a destination of a transmission signal sequence of the second bit string are different, the processing unit applies the second constellation to the second bit string.

(15)

The device according to any one of (1) to (14), in which a number of the transmission signal sequences to be multiplexed is 2.

(16)

The device according to (1), in which the second constellation further corresponds to a transmission weight applied to a transmission signal sequence of the first bit string and a transmission weight applied to a transmission signal sequence of the second bit string.

(17)

The device according to (16), in which the second constellation is obtained by rotating a reference constellation by an amount corresponding to the transmission weight applied to the transmission signal sequence of the first bit string, the transmission weight applied to the transmission signal sequence of the second bit string, and the symbol position of the first bit string in the first constellation applied to the first bit string.

(18)

The device according to (16) or (17), in which the transmission weight applied to the transmission signal sequence of the first bit string and the transmission weight applied to the transmission signal sequence of the second bit string are different.

(19)

A method, including:

applying, by a processor, a second constellation corresponding to a symbol position of a first bit string in a first constellation applied to the first bit string, to a second bit string in regard to a plurality of bit strings to be multiplexed for each of transmission signal sequences to be multiplexed in resource blocks for which at least a part of frequency resources or time resources overlap.

(20)

A program causing a computer to function as:

a processing unit configured to apply a second constellation corresponding to a symbol position of a first bit string in a first constellation applied to the first bit string, to a second bit string in regard to a plurality of bit strings to be multiplexed for each of transmission signal sequences to be multiplexed in resource blocks for which at least a part of frequency resources or time resources overlap.

REFERENCE SIGNS LIST 1 system
100 base station
110 antenna unit
120 wireless communication unit
130 network communication unit
140 storage unit
150 processing unit
151 selection unit
153 transmission processing unit
200 terminal device

The invention claimed is:

1. A device, comprising:
processing circuitry configured to:
retrieve a plurality of bit strings corresponding to transmission signal sequences intended for transmission, the plurality of bit strings including a first bit string and a second bit string;
produce a modulated first bit string by modulating the first bit string with a first constellation;
determine a symbol position of the first bit string in the first constellation that was applied to the first bit string;
select a second constellation based upon the symbol position of the first bit string in the first constellation that was applied to the first bit string, wherein the second constellation has the symbol position of the first bit string as the only symbol in the position that has a positive I and a positive Q quadrant position of a complex plane of the second constellation;
produce a modulated second bit string by modulating the second bit string by applying the second constellation corresponding to the symbol position of the first bit string in the first constellation that was applied to the first bit string, to the second bit string of the plurality of bit strings to be multiplexed for each of the transmission signal sequences; and
produce a multiplexed signal of the transmission signal sequences by multiplexing the modulated first bit string and the modulated second bit string; and
transmit the multiplexed signal of the transmission signal sequences in resource blocks for which at least a part of frequency resources or time resources overlap.

2. The device according to claim 1,
wherein bit strings, which are corresponding to symbols of end portions of the first constellation, in an adjacent direction of the respective second constellations corresponding to adjacent symbols in the first constellation, are identical.

3. The device according to claim 2,
wherein the second constellations corresponding to the adjacent symbols in the first constellation are constellations inverted in a corresponding adjacent direction.

4. The device according to claim 1,
wherein the transmission signal sequences are multiplexed using power allocation.

5. The device according to claim 4,
wherein a transmission signal sequence of the first bit string is allocated a higher in power than a transmission signal sequence of the second bit string.

6. The device according to claim 1,
wherein the first and the second constellations indicate a gray-mapped correspondence relation between a bit string and a symbol on a complex plane.

7. The device according to claim 1,
wherein the processing circuitry determines whether or not to apply the second constellation to the second bit string in accordance with content of signal processing at a stage after application of the first and the second constellations.

8. The device according to claim 7,
wherein, in a case in which same transmission weighting is applied to both a transmission signal sequence of the first bit string and a transmission signal sequence of the second bit string or in a case in which transmission weighting is not applied to any of the transmission signal sequence of the first bit string and the transmission signal sequence of the second bit string, the processing circuitry applies the second constellation to the second bit string.

9. The device according to claim 7,
wherein, in a case in which a same transmission mode is applied to both a transmission signal sequence of the first bit string and a transmission signal sequence of the second bit string, the processing circuitry applies the second constellation to the second bit string.

10. The device according to claim 7,
wherein, in a case in which a spatial multiplexing process or a space diversity process of a same number of space multiplexings is applied to both a transmission signal sequence of the first bit string and a transmission signal sequence of the second bit string, the processing circuitry applies the second constellation to the second bit string.

11. The device according to claim 1,
wherein the processing circuitry determines whether or not to apply the second constellation to the second bit string in accordance with channels to be used for transmission of a transmission signal sequence of the first bit string and a transmission signal sequence of the second bit string.

12. The device according to claim 1,
wherein, in a case in which both a transmission signal sequence of the first bit string and a transmission signal sequence of the second bit string are transmitted using a data channel, a shared channel, or a dedicated channel, the processing circuitry applies the second constellation to the second bit string.

13. The device according to claim 1,
wherein, in a case in which a destination of a transmission signal sequence of the first bit string and a destination of a transmission signal sequence of the second bit string are a single device, the processing circuitry applies the second constellation to the second bit string.

14. The device according to claim 1, wherein, in a case in which a destination of a transmission signal sequence of the first bit string and a destination of a transmission signal sequence of the second bit string are different, the processing circuitry applies the second constellation to the second bit string.

15. The device according to claim 1, wherein a number of the transmission signal sequences to be multiplexed is 2.

16. The device according to claim 1, wherein the second constellation further corresponds to a transmission weight applied to a transmission signal sequence of the first bit string and a transmission weight applied to a transmission signal sequence of the second bit string.

17. The device according to claim 16, wherein the second constellation is obtained by rotating a reference constellation by an amount corresponding to the transmission weight applied to the transmission signal sequence of the first bit string, the transmission weight applied to the transmission signal sequence of the second bit string, and the symbol position of the first bit string in the first constellation applied to the first bit string.

18. The device according to claim 16, wherein the transmission weight applied to the transmission signal sequence of the first bit string and the transmission weight applied to the transmission signal sequence of the second bit string are different.

19. A method, comprising:
retrieving a plurality of bit strings corresponding to transmission signal sequences intended for transmission, the plurality of bit strings including a first bit string and a second bit string;
producing a modulated first bit string by modulating the first bit string with a first constellation;
determine a symbol position of the first bit string in the first constellation that was applied to the first bit string;
selecting a second constellation based upon the symbol position of the first bit string in the first constellation that was applied to the first bit string, wherein the second constellation has the symbol position of the first bit string as the only symbol in the position that has a positive I and a positive Q quadrant position of a complex plane of the second constellation;
producing a modulated second bit string by modulating the second bit string by applying the second constellation corresponding to the symbol position of the first bit string in the first constellation that was applied to the first bit string, to the second bit string of the plurality of bit strings to be multiplexed for each of the transmission signal sequences; and
producing a multiplexed signal of the transmission signal sequences by multiplexing the modulated first bit string and the modulated second bit string; and
transmit the multiplexed signal of the transmission signal sequences in resource blocks for which at least a part of frequency resources or time resources overlap.

20. A non-transitory computer-readable medium storing instructions that, when executed by a processor, cause the processor to perform a method comprising:
retrieving a plurality of bit strings corresponding to transmission signal sequences intended for transmission, the plurality of bit strings including a first bit string and a second bit string;
producing a modulated first bit string by modulating the first bit string with a first constellation;
determine a symbol position of the first bit string in the first constellation that was applied to the first bit string;
selecting a second constellation based upon the symbol position of the first bit string in the first constellation that was applied to the first bit string, wherein the second constellation has the symbol position of the first bit string as the only symbol in the position that has a positive I and a positive Q quadrant position of a complex plane of the second constellation;
producing a modulated second bit string by modulating the second bit string by applying the second constellation corresponding to the symbol position of the first bit string in the first constellation that was applied to the first bit string, to the second bit string of the plurality of bit strings to be multiplexed for each of the transmission signal sequences; and
producing a multiplexed signal of the transmission signal sequences by multiplexing the modulated first bit string and the modulated second bit string; and transmit the multiplexed signal of the transmission signal sequences in resource blocks for which at least a part of frequency resources or time resources.

* * * * *